US012087895B2

(12) United States Patent
Akimoto

(10) Patent No.: US 12,087,895 B2
(45) Date of Patent: Sep. 10, 2024

(54) IMAGE DISPLAY DEVICE MANUFACTURING METHOD AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 388 days.

(21) Appl. No.: 17/522,394

(22) Filed: Nov. 9, 2021

(65) Prior Publication Data

US 2022/0069187 A1 Mar. 3, 2022

Related U.S. Application Data

(63) Continuation of application No. PCT/JP2020/018397, filed on May 1, 2020.

(30) Foreign Application Priority Data

May 10, 2019 (JP) ................... 2019-089679

(51) Int. Cl.
H01L 33/00 (2010.01)
H01L 33/32 (2010.01)
(Continued)

(52) U.S. Cl.
CPC ............ *H01L 33/62* (2013.01); *H01L 33/007* (2013.01); *H01L 33/0093* (2020.05);
(Continued)

(58) Field of Classification Search
CPC ............ H01L 33/0093; H01L 33/0066; H01L 33/007; H01L 33/0062
See application file for complete search history.

(56) References Cited

U.S. PATENT DOCUMENTS

2010/0197054 A1* 8/2010 Yonehara ............ H01L 27/15
257/E33.044
2011/0193123 A1 8/2011 Moon et al.
(Continued)

FOREIGN PATENT DOCUMENTS

CN 108615740 A 10/2018
JP 2002-141492 A 5/2002
(Continued)

Primary Examiner — Reema Patel
(74) Attorney, Agent, or Firm — Foley & Lardner LLP

(57) ABSTRACT

A manufacturing method of an embodiment includes: providing a semiconductor growth substrate including a semiconductor layer including a light-emitting layer on a first substrate; forming a first insulating film on a second substrate that includes a circuit that includes a circuit element and a first wiring layer; forming a plug in the first insulating film to be connected with the circuit element; bonding the semiconductor layer to the second substrate and electrically connecting the plug to the semiconductor layer; forming a light-emitting element electrically connected to the plug by patterning the semiconductor layer; forming a second insulating film that covers the light-emitting element and the first insulating film; exposing a portion of the light-emitting element by removing a portion of the second insulating film; and forming a second wiring layer on the second insulating film.

11 Claims, 34 Drawing Sheets

(51) Int. Cl.
*H01L 33/42* (2010.01)
*H01L 33/50* (2010.01)
*H01L 33/62* (2010.01)

(52) U.S. Cl.
CPC .............. *H01L 33/32* (2013.01); *H01L 33/42* (2013.01); *H01L 33/50* (2013.01); *H01L 2933/0041* (2013.01); *H01L 2933/0066* (2013.01)

(56) References Cited

U.S. PATENT DOCUMENTS

| | | |
|---|---|---|
| 2014/0367633 A1 | 12/2014 | Bibl et al. |
| 2014/0367705 A1 | 12/2014 | Bibl et al. |
| 2016/0276526 A1 | 9/2016 | Kaga et al. |
| 2018/0358339 A1 | 12/2018 | Iguchi |
| 2019/0229235 A1 | 7/2019 | Iguchi |
| 2019/0385513 A1 | 12/2019 | Iguchi et al. |
| 2020/0251460 A1 | 8/2020 | Iguchi |

FOREIGN PATENT DOCUMENTS

| | | |
|---|---|---|
| JP | 2011-166150 A | 8/2011 |
| JP | 2014-068025 A | 4/2014 |
| JP | 2016-522585 A | 7/2016 |
| JP | 2016-523450 A | 8/2016 |
| JP | 2016-174017 A | 9/2016 |
| JP | 2019-129226 A | 8/2019 |
| WO | WO-2017/094461 A1 | 6/2017 |
| WO | WO-2018/116814 A1 | 6/2018 |
| WO | WO-2019/038961 A1 | 2/2019 |

* cited by examiner

IMAGE DISPLAY DEVICE MANUFACTURING METHOD AND IMAGE DISPLAY DEVICE

CROSS-REFERENCE TO RELATED APPLICATIONS

The present application is a bypass continuation of PCT Application No. PCT/JP2020/018397, filed May 1, 2020, which claims priority to Japanese Application No. 2019-089679, filed May 10, 2019. The contents of these applications are hereby incorporated by reference in their entireties.

BACKGROUND

The present disclosure relates to an image display device and a method for manufacturing an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full HD, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a decrease of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

According to certain embodiments of the present invention, a method for manufacturing an image display device is provided in which a transfer process of a light-emitting element is shortened, and yield is increased.

A method for manufacturing an image display device according to one embodiment of the invention includes a process of preparing a substrate including a semiconductor layer including a light-emitting layer on a first substrate, a process of forming a first insulating film on a second substrate in which a circuit that includes a circuit element and a first wiring layer is formed, a process of forming a plug in the first insulating film to be connected with the circuit element, a process of bonding the semiconductor layer to the second substrate and electrically connecting the plug to the semiconductor layer, a process of forming a light-emitting element by patterning the semiconductor layer in which the light-emitting element is electrically connected to the plug, a process of forming a second insulating film that covers the light-emitting element and the first insulating film, a process of exposing a portion of the light-emitting element by removing a portion of the second insulating film, and a process of forming a second wiring layer on the second insulating film.

An image display device according to one embodiment of the invention includes: a circuit element; a first wiring layer electrically connected to the circuit element; a first insulating film covering the circuit element and the first wiring layer; a plug formed on the first insulating film and connected to the first wiring layer; a light-emitting element that is located on the plug and includes a first semiconductor layer connected to the plug, a light-emitting layer located on the first semiconductor layer, and a second semiconductor layer located on the light-emitting layer, in which the first semiconductor layer is of a first conductivity type, and the second semiconductor layer is of a second conductivity type that is different from the first conductivity type; a second insulating film covering the first insulating film, the plug, and at least a portion of the light-emitting element; and a second wiring layer located on the second insulating film and connected to the light-emitting element.

An image display device according to one embodiment of the invention includes: a circuit element; a first wiring layer electrically connected to the circuit element; a first insulating film covering the circuit element and the first wiring layer; a plug formed on the first insulating film; a light-emitting element that is located on the plug and includes a first semiconductor layer connected to the plug, a light-emitting layer located on the first semiconductor layer, and a second semiconductor layer located on the light-emitting layer, in which the first semiconductor layer is of a first conductivity type, and the second semiconductor layer is of a second conductivity type that is different from the first conductivity type; a second insulating film covering the first insulating film, the plug, and at least a portion of the light-emitting element; a second wiring layer located on the second insulating film and connected to the light-emitting element; and a third wiring layer located on the first insulating film and connected to the circuit element via the first wiring layer. The second insulating film includes a first opening exposing a surface of the second semiconductor layer of the light-emitting element, and a second opening exposing a portion of the third wiring layer. The second wiring layer includes a transparent electrode that connects the third wiring layer and a light-emitting surface of the second semiconductor layer, wherein the light-emitting surface is opposite to a surface of the light-emitting element at the first insulating film side.

An image display device according to one embodiment of the invention includes: multiple transistors; a first wiring layer electrically connected to the multiple transistors; a first insulating film covering the multiple transistors and the first wiring layer; multiple plugs formed on the first insulating film and connected to the first wiring layer; a first semiconductor layer that is located on the plug and is of a first conductivity type; a light-emitting layer located on the first semiconductor layer; a second semiconductor layer that is located on the light-emitting layer and is of a second conductivity type that is different from the first conductivity type; a second insulating film covering the first insulating film, the plug, the first semiconductor layer, and the light-emitting layer and covering at least a portion of the second semiconductor layer; and a second wiring layer connected to a transparent electrode, wherein the transparent electrode is located on multiple exposed surfaces of the second semiconductor layer exposed from the second insulating film to correspond respectively to the multiple transistors.

According to certain embodiments of the invention, an image display device and a method for manufacturing an image display device are realized in which a transfer process of a light-emitting element is shortened, and yield is increased.

DETAILED DESCRIPTION

Figure 1:
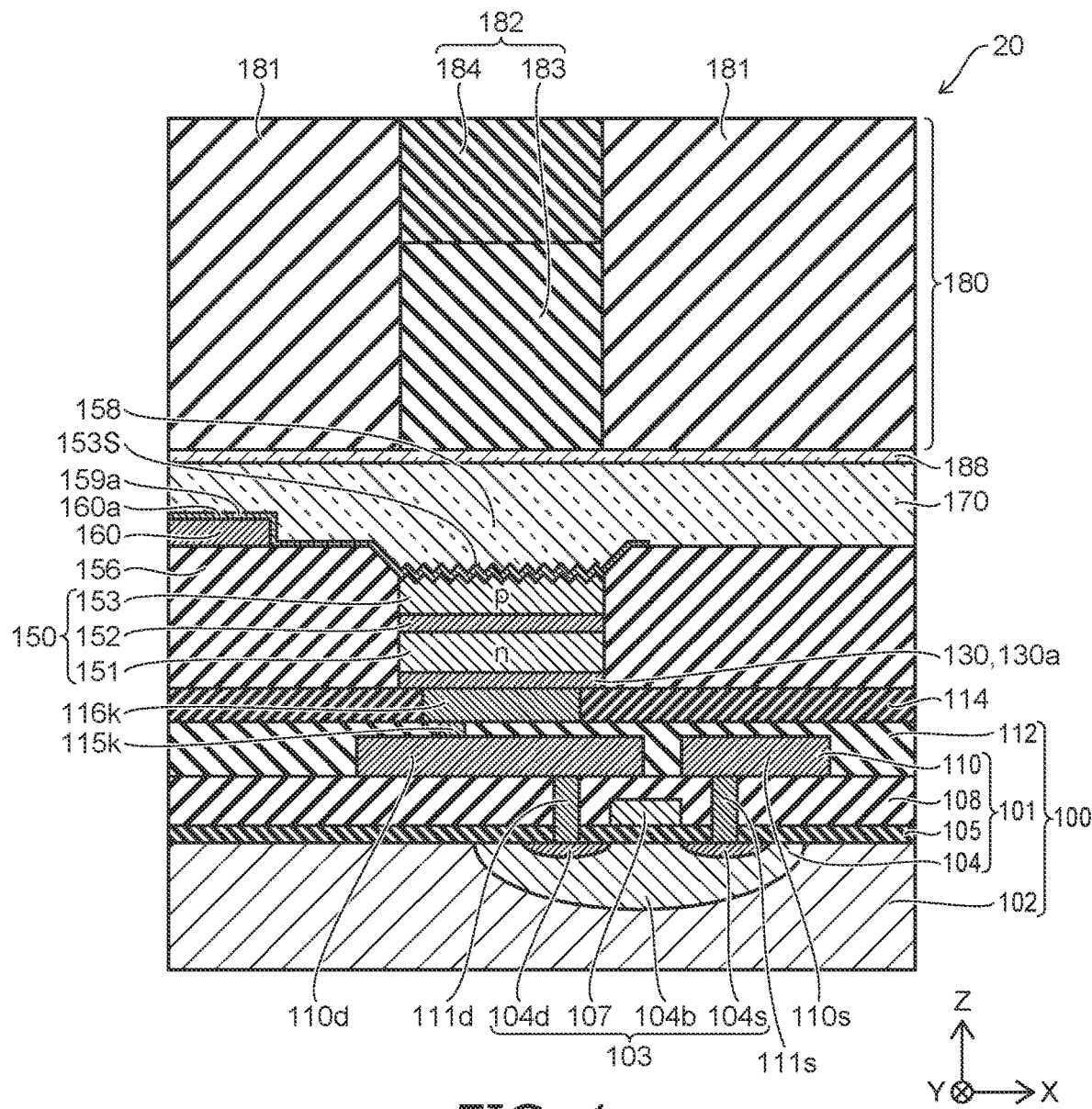
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a repeated detailed description is omitted as appropriate.

First Embodiment

FIG. 1 is a schematic cross-sectional view illustrating a portion of an image display device according to an embodiment.

The configuration of a subpixel 20 of the image display device of the embodiment is schematically shown in FIG. 1. A pixel 10 that is included in an image displayed in the image display device includes multiple subpixels 20.

Hereinbelow, the description may use an XYZ three-dimensional coordinate system. The subpixels 20 are arranged on a two-dimensional plane. The two-dimensional plane in which the subpixels 20 are arranged is taken as an XY plane. The subpixels 20 are arranged along an X-axis direction and a Y-axis direction.

The subpixel 20 includes a light-emitting surface 153S that is substantially parallel to the XY plane. The light-emitting surface 153S outputs light mainly toward a positive direction of a Z-axis orthogonal to the XY plane.

FIG. 1 schematically shows a cross section when the subpixel 20 is cut by a plane parallel to the XZ plane.

As shown in FIG. 1, the subpixel 20 of the image display device includes a transistor 103, a first wiring layer (a first wiring layer) 110, a first inter-layer insulating film (a first insulating film) 112, a plug 116k, a light-emitting element 150, a second inter-layer insulating film (a second insulating film) 156, and a second wiring layer (a second wiring layer) 160. The subpixel 20 further includes a color filter 180. The color filter (the wavelength conversion member) 180 is located on a surface resin layer 170 with a transparent thin film adhesive layer 188 interposed. The surface resin layer 170 is located on the light-emitting element 150, the inter-layer insulating film 156, and the wiring layer 160.

The transistor 103 is formed in a substrate 102. Other than the transistor 103 for driving the light-emitting element 150, other circuit elements, such as transistors, resistances, capacitors, etc., are formed in the substrate 102, and a circuit 101 is configured using wiring portions, etc. For example, the transistor 103 corresponds to a drive transistor 26 shown in FIG. 4 described below; also, a select transistor 24, a capacitor 28, etc., are circuit elements. Hereinbelow, the circuit 101 includes an element formation region 104 in which the circuit elements are formed, an insulating layer 105, the wiring layer 110, vias that connect the wiring layer 110 and the circuit elements, and an insulating film 108 that insulates between the circuit elements and the like. The substrate 102, the circuit 101, the inter-layer insulating film 112, and other components may be inclusively called a circuit board 100.

The transistor 103 includes a p-type semiconductor region 104b, n-type semiconductor regions 104s and 104d, and a gate 107. The gate 107 is located on the p-type semiconductor region 104b with the insulating layer 105 interposed. The insulating layer 105 is provided to insulate the element formation region 104 and the gate 107 and to sufficiently insulate between the other adjacent circuit elements. A channel may be formed in the p-type semiconductor region 104b when a voltage is applied to the gate 107. The transistor 103 is an n-channel transistor, e.g., an n-channel MOSFET.

The element formation region 104 is located in the substrate 102. The substrate 102 is, for example, a Si substrate. The element formation region 104 includes the p-type semiconductor region 104b and the n-type semiconductor regions 104s and 104d. The p-type semiconductor region 104b is located at the surface vicinity of the substrate 102. The n-type semiconductor regions 104s and 104d are located in the p-type semiconductor region 104b and are separated from each other at the surface vicinity of the p-type semiconductor region 104b.

The insulating layer 105 is located at the surface of the substrate 102. The insulating layer 105 also covers the element formation region 104, and covers the surfaces of the p-type semiconductor region 104b and the n-type semiconductor regions 104s and 104d. The insulating layer 105 is, for example, $SiO_2$. The insulating layer 105 may be a multilevel insulating layer that includes $SiO_2$, $Si_3N_4$, etc., according to the covered region. The insulating layer 105 may include a layer of an insulating material that has a high dielectric constant.

The gate 107 is located on the p-type semiconductor region 104b with the insulating layer 105 interposed. The gate 107 is located between the n-type semiconductor regions 104s and 104d. The gate 107 is, for example, polycrystalline Si. The gate 107 may include a silicide or the like that has a lower resistance than polycrystalline Si.

In the example, the gate 107 and the insulating layer 105 are covered with the insulating film 108. The insulating film 108 is, for example, $SiO_2$, $Si_3N_4$, etc. To planarize the surface when forming the wiring layer 110, an organic insulating film such as PSG (Phosphorus Silicon Glass), BPSG (Boron Phosphorus Silicon Glass), etc., also may be provided.

Vias 111s and 111d are formed in the insulating film 108. The first wiring layer (the first wiring layer) 110 is formed on the insulating film 108. The first wiring layer 110 includes multiple wiring portions that may have different potentials, and includes wiring portions 110s and 110d. Thus, in FIG. 1 and subsequent cross-sectional views, the reference numeral of each wiring layer is displayed at a position beside one wiring portion included in the wiring layer. The vias 111s and 111d are located respectively between the n-type semiconductor regions 104s and 104d and the wiring portions 110s and 110d of the wiring layer 110 and electrically connect these components. For example, the wiring layer 110 and the vias 111s and 111d are formed of a metal such as Al, Cu, etc. The wiring layer 110 and the vias 111s and 111d may include a refractory metal, etc.

Also, the first inter-layer insulating film 112 is located on the insulating film 108 and the wiring layer 110. The inter-layer insulating film (the first insulating film) 112 is, for example, an organic insulating film of PSG, BPSG, etc. The first inter-layer insulating film 112 also functions as a protective film at the circuit board 100 that protects the surface of the circuit board 100, and as a planarization film for the plug 116k that is formed on the inter-layer insulating film 112.

A planarization film 114 also is formed on the first inter-layer insulating film 112. The planarization film 114 is a film or layer that is insulative, and similarly to the inter-layer insulating film 112, is, for example, an organic insulating film of PSG, BPSG, or the like, an inorganic insulating film of SOG (Spin On Glass), etc.

The plug 116k is buried in the planarization film 114. The plug 116k and the planarization film 114 each include surfaces in the same plane substantially parallel to the XY plane.

A connection part 115k is located between the plug 116k and the wiring portion 110d. The connection part 115k is formed of a conductive member and electrically connects the plug 116k and the wiring portion 110d. For example, the plug 116k and the connection part 115k are formed of the same material as the first wiring layer 110. The plug 116k and the connection part 115k may include a refractory metal.

Figure 2:
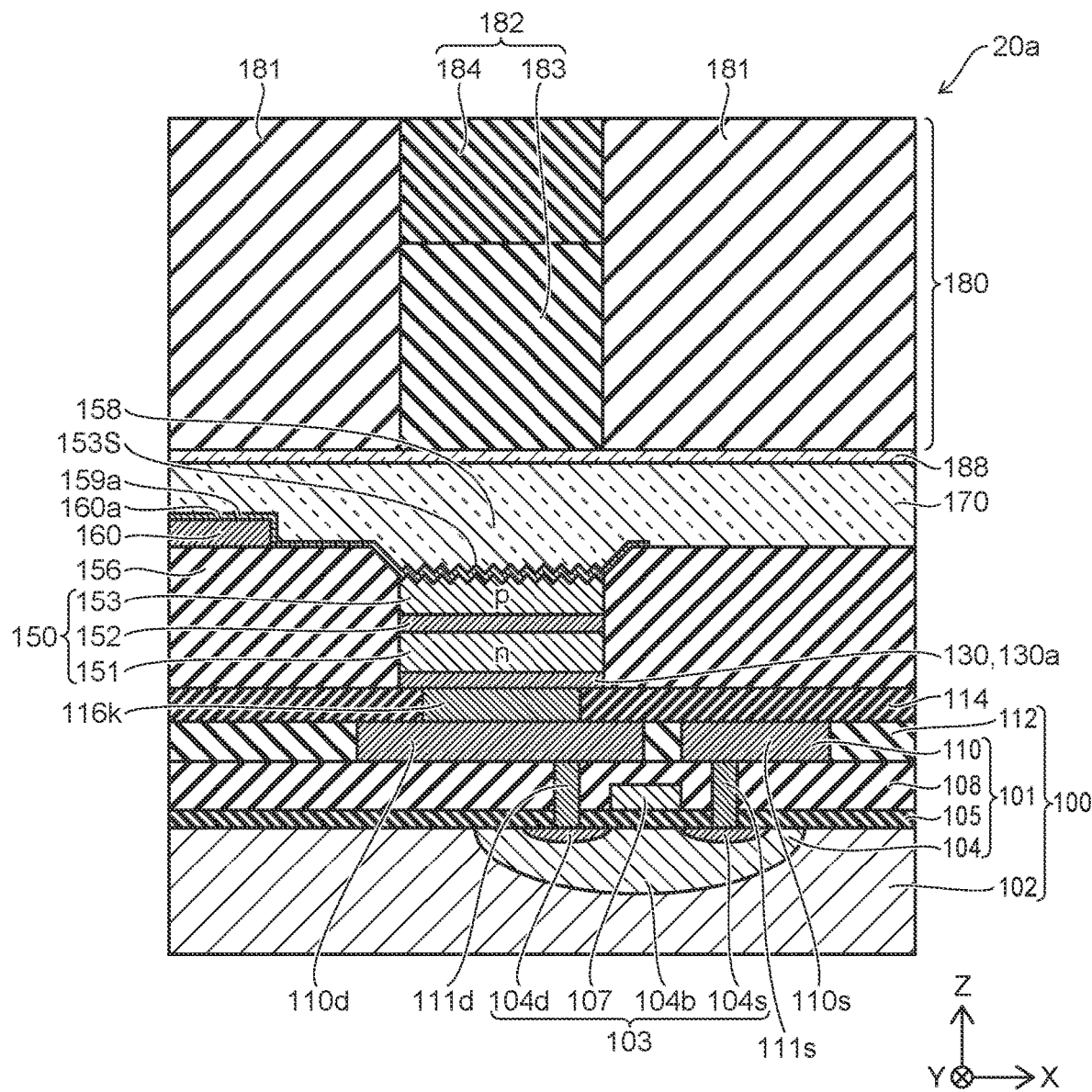
FIG. 2 is a schematic cross-sectional view illustrating a portion of a modification of the image display device of the first embodiment.

FIG. 2 is a schematic cross-sectional view illustrating a portion of a modification of the image display device of the embodiment.

In a subpixel 20a of the modification as shown in FIG. 2, the plug 116k connects the wiring portion 110d without having the connection part 115k interposed.

When the connection part 115k is provided as in FIG. 1, the outer perimeter of the plug 116k can have a shape that juts outward from the outer perimeter of the wiring portion 110d when projected onto the XY plane. As in the modification, when the plug 116k is set to be inward from the outer perimeter of the wiring portion 110d when projected onto the XY plane, the plug 116k can be directly provided on the wiring portion 110d without providing the connection part 115k. That is, the connection can be made by providing the connection part or by not providing the connection part according to the positional relationship between the plug and the wiring portion of the connection destination and/or the shapes of the plug and the wiring portion of the connection destination. Although this is similar for the embodiments and/or the modifications described below, a configuration in which the connection part is provided will be described hereinbelow unless otherwise specified.

The description continues now by returning to FIG. 1.

The light-emitting element 150 is located on the plug 116k with a light-shielding plate 130a interposed. The light-shielding plate 130a is described below. The light-emitting element 150 includes an n-type semiconductor layer (a first semiconductor layer) 151, a light-emitting layer 152, and a p-type semiconductor layer (a second semiconductor layer) 153. The n-type semiconductor layer 151, the light-emitting layer 152, and the p-type semiconductor layer 153 are stacked in this order from the inter-layer insulating film 112 toward the positive direction of the Z-axis. That is, the layers of the light-emitting element 150 are stacked from the inter-layer insulating film 112 toward the light-emitting surface 153S. The n-type semiconductor layer 151 is electrically connected to the plug 116k.

Although the light-emitting element 150 has, for example, a substantially square or rectangular shape when projected onto the XY plane, the corners may be rounded. The light-emitting element 150 may have, for example, an elliptical shape or a circular shape when projected onto the XY plane. By appropriately selecting the shape, arrangement, and the like of the light-emitting element when viewed in plan, the degree of freedom of the layout is increased.

It is favorable for the light-emitting element 150 to include, for example, a nitride semiconductor such as $In_XAl_YGa_{1-X-Y}N$ (0≤X, 0≤Y, and X+Y<1), etc. The light-emitting element 150 according to one embodiment of the invention is a so-called blue light-emitting diode, and the wavelength of the light emitted by the light-emitting element 150 is, for example, about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above, and can be set to an appropriate value.

According to the embodiment, the light-shielding plate 130a, the plug 116k, and the connection part 115k can be located between the light-emitting element 150 and the wiring portion 110d for a main electrode of the transistor 103. Therefore, the light-emitting element 150 and the transistor 103 can be easily connected without forming a deep via in the inter-layer insulating film 112, etc.

The second inter-layer insulating film (the second insulating film) 156 covers the first inter-layer insulating film 112, the third wiring layer 130, the side surface of the light-emitting element 150, and a buffer layer 140. It is favorable for the second inter-layer insulating film 156 to be formed of a white resin. For example, a white resin can be realized by dispersing, in an organic material, scattering particles of titanium oxide or the like that are made to be fine to have an appropriate particle size. By setting the inter-layer insulating film 156 to be a white resin, the light that is emitted by the light-emitting element 150 in the lateral direction and/or the downward direction can be reflected, and the luminance of the light-emitting element 150 can be substantially increased.

The second inter-layer insulating film 156 may be a black resin. By setting the inter-layer insulating film 156 to be a black resin, the scattering of the light in the subpixel is suppressed, and stray light is more effectively suppressed. An image display device in which stray light is suppressed can display a sharper image.

The inter-layer insulating film 156 has a function of protecting the light-emitting element 150, and a function of planarizing the surface for the wiring layer 160 that is formed on the second inter-layer insulating film 156.

The second inter-layer insulating film 156 includes an opening 158. The opening 158 is formed by removing a portion of the inter-layer insulating film 156 above the light-emitting element 150. The opening 158 is formed so that the light-emitting surface 153S is exposed from the inter-layer insulating film 156. The light-emitting surface 153S is the surface of the p-type semiconductor layer 153 that is opposite to the surface contacting the light-emitting layer 152. It is favorable to perform surface roughening of the light-emitting surface 153S. The light extraction efficiency of the light-emitting element 150 can be increased by the roughening.

The second wiring layer (the second wiring layer) 160 is located on the inter-layer insulating film 156. The wiring layer 160 includes a wiring portion 160a. Although not shown in this drawing, the wiring portion 160a is connected to a power supply line that supplies a power supply to the subpixel 20.

In the example, the third wiring layer 130 is located on the planarization film 114 and the plug 116k. The third wiring layer 130 includes the light-shielding plate 130a. The light-shielding plate 130a is located between the n-type semiconductor layer 151 and the plug 116k. The light-shielding plate 130a has an ohmic connection with the plug 116k.

The light-shielding plate 130a is located at each subpixel, and the multiple light-shielding plates 130a are electrically insulated. The light-emitting elements 150 are respectively located on the light-shielding plates 130a.

The wiring layer 130, i.e., the light-shielding plate 130a, is formed of a material that has a high conductivity. The light-shielding plate 130a includes, for example, Ti, Al, an alloy of Ti and Sn, etc. Cu, V, or the like, or a noble metal that has high light reflectivity such as Ag, Pt, etc., may be included. Because the light-shielding plate 130a is formed of such a metal material that has a high conductivity, etc., the light-emitting element 150 and the circuit 101 are electrically connected with a low resistance.

When projected onto the XY plane, the outer perimeter of the light-emitting element 150 when projected from above along the Z-axis is located within the outer perimeter of the light-shielding plate 130a. Thereby, the light-shielding plate 130a can reflect the downward-scattered light of the light-emitting element 150 toward the light-emitting surface 153S side so that the light does not reach the transistor 103. By appropriately selecting the material of the light-shielding plate 130a, the luminous efficiency can be increased by reflecting the downward-scattered light of the light-emitting element 150 toward the light-emitting surface 153S side. Also, by the light-shielding plate 130a shielding the downward-scattered light of the light-emitting element 150, the light can be prevented from reaching the transistor 103, and malfunction of the transistor 103 also can be prevented.

According to the embodiment, the n-type semiconductor layer 151 that is a cathode electrode of the light-emitting element 150 is connected to a drain electrode of the driving transistor 103 via the light-shielding plate 130a, the plug 116k, and the connection part 115k.

A transparent electrode 159a is located on the wiring portion 160a. The transparent electrode 159a is provided onto the light-emitting surface 153S of the p-type semiconductor layer 153 at the opening. The transparent electrode 159a is located between the wiring portion 160a and the light-emitting surface 153S and electrically connects the wiring portion 160a and the p-type semiconductor layer 153.

The surface resin layer 170 covers the second inter-layer insulating film 156, the transparent conductive film that includes the transparent electrode 159a, and the second wiring layer 160. The surface resin layer 170 is a transparent resin, protects the inter-layer insulating film 156, the transparent electrode 159a, the wiring layer 160, etc., and provides a planarized surface for bonding the color filter 180.

The color filter 180 includes a light-shielding part 181 and a color conversion part 182. The color conversion part 182 is located directly above the light-emitting surface 153S of the light-emitting element 150 to correspond to the shape of the light-emitting surface 153S. In the color filter 180, the part other than the color conversion part 182 is the light-shielding part 181. The light-shielding part 181 is a so-called black matrix that reduces blur due to color mixing of the light emitted from adjacent color conversion parts 182, etc., and makes it possible to display a sharp image.

The color conversion part 182 is, for example, one layer or two layers. A two-layer part is shown in FIG. 1. Whether the color conversion part 182 is one layer, two layers, or more is determined by the color, i.e., the wavelength, of the light emitted by the subpixel 20. When the light emission color of the subpixel 20 is red or green, it is favorable for the color conversion part 182 to be two layers. When the light emission color of the subpixel 20 is blue, it is favorable to be one layer.

When the color conversion part 182 is two layers, the first layer that is more proximate to the light-emitting element 150 is a color conversion layer 183, and the second layer is a filter layer 184. That is, the filter layer 184 is stacked on the color conversion layer 183.

The color conversion layer 183 is a layer that converts the wavelength of the light emitted by the light-emitting element 150 into the desired wavelength. When the subpixel 20 emits red, light of the wavelength of the light-emitting element 150, i.e., 467 nm±20 nm, is converted into, for example, light of a wavelength of about 630 nm±20 nm. When the subpixel 20 emits green, light of the wavelength of the light-emitting element 150, i.e., 467 nm±20 nm, is converted into, for example, light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without the light having passed through the color conversion layer 183. When the wavelength of the light emitted by the light-emitting element 150 is about 467 nm±20 nm, the subpixel 20 may output the light without the light having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 in the blue subpixel 20, a micro external light reflection that occurs in the surface of the light-emitting element 150 is suppressed.

(Modification)

Modifications of the configuration of the subpixel will now be described.

Figure 3A:
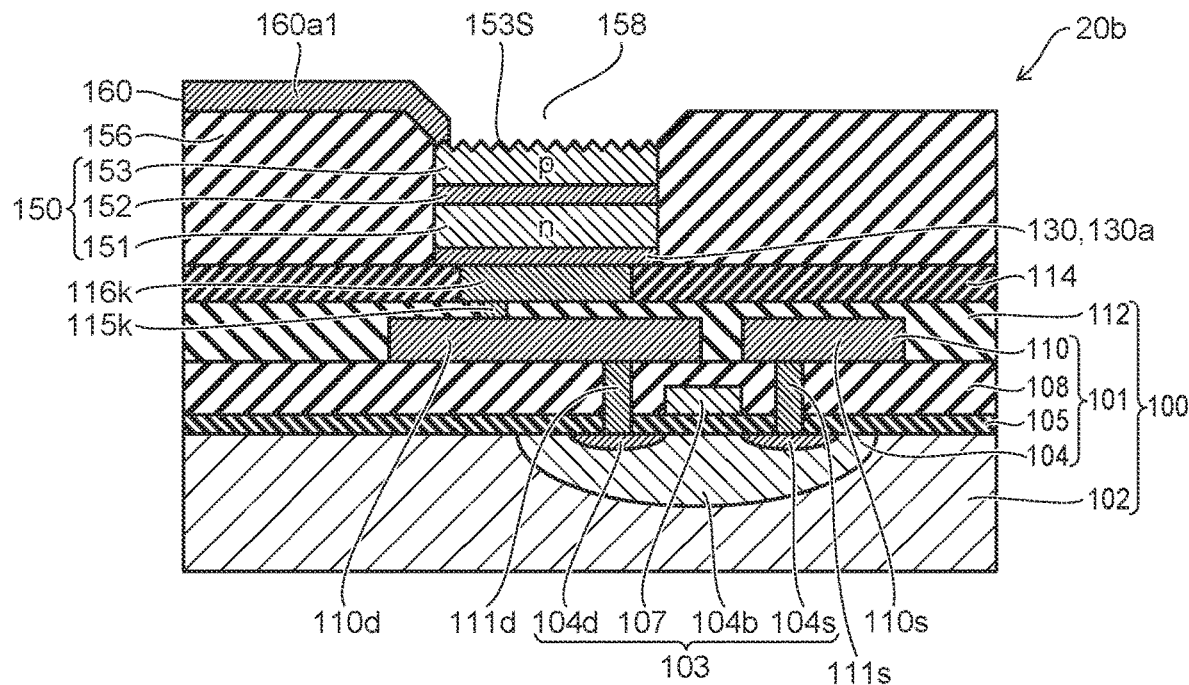
FIG. 3A is a schematic cross-sectional view illustrating a portion of a modification of the image display device of the first embodiment.
Figure 3B:
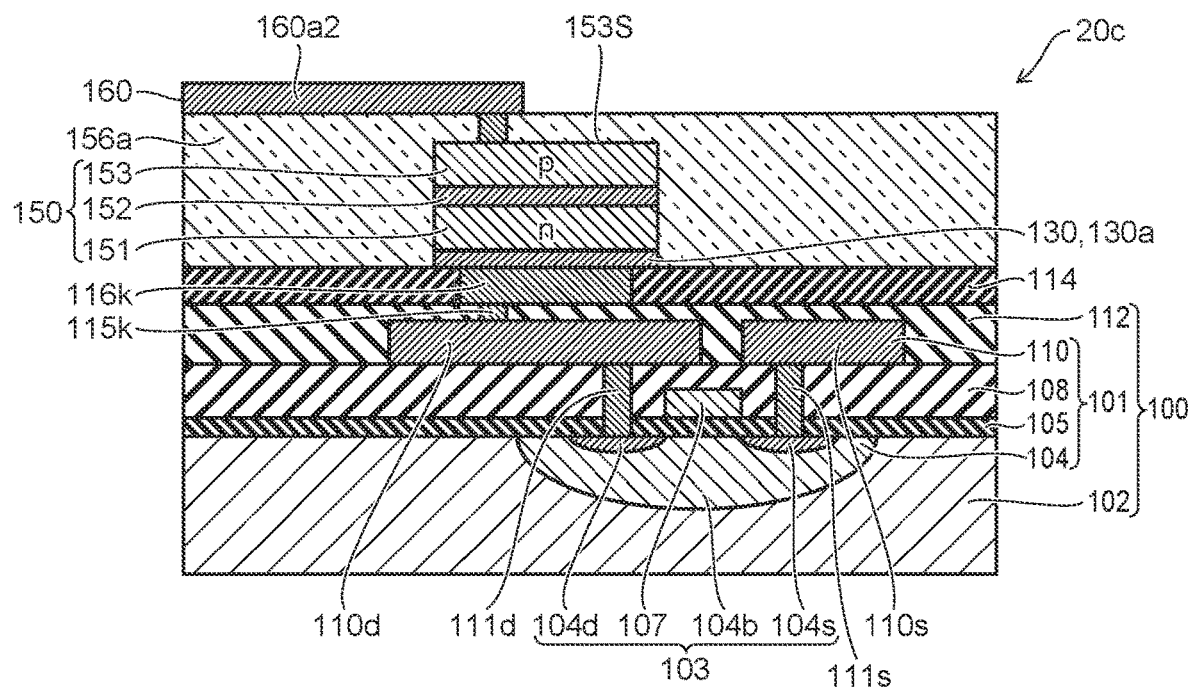
FIG. 3B is a schematic cross-sectional view illustrating a portion of a modification of the image display device of the first embodiment.

FIGS. 3A and 3B are schematic cross-sectional views respectively illustrating portions of the modifications of the image display device of the embodiment.

In FIG. 3A and subsequent cross-sectional views of the subpixel, the surface resin layer 170 and the color filter 180 are not illustrated to avoid complexity. Unless specified otherwise, the surface resin layer 170 and the color filter 180 are located on the second inter-layer insulating film and the third wiring layer. This is similar for other embodiments and their modifications described below as well.

In FIG. 3A, the wiring portion structure that is connected to the light-emitting element 150 of a subpixel 20b is different from that of the first embodiment described above. The other components are the same as those of the first embodiment described above; the same components are marked with the same reference numerals, and a detailed description is omitted as appropriate.

As shown in FIG. 3A, the subpixel 20b includes a wiring portion 160a1. The wiring portion 160a1 is formed as a wiring portion that is included in the second wiring layer 160. According to the modification, the electrical connection with the p-type semiconductor layer 153 is performed by connecting one end of the wiring portion 160a1 to a portion of the light-emitting surface 153S. According to the modification, the process of forming the transparent conductive film that includes the transparent electrodes can be omitted.

In a subpixel 20c as shown in FIG. 3B, a second inter-layer insulating film 156a is a transparent resin. An opening that corresponds to the light-emitting surface 153S is not provided in the inter-layer insulating film 156a. The light-emitting surface 153S is directly connected to a wiring portion 160a2 of the second wiring layer 160.

The light-emitting element 150 emits light from the light-emitting surface 153S via the inter-layer insulating film 156a. According to the modification, the process of forming the opening in the inter-layer insulating film 156a and roughening the light-emitting surface 153S can be omitted.

The embodiment can include any of the configurations of the subpixels 20 and 20a to 20c shown in the description above. Also, modifications of subpixels similar to those of the embodiment are applicable to embodiments described below as well.

Figure 4:
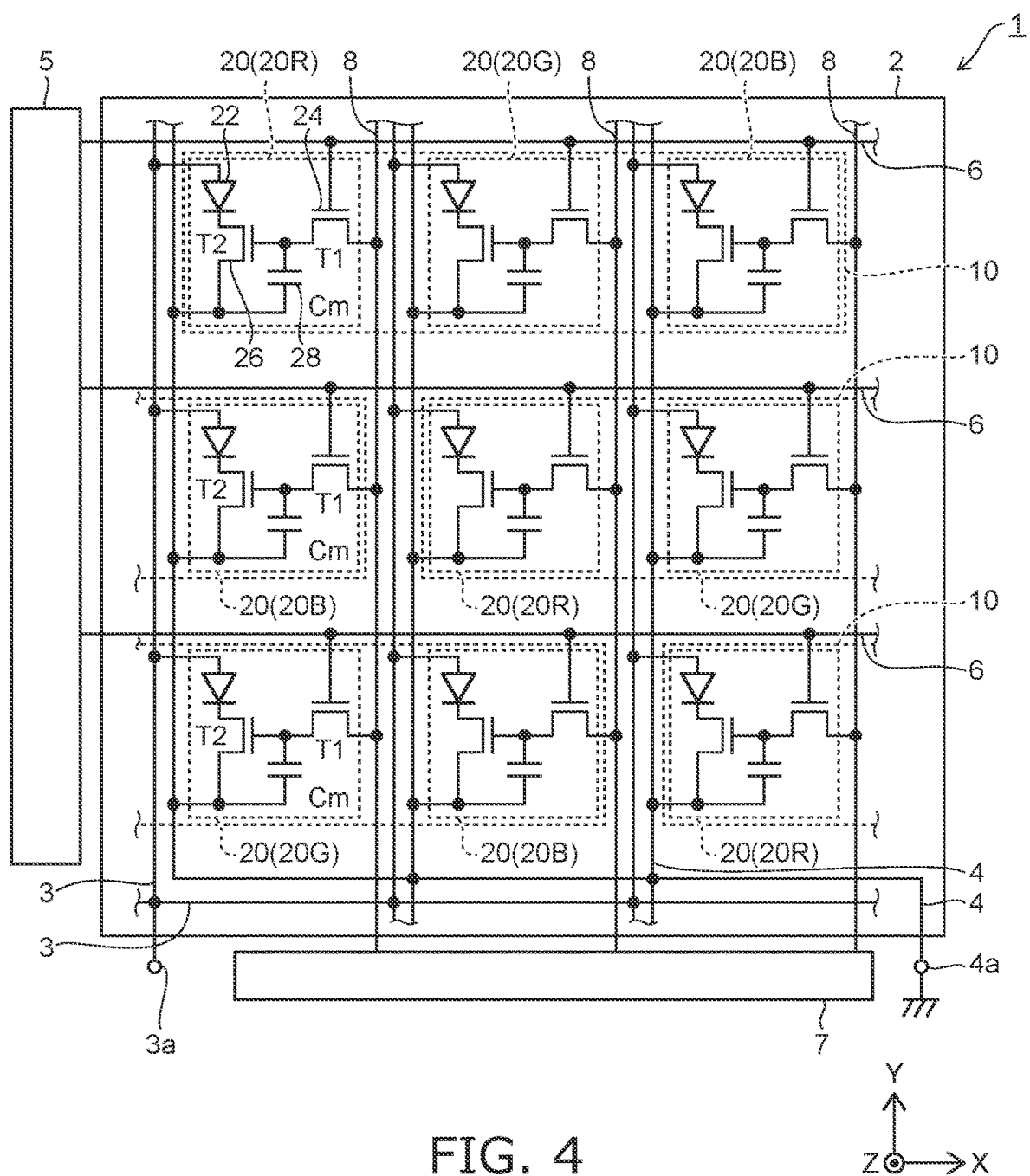
FIG. 4 is a schematic block diagram illustrating the image display device of the first embodiment.

FIG. 4 is a schematic block diagram illustrating the image display device according to the embodiment.

As shown in FIG. 4, the image display device 1 of the embodiment includes a display region 2. The subpixels 20 are arranged in the display region 2. For example, the subpixels 20 are arranged in a lattice configuration. For example, n subpixels 20 are arranged along the X-axis; and m subpixels 20 are arranged along the Y-axis.

The pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of subpixels 20R, 20G, and 20B emitting the desired luminances.

One pixel 10 includes the three subpixels 20R, 20G, and 20B; for example, the subpixels 20R, 20G, and 20B are arranged in a straight line along the X-axis as in the example. In the pixels 10, subpixels of the same color may be arranged in the same column, or subpixels of different colors by column may be arranged as in the example.

The image display device 1 further includes a power supply line 3 and a ground line 4. The power supply line 3 and the ground line 4 are wired in a lattice configuration along the arrangement of the subpixels 20. The power supply line 3 and the ground line 4 are electrically connected to each subpixel 20, and electrical power is supplied to each subpixel 20 from a direct current power supply connected between a power supply terminal 3a and a GND terminal 4a. The power supply terminal 3a and the GND terminal 4a are provided respectively at end portions of the power supply line 3 and the ground line 4, and are connected to a direct current power supply circuit located outside the display region 2. A positive voltage when referenced to the GND terminal 4a is supplied to the power supply terminal 3a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the outer edge of the display region 2. The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 4, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel MOSFET, and a cathode electrode that is an n-electrode of the light-emitting element 22 is connected to a drain electrode that is a main electrode of the drive transistor 26. The series circuit of the light-emitting element 22 and the drive transistor 26 is connected between the power supply line 3 and the ground line 4. The drive transistor 26 corresponds to the transistor 103 of FIG. 1, etc., and the light-emitting element 22 corresponds to the light-emitting element 150 of FIG. 1, etc. The current that flows in the light-emitting element 22 is determined by the voltage that is applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a main electrode. The gate electrode of the select transistor 24 is connected to the scanning line 6. The capacitor 28 is connected between the ground line 4 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gates and sources of the drive transistors 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

A method for manufacturing the image display device 1 of the embodiment will now be described.

FIGS. 5A to 11B are schematic cross-sectional views illustrating the method for manufacturing the image display device of the embodiment.

Figure 5A:
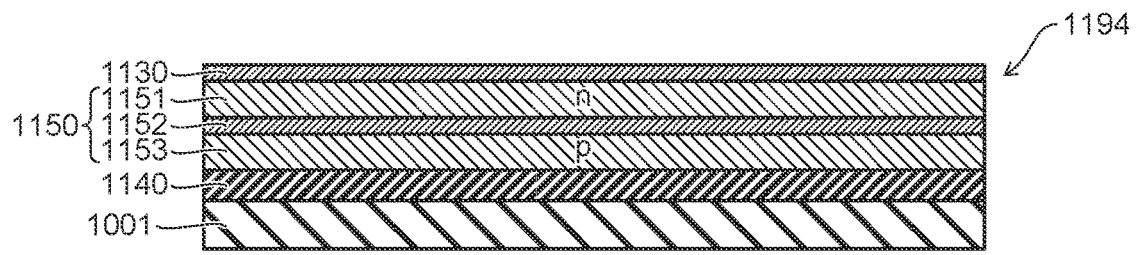
FIG. 5A is a schematic cross-sectional view illustrating a method for manufacturing the image display device of the first embodiment.

A semiconductor growth substrate 1194 is prepared as shown in FIG. 5A. The semiconductor growth substrate 1194 includes a semiconductor layer 1150 that is grown on a crystal growth substrate (a first substrate) 1001. The crystal growth substrate 1001 is, for example, a Si substrate, a sapphire substrate, etc. It is favorable to use a Si substrate.

In the example, a buffer layer 1140 is formed at one surface of the crystal growth substrate 1001. It is favorable for the buffer layer 1140 to include a nitride such as AlN, etc.

In the semiconductor growth substrate 1194, a p-type semiconductor layer 1153, a light-emitting layer 1152, and an n-type semiconductor layer 1151 are stacked on the buffer layer 1140 in this order from the buffer layer 1140 side. It is favorable to use metal-organic chemical vapor deposition (Metal Organic Chemical Vapor Deposition, MOCVD) to grow the semiconductor layer 1150. The semiconductor layer 1150 is, for example, $In_XAl_YGa_{1-X-Y}N$ ($0 \le X$, $0 \le Y$, and $X+Y<1$), etc.

A metal layer 1130 is formed at the surface of the semiconductor layer 1150 at the side that is opposite to the surface at the crystal growth substrate 1001 side. That is, the metal layer 1130 is formed on the surface of the n-type semiconductor layer 1151 that is opposite to the surface at which the light-emitting layer 152 is located. That is, the metal layer 1130 is formed on the surface of the n-type semiconductor layer 1151 that is not covered. For example, the metal layer is formed using sputtering, etc. The metal layer 1130 includes, for example, Ti, Al, an alloy of Ti and Sn, etc. Cu, V, or the like, or a noble metal that has high light reflectivity such as Ag, Pt, etc., may be included.

Figure 5B:
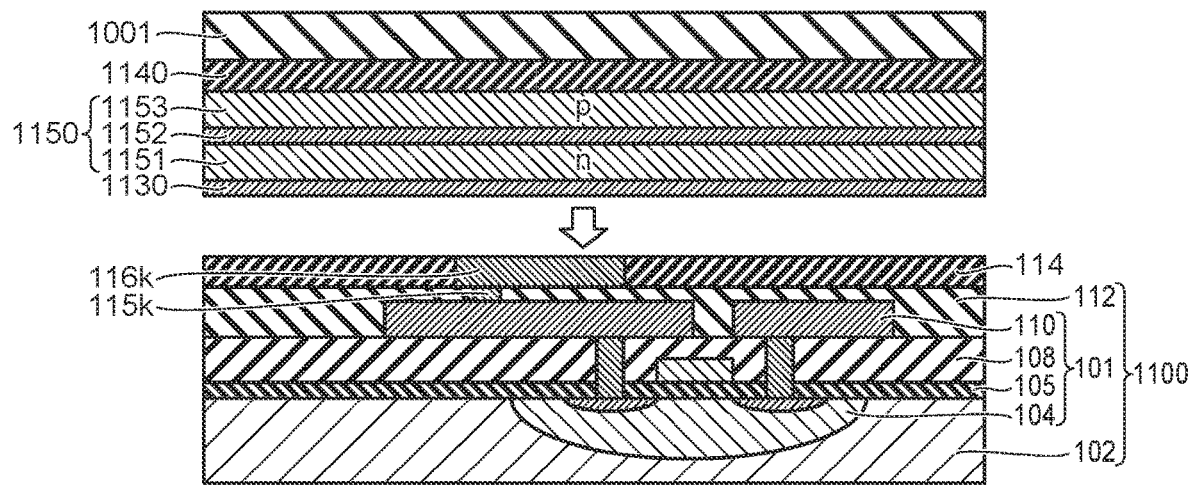
FIG. 5B is a schematic cross-sectional view illustrating the method for manufacturing the image display device of the first embodiment.

A circuit board 1100 is prepared as shown in FIG. 5B. The circuit board (the second substrate) 1100 includes the circuit 101 described with reference to FIG. 1, etc. The semiconductor growth substrate 1194 is vertically inverted. That is, one surface of the circuit board 1100 is caused to face the surface of the metal layer 1130 formed on the semiconductor layer 1150 as shown by the arrow of the drawing, and the two are bonded. The bonding surface of the circuit board 1100 is the exposed surface of the planarization film 114 and the exposed surface of the plug 116k that is exposed in the same plane as the planarization film 114.

In the wafer bonding that bonds the two substrates, for example, the two substrates are heated, and the two substrates are bonded by thermal compression bonding. A low melting-point metal and/or a low melting-point alloy may be used when performing thermal compression bonding. The low melting-point metal is, for example, Sn, In, etc.; the low melting-point alloy can be, for example, an alloy having Zn, In, Ga, Sn, Bi, etc., as a primary component.

In the wafer bonding, other than the above description, the bonding surfaces of the substrates may be cleaned by plasma processing in a vacuum and closely adhered after planarizing the bonding surfaces by chemical mechanical polishing (Chemical Mechanical Polishing, CMP), etc.

Figure 6A:
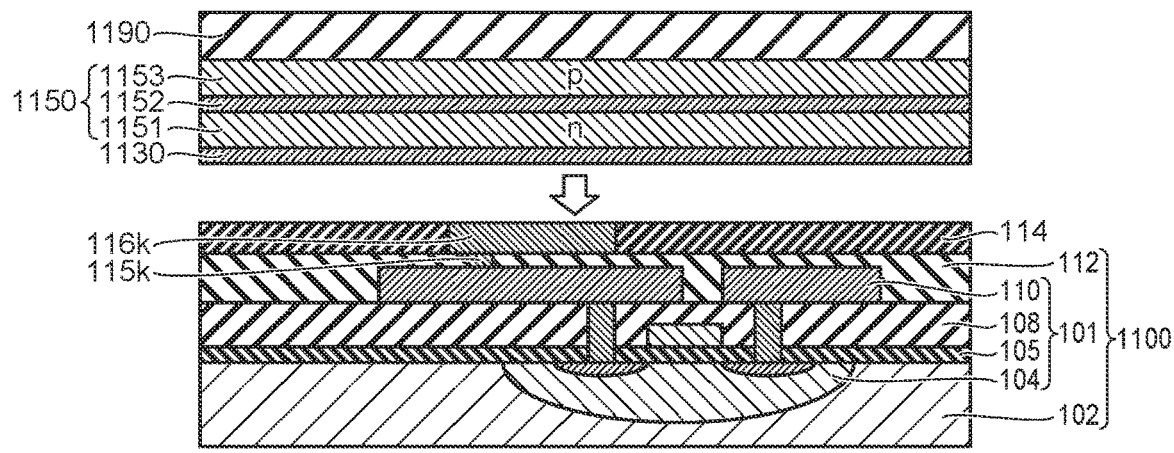
FIG. 6A is a schematic cross-sectional view illustrating a method for manufacturing a modification of the image display device of the first embodiment.
Figure 6B:
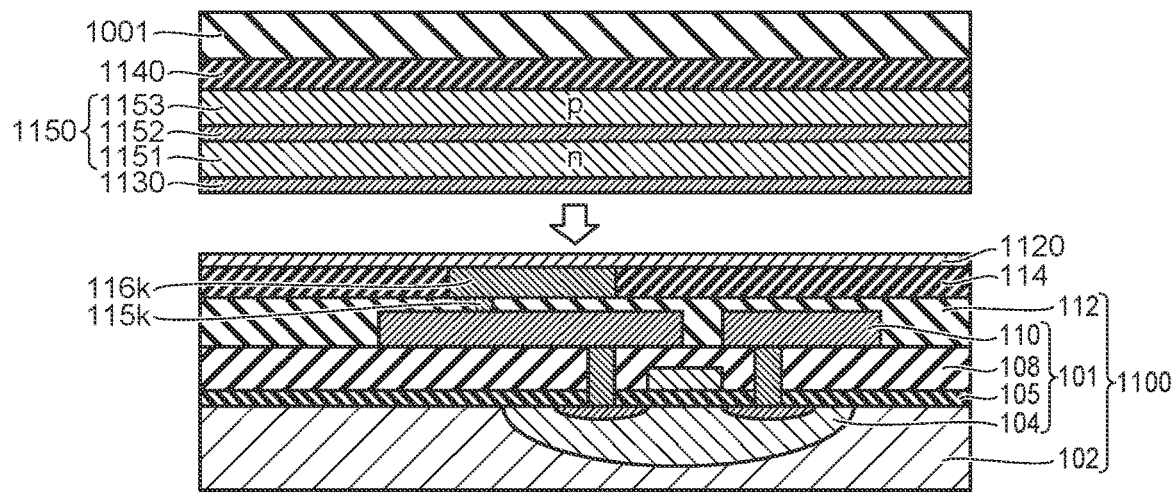
FIG. 6B is a schematic cross-sectional view illustrating a method for manufacturing a modification of the image display device of the first embodiment.
Figure 6C:
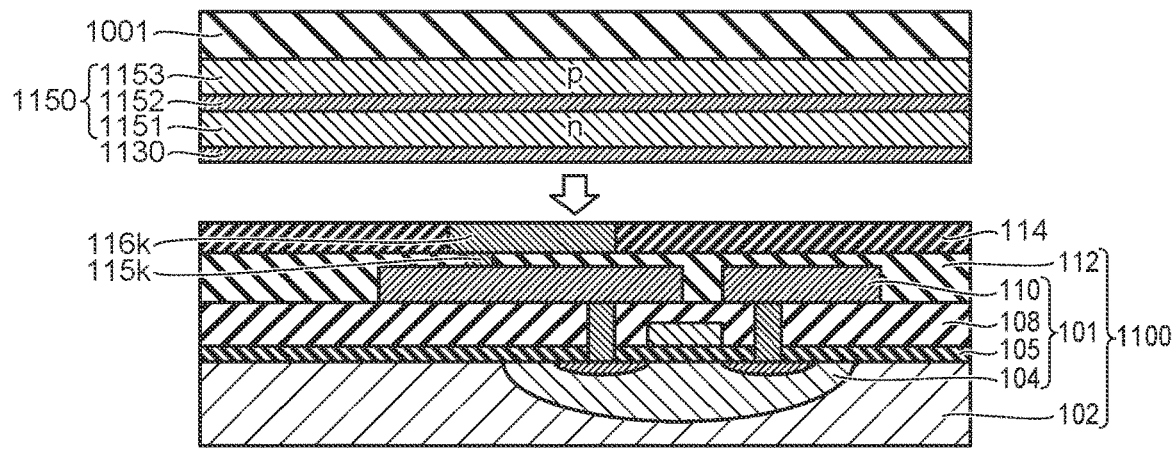
FIG. 6C is a schematic cross-sectional view illustrating a method for manufacturing a modification of the image display device of the first embodiment.

Modifications of the wafer bonding process are shown in FIGS. 6A to 6C. In the wafer bonding process, any of FIGS. 6A to 6C may be used instead of the process of FIG. 5B.

As shown in FIG. 6A, the semiconductor layer 1150 includes the n-type semiconductor layer 1151, the light-emitting layer 1152, and the p-type semiconductor layer 1153 that are stacked by growing on the crystal growth substrate 1001 in this order from the crystal growth substrate 1001 side. A support substrate 1190 is bonded to the surface of the p-type semiconductor layer 1153 that is not covered. For example, the support substrate 1190 is formed of Si, quartz, etc. Subsequently, the crystal growth substrate 1001 is removed. For example, wet etching and/or laser lift-off is used to remove the crystal growth substrate 1001.

The crystal growth substrate 1001 and the buffer layer 1140 are removed, and the metal layer 1130 is formed at the not-enclosed surface of the n-type semiconductor layer 1151.

As shown in FIG. 6B, a metal layer 1120 may be formed on the circuit board 1100. According to the modification, metal layers are bonded to each other; therefore, the wafer bonding can be performed more easily by using the same metal material or alloys including the same metal material in the metal layers. It is sufficient for a metal layer to be located on at least one of the semiconductor growth substrate 1194 side or the circuit board 1100 side.

As shown in FIG. 6C, when crystal growth of the semiconductor layer 1150 on the crystal growth substrate 1001 is performed, the semiconductor growth substrate may be formed without interposing the buffer layer. In such a case, the process of removing the buffer layer after the wafer bonding can be omitted.

The description now returns to the manufacturing process after the wafer bonding.

Figure 7A:
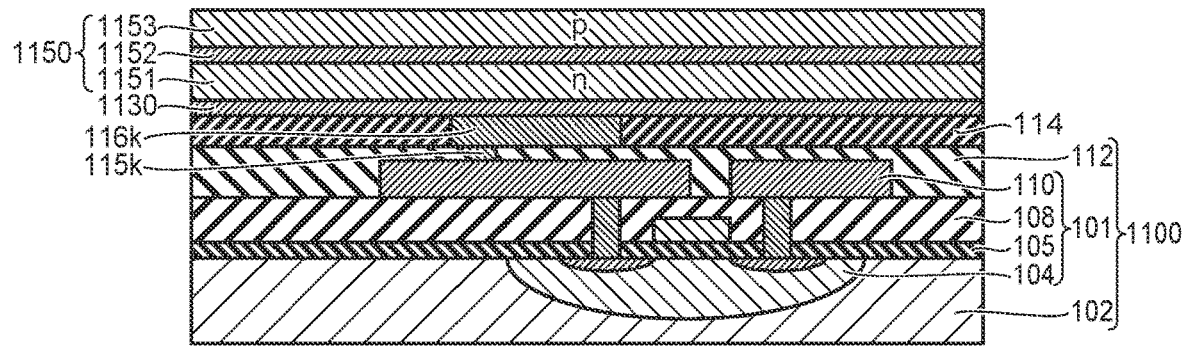
FIG. 7A is a schematic cross-sectional view illustrating the method for manufacturing the image display device of the first embodiment.

The crystal growth substrate 1001 is removed as shown in FIG. 7A. For example, laser lift-off and/or wet etching is used to remove the crystal growth substrate 1001. The circuit board 1100 is bonded to the semiconductor layer 1150 via the metal layer 1130 by the wafer bonding.

Figure 7B:
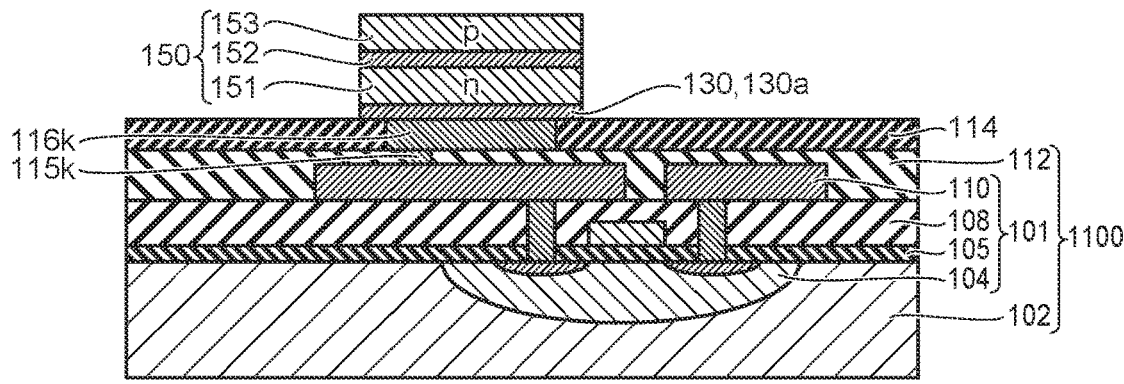
FIG. 7B is a schematic cross-sectional view illustrating the method for manufacturing the image display device of the first embodiment.

As shown in FIG. 7B, the metal layer 1130 and the semiconductor layer 1150 are formed into the desired shape by etching. The wiring layer 130 is formed by etching the metal layer 1130. The wiring layer 130 includes the light-shielding plate 130a. The light-shielding plate 130a is formed into the shape described above by etching. The shape of the light-emitting element 150 is formed by further etching the semiconductor layer 1150. For example, a dry etching process is used to form the light-emitting element 150, and it is favorable to use anisotropic plasma etching (Reactive Ion Etching, RIE).

Figure 7C:
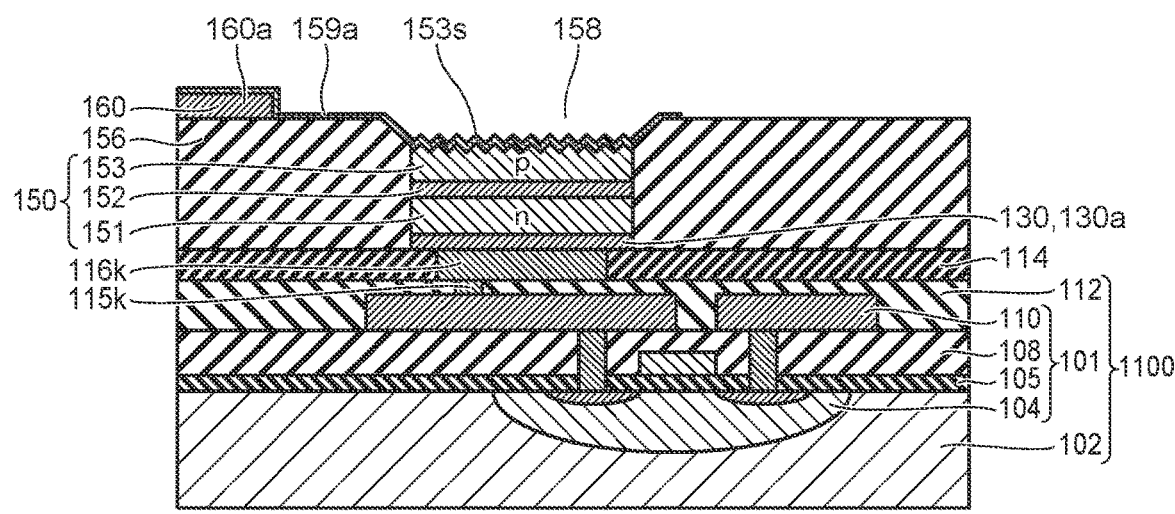
FIG. 7C is a schematic cross-sectional view illustrating the method for manufacturing the image display device of the first embodiment.

As shown in FIG. 7C, the inter-layer insulating film 156 that covers the planarization film 114, the wiring layer 130, and the light-emitting element 150 is formed. The opening 158 is formed by etching the inter-layer insulating film at a position that corresponds to the light-emitting element 150, and the surface of the p-type semiconductor layer 153 is exposed. The etching may be wet etching or dry etching.

Subsequently, the exposed light-emitting surface 153S of the p-type semiconductor layer 153 is roughened to increase the luminous efficiency.

The second wiring layer 160 is formed as a film that is in the opening 158 as well, and the wiring portions 160a, etc., are formed by photolithography. The wiring portion 160a is not connected to the p-type semiconductor layer 153.

A transparent conductive film that covers the second wiring layer 160, the second inter-layer insulating film 156, and the light-emitting surface 153S of the p-type semiconductor layer 153 is formed. It is favorable for the transparent conductive film to include an ITO film, a ZnO film, etc. The necessary transparent electrode 159a is formed by photolithography.

The transparent electrode 159a is formed on the wiring portion 160a, and is also formed on the light-emitting surface 153S of the p-type semiconductor layer 153. Accordingly, the wiring portion 160a and the p-type semiconductor layer 153 are electrically connected. It is favorable for the transparent electrode 159a to be provided to cover the entire surface of the exposed light-emitting surface 153S, and to be connected to the light-emitting surface 153S.

The process of forming the plug 116k will now be described.

Cross-sectional views for describing the process of forming the plug 116k in the circuit board 1100 are shown in FIGS. 8A to 9C.

Figure 8A:
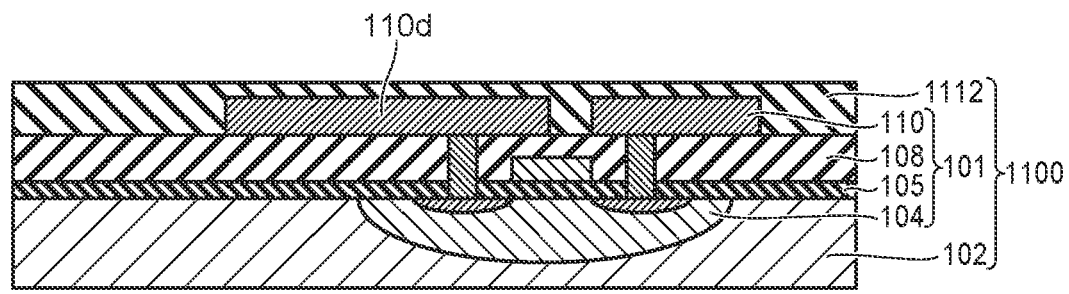
FIG. 8A is a schematic cross-sectional view illustrating the method for manufacturing the image display device of the first embodiment.

As shown in FIG. 8A, the circuit board 1100 is prepared, and an inter-layer insulating film 1112 that covers the tops of the insulating film 108 and the first wiring layer 110 of the circuit board 1100 is formed in the circuit board 1100.

Figure 8B:
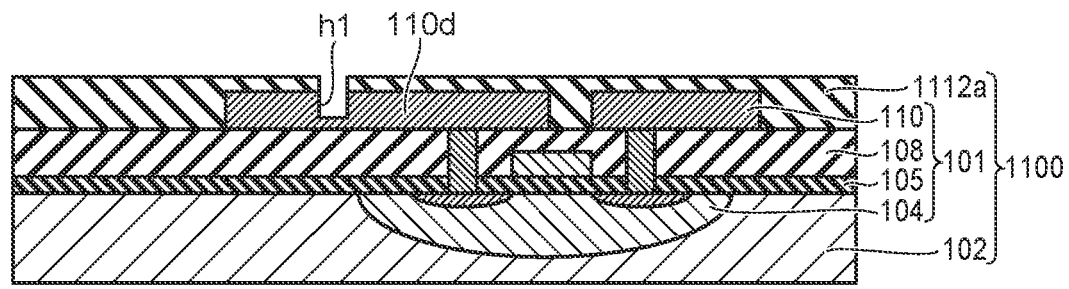
FIG. 8B is a schematic cross-sectional view illustrating the method for manufacturing the image display device of the first embodiment.

As shown in FIG. 8B, a contact hole h1 is formed in an inter-layer insulating film 1112a. The position at which the contact hole h1 is formed is the position at which the wiring portion 110d is located, and the contact hole h1 is formed to a depth that reaches the wiring portion 110d.

Figure 8C:
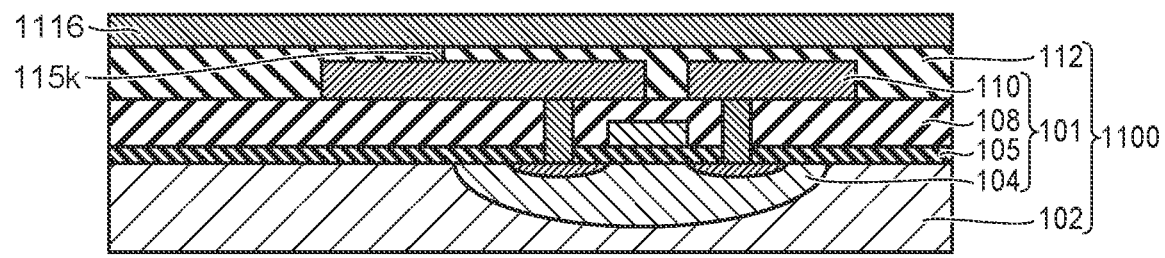
FIG. 8C is a schematic cross-sectional view illustrating the method for manufacturing the image display device of the first embodiment.

As shown in FIG. 8C, a metal layer 1116 is formed over the entire surface of the first inter-layer insulating film 112. The connection part 115k is formed by filling the contact hole h1 with the same conductive material as the metal layer 1116 simultaneously with the formation of the metal layer 1116.

When the connection part 115k is not formed, a large contact hole that corresponds to the outer perimeter shape of the plug 116k is formed in the inter-layer insulating film 1112 of the circuit board 1100 that is prepared in FIG. 8A, and the metal layer 1116 is subsequently formed while filling the contact hole. Or, the metal layer 1116 is formed without forming a contact hole after grinding or polishing until the wiring portion 110d is exposed.

Figure 9A:
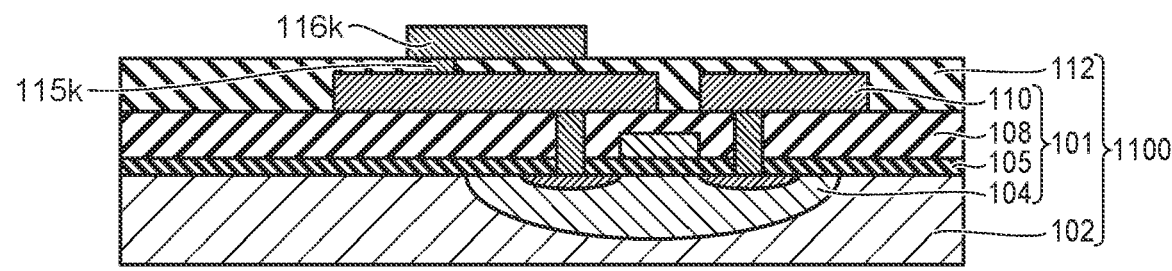
FIG. 9A is a schematic cross-sectional view illustrating the method for manufacturing the image display device of the first embodiment.

As shown in FIG. 9A, the plug 116k and the connection part 115k are formed by photolithography and dry etching.

Figure 9B:
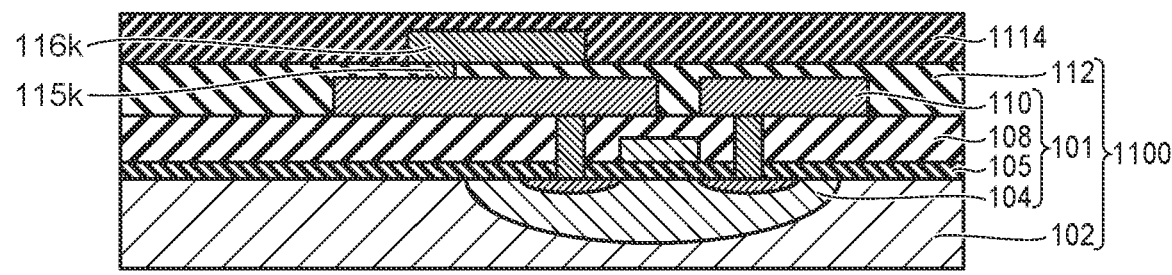
FIG. 9B is a schematic cross-sectional view illustrating the method for manufacturing the image display device of the first embodiment.

As shown in FIG. 9B, a planarization film 1114 is coated to cover the inter-layer insulating film 112 and the plug 116k, and is subsequently fired.

Figure 9C:
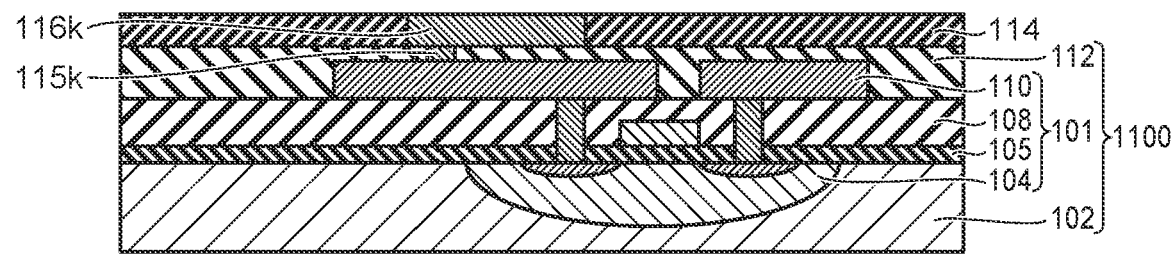
FIG. 9C is a schematic cross-sectional view illustrating the method for manufacturing the image display device of the first embodiment.

As shown in FIG. 9C, the surface of the planarization film 1114 is polished so that the surface of the plug 116k is exposed. For example, CMP is used to polish the planarization film 1114. Thus, the plug 116k and the connection part 115k are formed.

A method for manufacturing the subpixels 20b and 20c of the modifications will now be described.

Figure 10A:
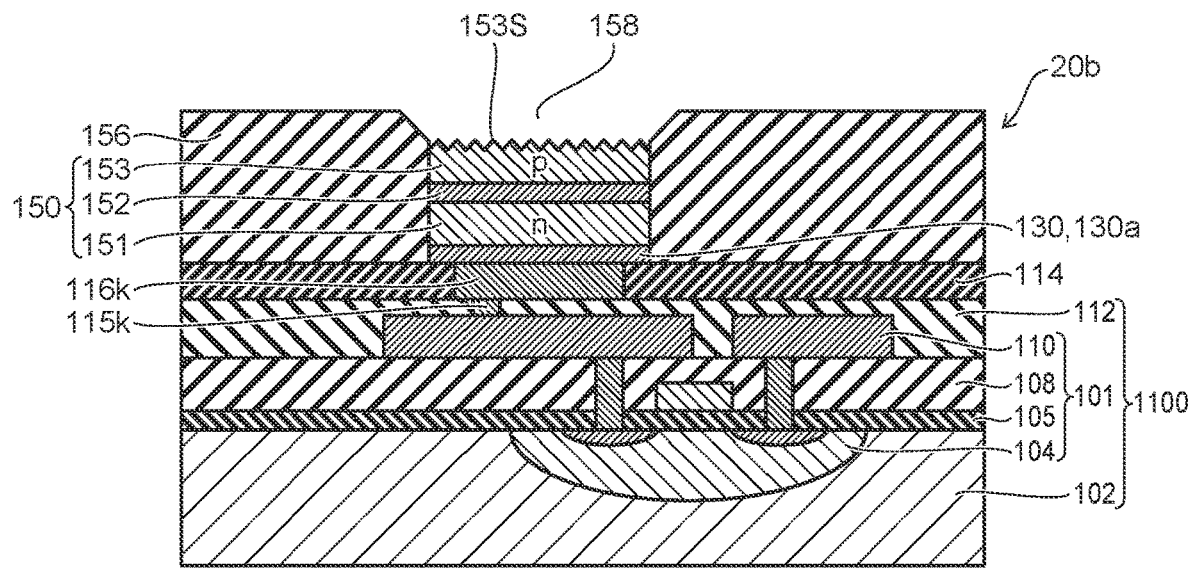
FIG. 10A is a schematic cross-sectional view illustrating a method for manufacturing a modification of the image display device of the first embodiment.
Figure 10B:
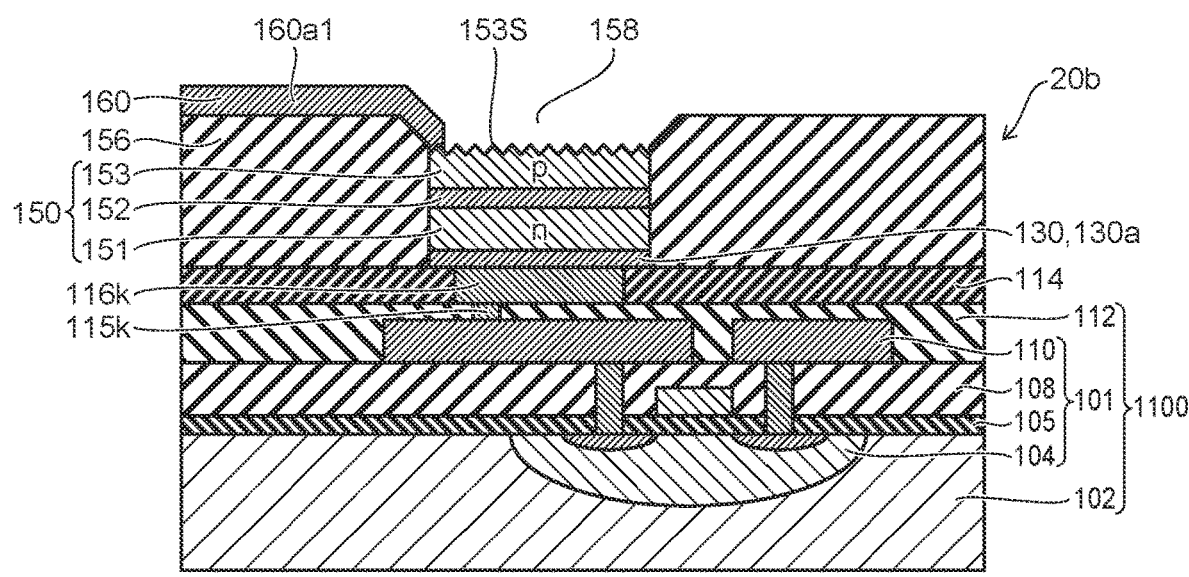
FIG. 10B is a schematic cross-sectional view illustrating the manufacturing method of the modification of the image display device of the first embodiment.
Figure 11A:
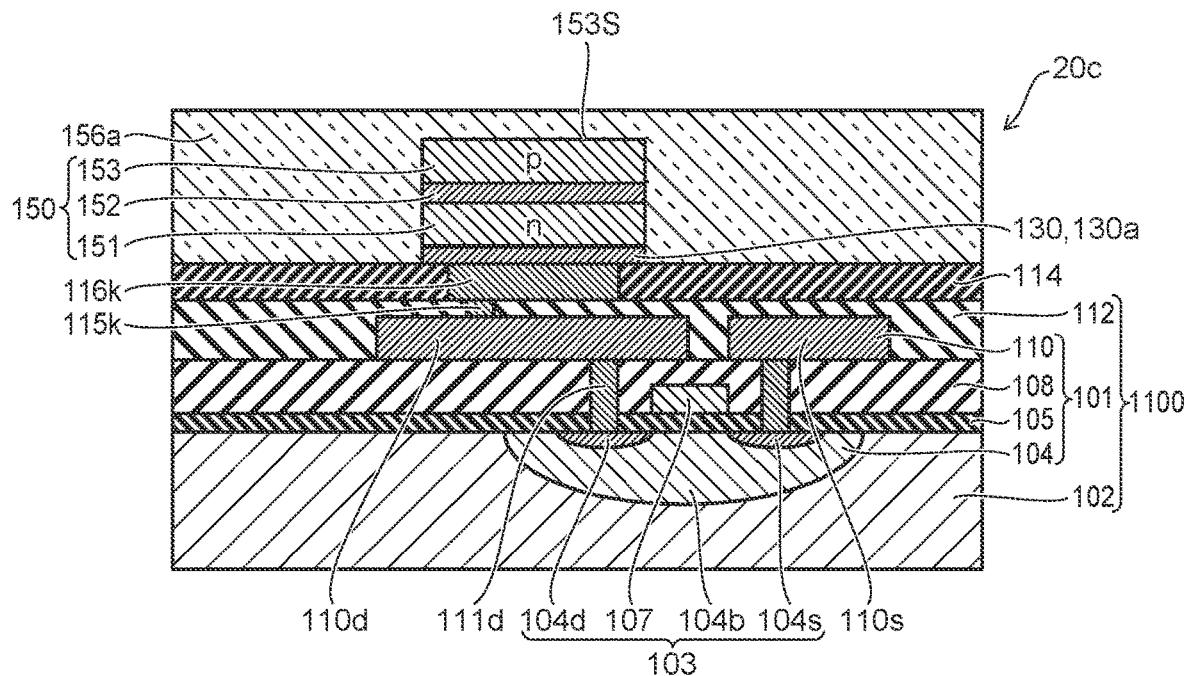
FIG. 11A is a schematic cross-sectional view illustrating a method for manufacturing a modification of the image display device of the first embodiment.
Figure 11B:
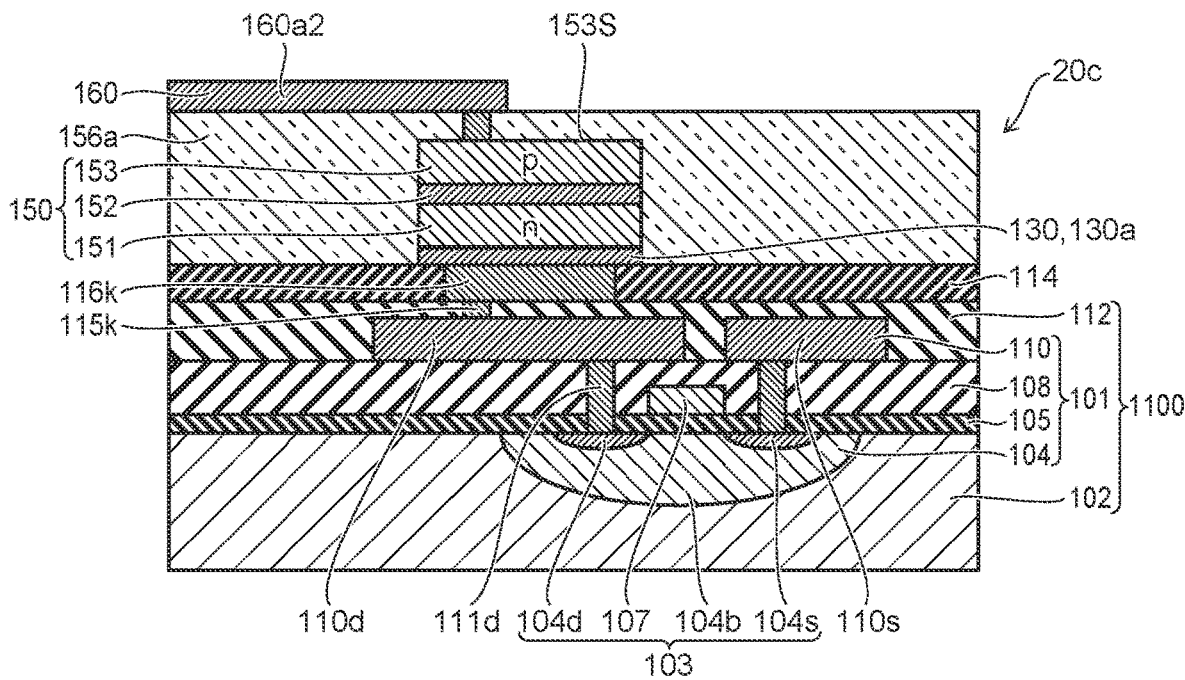
FIG. 11B is a schematic cross-sectional view illustrating the manufacturing method of the modification of the image display device of the first embodiment.

FIGS. 10A and 10B illustrate manufacturing processes corresponding to the subpixel 20b of the modification. FIGS. 11A and 11B illustrate manufacturing processes corresponding to the subpixel 20c of the modification. FIGS. 10A to 11B are performed after the process of FIG. 7B, and respectively show the processes of forming the subpixels 20b and 20c.

In the subpixel 20b of the modification as shown in FIG. 10A, the inter-layer insulating film 156 is formed to cover the planarization film 114, the wiring layer 130, and the light-emitting element 150; subsequently, the opening 158 is formed to expose the light-emitting surface 153S of the p-type semiconductor layer 153.

The wiring portion 160a1 of the wiring layer 160 is formed as shown in FIG. 10B. The wiring portion 160a1 is connected to the light-emitting surface 153S of the p-type semiconductor layer 153 instead of the electrical connection by the transparent electrode.

In the subpixel 20c of the modification as shown in FIG. 11A, the second inter-layer insulating film 156a is formed over the planarization film 114, the wiring layer 130, and the light-emitting element 150.

As shown in FIG. 11B, a contact hole is formed in the inter-layer insulating film 156a; subsequently, the second wiring layer 160 is formed. The wiring portion 160a2 of the second wiring layer 160 is connected to the light-emitting surface 153S of the p-type semiconductor layer 153 via the contact hole.

Thus, the subpixel 20 and the subpixels 20b and 20c of the modifications are formed.

A portion of the circuit other than the subpixel 20 is formed in the circuit board 100. For example, the row selection circuit 5 (FIG. 4) can be formed in the circuit board 100 together with the drive transistors, the select transistors, etc. That is, there are cases where the row selection circuit 5 is simultaneously integrated by the manufacturing processes described above. On the other hand, it is desirable for the signal voltage output circuit 7 to be integrated in a semiconductor device that is manufactured by manufacturing processes in which higher integration by fine patterning is possible. For example, the signal voltage output circuit 7 is mounted to another substrate together with a CPU and other circuit components, and is connected with the wiring portions of the circuit board 100 before assembling the color filter described below or after assembling the color filter.

It is favorable for the circuit board 1100 to be a wafer that includes the circuit 101. The circuit 101 is formed in the circuit board 1100 for one or multiple image display devices. Or, in the case of a larger screen size, etc., the circuit 101 for configuring one image display device may be formed by being subdivided into multiple circuit boards 1100, and one image display device may be configured by combining all of the subdivided circuits.

Also, it is favorable for the crystal growth substrate 1001 to be a wafer of the same size as the wafer-shaped circuit board 1100.

Figure 12:
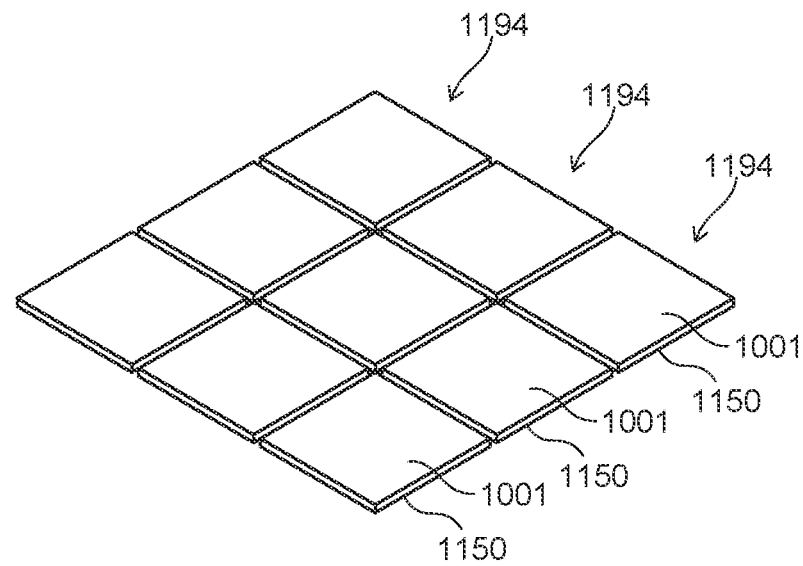
FIG. 12 is a schematic perspective view illustrating the method for manufacturing the image display device of the first embodiment.
Figure 12:
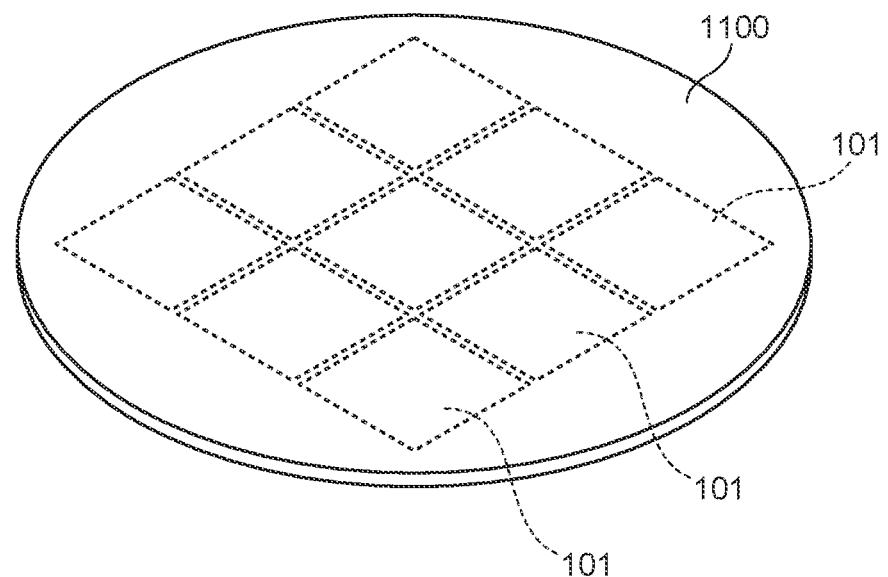

FIG. 12 is a perspective view illustrating the method for manufacturing the image display device of the embodiment.

As shown in FIG. 12, multiple semiconductor growth substrates 1194 may be prepared, and semiconductor layers 1150 that are formed on the multiple crystal growth substrates 1001 may be bonded to one circuit board 1100.

For example, the multiple circuits 101 are arranged in a lattice configuration in the circuit board 1100. The circuits 101 include all of subpixels 20, etc., necessary for one image display device 1. A spacing that is about the scribe line width is located between the circuits 101 that are located next to each other. A circuit element or the like is not located at the end portion and the end portion vicinity of the circuit 101.

The semiconductor layer 1150 is formed so that the end portion of the semiconductor layer 1150 is aligned with the end portion of the crystal growth substrate 1001. Therefore, by disposing and bonding so that the end portion of the semiconductor growth substrate 1194 is aligned with the end portion of the circuit 101, the end portion of the semiconductor layer 1150 and the end portion of the circuit 101 can be aligned after bonding.

When growing the semiconductor layer 1150 on the crystal growth substrate 1001, the crystal quality easily degrades at the end portion and the end portion vicinity of the semiconductor layer 1150. Therefore, by aligning the end portion of the semiconductor layer 1150 and the end portion of the circuit 101, the region at which the crystal quality easily degrades that is at the end portion vicinity of the semiconductor layer 1150 on the semiconductor growth substrate 1194 is not used in the display region of the image display device 1.

Or, conversely, multiple circuit boards 1100 may be prepared, and the multiple circuit boards 1100 may be bonded to the semiconductor layer 1150 that is formed on the crystal growth substrate 1001 of one semiconductor growth substrate 1194.

Figure 13:
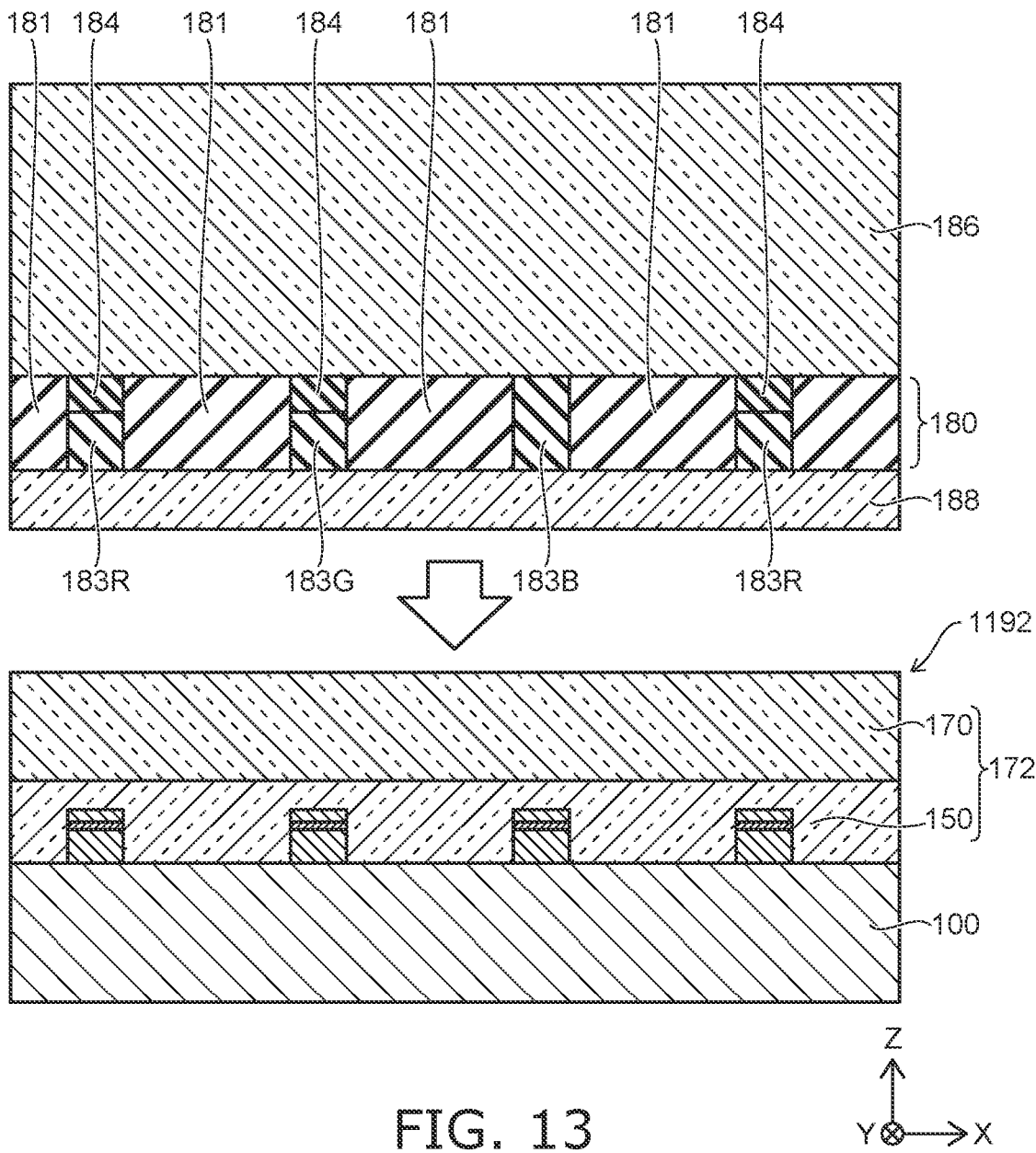
FIG. 13 is a schematic cross-sectional view illustrating the method for manufacturing the image display device of the first embodiment.

FIG. 13 is a schematic cross-sectional view illustrating the method for manufacturing the image display device of the embodiment.

In FIG. 13, the wiring portions that are in the circuit board 100, in the inter-layer insulating films 112 and 156, etc., are not illustrated to avoid complexity. Also, a portion of the color conversion members such as the color filter 180, etc., is displayed in FIG. 13. Here, the structural component that includes the plug 116k, the connection part 115k, the light-emitting element 150, the wiring layers 130 and 160, the inter-layer insulating film 156, and the surface resin layer 170 is called a light-emitting circuit part 172. Also, the structural component in which the light-emitting circuit part 172 is located on the circuit board 100 is called a structure body 1192.

As shown in FIG. 13, the color filter 180 is bonded to the structure body 1192 at one surface of the color filter 180. The other surface of the color filter 180 is bonded to a glass substrate 186. The transparent thin film adhesive layer 188 is located at the one surface of the color filter 180, and the bonding to the surface of the structure body 1192 at the light-emitting circuit part 172 side is performed via the transparent thin film adhesive layer 188.

In the color filter 180 of the example, the color conversion parts are arranged in the positive direction of the X-axis in the order of red, green, and blue. Respectively for red and green, a red color conversion layer 183R and a green color conversion layer 183G are located in the first layer, and the filter layers 184 are located in the second layer. For blue, a single-layer color conversion layer 183B is located. The light-shielding part 181 is located between the color conversion parts.

The color filter 180 is adhered to the structure body 1192 so that the positions of the color conversion layers 183R, 183G, and 183B of each color match the positions of the light-emitting elements 150.

FIGS. 14A to 14D are schematic cross-sectional views showing a modification of the method for manufacturing the image display device of the embodiment.

A method in which the color filter is formed by inkjet is shown in FIGS. 14A to 14D.

Figure 14A:
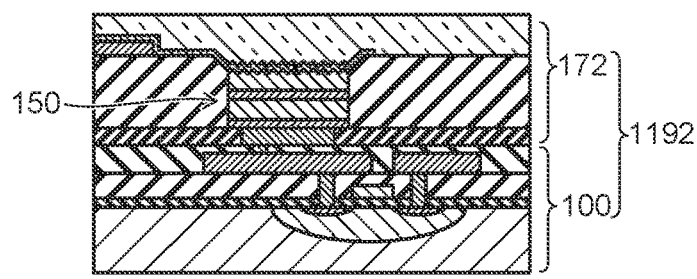
FIG. 14A is a schematic cross-sectional view illustrating a method for manufacturing a modification of the image display device of the first embodiment.

As shown in FIG. 14A, the structure body 1192 in which the light-emitting circuit part 172 is adhered to the circuit board 100 is prepared.

Figure 14B:
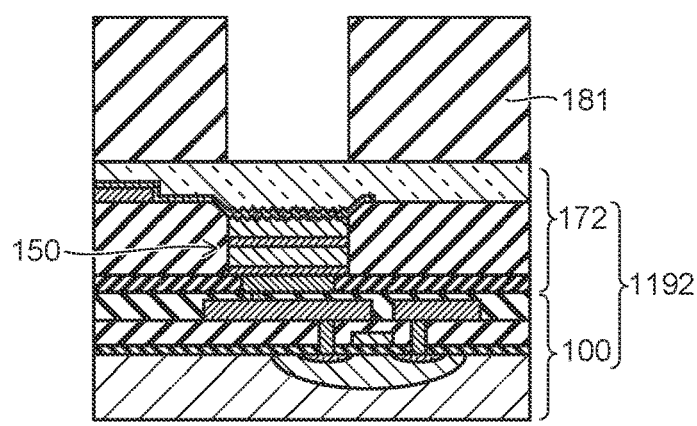
FIG. 14B is a schematic cross-sectional view illustrating the manufacturing method of the modification of the image display device of the first embodiment.

As shown in FIG. 14B, the light-shielding part 181 is formed on the structure body 1192. For example, the light-shielding part 181 is formed using screen printing, photolithography technology, etc.

Figure 14C:
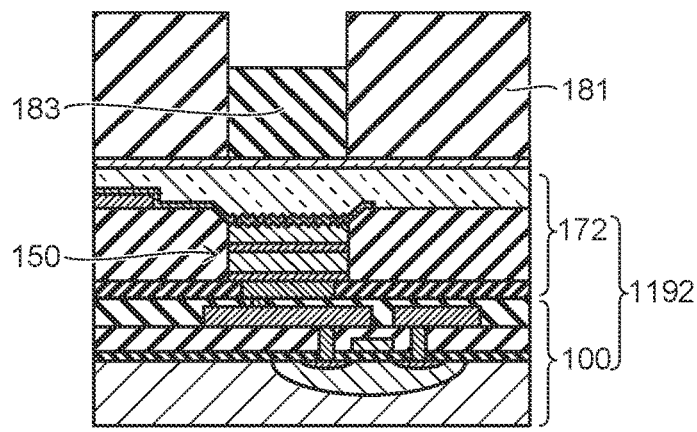
FIG. 14C is a schematic cross-sectional view illustrating the manufacturing method of the modification of the image display device of the first embodiment.

As shown in FIG. 14C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material or a quantum dot fluorescer material. It is favorable to use a quantum dot fluorescer material because the light emission colors can be realized, the monochromaticity can be high, and the color reproducibility can be high. After the printing by the inkjet nozzle, drying processing is performed using an appropriate temperature and time. The thickness of the coating when coloring is set to be less than the thickness of the light-shielding part 181.

As described above, the fluorescer may not be dispensed in the subpixel of the blue light emission because the color conversion part may not be formed. Also, when a blue color conversion layer is formed in the subpixel of the blue light emission, the color conversion part may be one layer; therefore, it is favorable for the thickness of the coated film of the blue fluorescer to be about equal to the thickness of the light-shielding part 181.

Figure 14D:
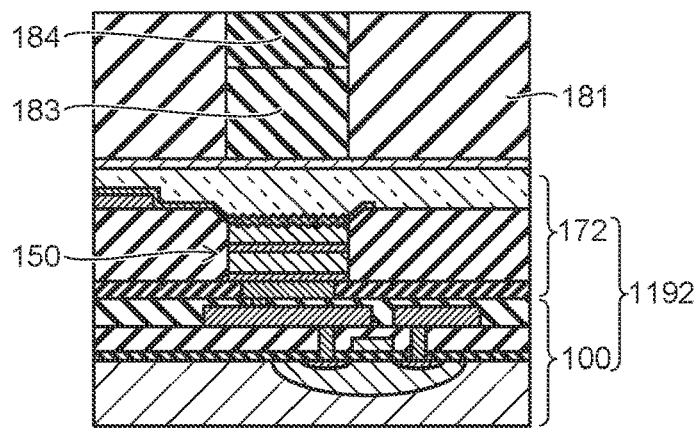
FIG. 14D is a schematic cross-sectional view illustrating the manufacturing method of the modification of the image display device of the first embodiment.

As shown in FIG. 14D, a coating for the filter layer 184 is dispensed from the inkjet nozzle. The coating is coated to overlap the coated film of the fluorescer. The total thickness of the color conversion layer 183 and the filter layer 184 is set to be about equal to the thickness of the light-shielding part 181.

Thus, the image display device 1 can be manufactured.

Effects of the image display device 1 of the embodiment will now be described.

According to the method for manufacturing the image display device 1 of the embodiment, the semiconductor layer 1150 that includes the light-emitting layer 1152 for the light-emitting element 150 is bonded to the circuit board 1100 (100) that includes the circuit elements such as the transistor 103 that drives the light-emitting element 150, etc. Subsequently, the light-emitting element 150 is formed by etching the semiconductor layer 1150. Therefore, compared to individually transferring singulated light-emitting elements onto the circuit board 1100 (100), the process of transferring the light-emitting elements can be markedly shortened.

For example, in an image display device having 4K image quality, the number of subpixels is greater than 24 million, and in the case of an image display device having 8K image quality, the number of subpixels is greater than 99 million.

When individually mounting such a large amount of light-emitting elements to a circuit board, an enormous amount of time is necessary, and it is difficult to realize an image display device that uses micro LEDs at a realistic cost. Also, when individually mounting a large amount of light-emitting elements, the yield decreases due to connection defects when mounting, etc., and an even higher cost is unavoidable.

Conversely, according to the method for manufacturing the image display device 1 of the embodiment, the entire semiconductor layer 1150 is adhered to the circuit board 1100 (100) before singulating the semiconductor layer 1150; therefore, the transfer process is completed when performed 1 time.

After directly forming the light-emitting element on the circuit board by etching, etc., the light-emitting element and the circuit element in the circuit board 1100 (100) are electrically connected by forming a plug; therefore, a uniform connection structure can be realized, and the decrease of the yield can be suppressed.

By forming the plug 116k to electrically connect the light-emitting element and the circuit element, the n-type semiconductor layer 151 and the transistor 103 can be electrically connected to have a low resistance value without providing a deep via that extends through the inter-layer insulating films 112 and 156.

Also, alignment is unnecessary because the adhering to the circuit board 1100 (100) is performed at the wafer level without pre-singulating the semiconductor layer 1150 or forming electrodes at positions corresponding to the circuit elements. Therefore, the adhesion process can be easily performed in a short period of time. Alignment is unnecessary when adhering, which is favorable for a higher definition display; also, reducing the size of the light-emitting element 150 is easy.

When performing wafer bonding of the semiconductor layer 1150 to the circuit board 1100 according to the embodiment, the metal layer 1130 is pre-formed on the semiconductor layer 1150. Therefore, the wafer bonding can be easily performed by appropriately selecting the material of the metal layer.

The metal layer that is formed in the wafer bonding can be utilized as the third wiring layer 130 as the connection between the light-emitting element 150 and the outside, etc. Because the third wiring layer 130 has an ohmic connection with the n-type semiconductor layer 151, the plug 116k and the n-type semiconductor layer 151 can be electrically connected to have a low resistance value.

Because the third wiring layer 130 can include the light-shielding plate 130a, malfunction of the circuit elements such as the transistor 103, etc., due to unnecessary light scattering of the light-emitting element 150 can be prevented.

Second Embodiment

Figure 15:
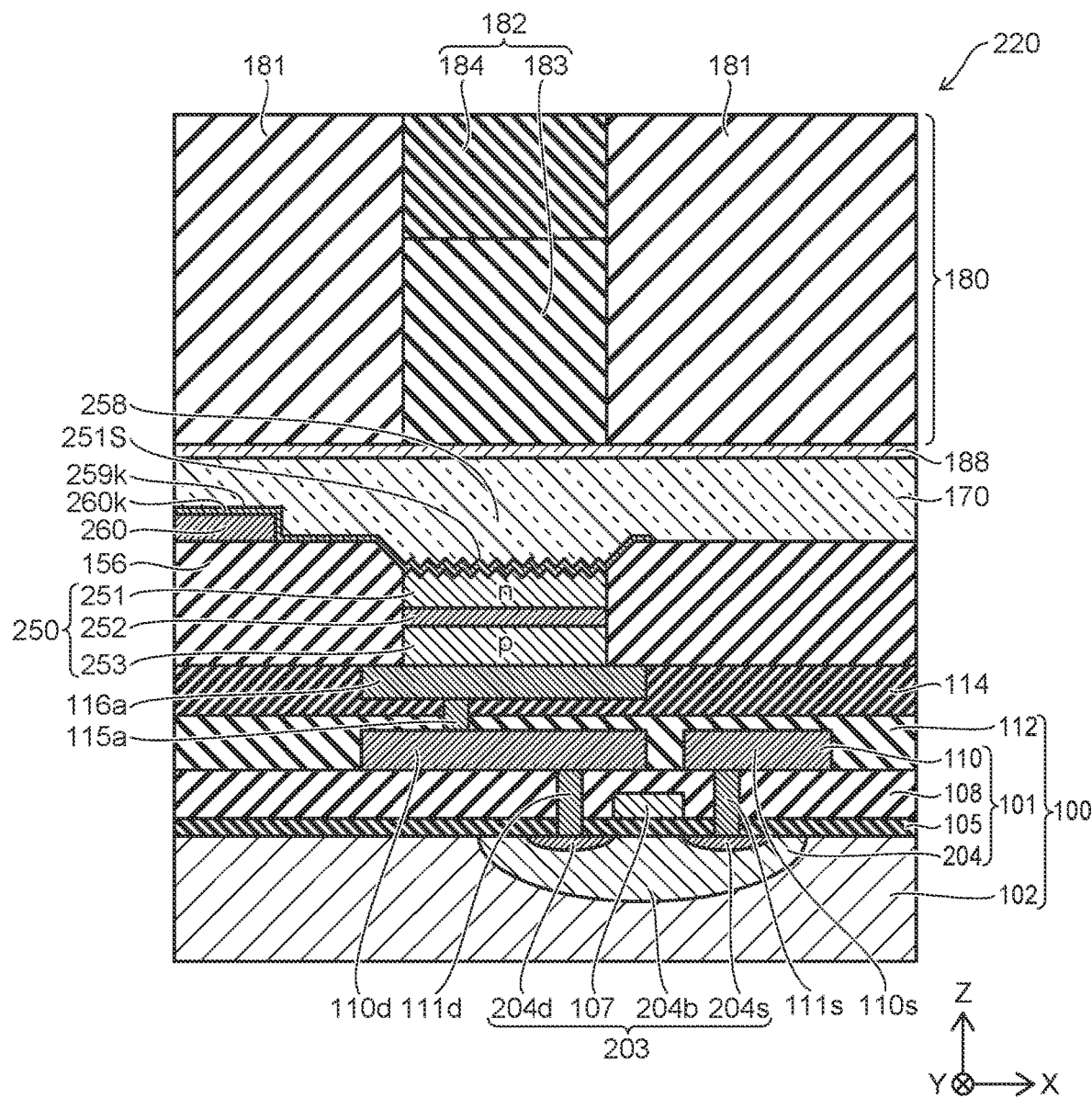
FIG. 15 is a schematic cross-sectional view illustrating a portion of an image display device according to a second embodiment.

FIG. 15 is a schematic cross-sectional view illustrating a portion of an image display device according to an embodiment.

FIG. 15 schematically shows a cross section when a subpixel 220 is cut by a plane parallel to the XZ plane.

The configuration of a light-emitting element 250 and the configuration of a transistor 203 that drives the light-emitting element 250 according to the embodiment are different from those of the other embodiments described above. The same components as those of the other embodiments described above are marked with the same reference numerals, and a detailed description is omitted as appropriate.

As shown in FIG. 15, the subpixel 220 of the image display device of the embodiment includes the transistor 203 and the light-emitting element 250. The transistor 203 is formed in an element formation region 204 that is formed in the substrate 102. The element formation region 204 includes an n-type semiconductor region 204b and p-type semiconductor regions 204s and 204d. The n-type semiconductor region 204b is located at the surface vicinity of the substrate 102. The p-type semiconductor regions 204s and 204d are located in the n-type semiconductor region 204b, and are separated from each other at the surface vicinity of the n-type semiconductor region 204b.

The gate 107 is located on the n-type semiconductor region 204b with the insulating layer 105 interposed. The gate 107 is located between the p-type semiconductor regions 204s and 204d.

The structure of the upper portion of the transistor 203 and the structure of the wiring portions are the same as those of the other embodiments described above. According to the embodiment, the transistor 203 is a p-channel transistor, e.g., a p-channel MOSFET.

In the example, similarly to the other embodiments described above, the third wiring layer and the light-shielding plate are not formed on the first inter-layer insulating film 112, and a p-type semiconductor layer 253 is directly located on a plug 116a. A connection part 115a is located between the plug 116a and the wiring portion 110d. The plug 116a and the wiring portion 110d are electrically connected by the connection part 115a.

As in the plug 116a of the example, it is favorable for the outer perimeter of the light-emitting element 250 projected onto the plug 116a when projected onto the XY plane to be located within the outer perimeter of the plug 116a. The plug 116a of the example also is used as the light-shielding plate.

The light-emitting element 250 includes the p-type semiconductor layer 253, a light-emitting layer 252, and an n-type semiconductor layer 251. Although the light-emitting element 250 has, for example, a substantially square or rectangular shape when projected onto the XY plane, the corners may be rounded.

The light-emitting element 250 may include the same materials as those of the other embodiments described above. For example, the light-emitting element 250 emits blue light of about 467 nm±20 nm or bluish-violet light of a wavelength of 410 nm±20 nm.

The n-type semiconductor layer 251 of the light-emitting element 250 is located on the plug 116a as described above. It is favorable for the plug 116a and the n-type semiconductor layer 251 to have an ohmic connection.

The second inter-layer insulating film (the second insulating film) 156 covers the first inter-layer insulating film 112, the side surface of the light-emitting element 250, and the planarization film 114. The second inter-layer insulating film 156 includes an opening 258. The opening 258 is formed on the light-emitting element 250, and the inter-layer insulating film 156 is not located on a light-emitting surface 251S of the light-emitting element 250. It is favorable for the inter-layer insulating film 156 to include a white resin so that the inter-layer insulating film 156 reflects the light emitted by the light-emitting element 250 and effectively outputs the light from the opening 258.

The light-emitting surface 251S is a surface of the n-type semiconductor layer 251 that is opposite to the surface contacting the light-emitting layer 252. The light-emitting surface 251S is roughened.

A wiring layer 260 is located on the inter-layer insulating film 156. The wiring layer 260 includes a wiring portion 260*k*. The wiring portion 260*k* is connected to the ground line 4 shown in FIG. 16 that is described below. A transparent electrode 259*k* is located on the wiring portion 260*k*. The transparent electrode 259*k* is located over the entire surface of the light-emitting surface 251S. The transparent electrode 259*k* is located between the wiring portion 260*k* and the light-emitting surface 251S and electrically connects the wiring portion 260*k* and the light-emitting surface 251S. Accordingly, the n-type semiconductor layer 251 is connected to the ground line via the transparent electrode 259*k* and the wiring portion 260*k*.

The surface resin layer 170 is located on the inter-layer insulating film 156 and the transparent electrode 259*k*. The color filter 180 is located on the surface resin layer 170 with the transparent thin film adhesive layer 188 interposed.

Figure 16:
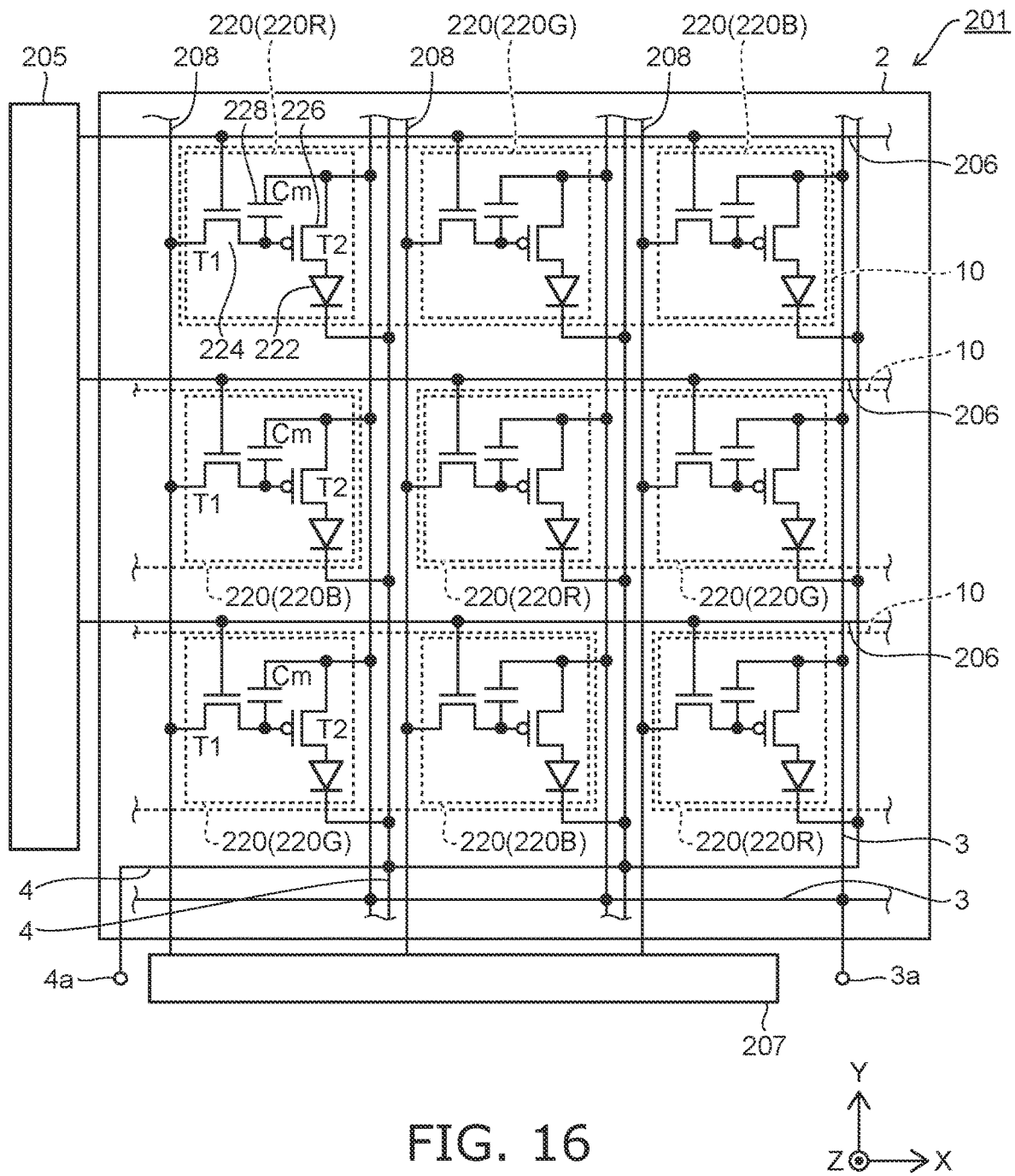
FIG. 16 is a schematic block diagram illustrating the image display device of the second embodiment.

FIG. 16 is a schematic block diagram illustrating the image display device according to the embodiment.

As shown in FIG. 16, the image display device 201 of the embodiment includes the display region 2, a row selection circuit 205, and a signal voltage output circuit 207. Similarly to the other embodiments described above, for example, the subpixels 220 are arranged in a lattice configuration in the display region 2.

The subpixel 220 includes a light-emitting element 222, a select transistor 224, a drive transistor 226, and a capacitor 228. In FIG. 16, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a higher potential side than the light-emitting element 222. The drive transistor 226 is a p-channel MOSFET.

The select transistor 224 is connected between a signal line 208 and a gate electrode of the drive transistor 226. The capacitor 228 is connected between the power supply line 3 and a gate electrode of the drive transistor 226.

The polarities of the signal voltages supplied by the row selection circuit 205 and the signal voltage output circuit 207 to a scanning line 206 and the signal line 208 to drive the drive transistor 226 that is a p-channel MOSFET are different from those of the other embodiments described above.

According to the embodiment, the polarity of the drive transistor 226 is a p-channel; therefore, the polarities of the signal voltages, etc., are different from those of the other embodiments described above. In other words, the row selection circuit 205 supplies a select signal to the scanning line 206 to sequentially select one row from the arrangement of the m rows of the subpixels 220. The signal voltage output circuit 207 supplies signal voltages that have analog voltage values necessary for the subpixels 220 of the selected row. The drive transistors 226 of the subpixels 220 of the selected row cause currents that correspond to the signal voltages to flow in the light-emitting elements 222. The light-emitting elements 222 emit light of luminances corresponding to the currents that flow.

A method for manufacturing the image display device 201 of the embodiment will now be described.

FIGS. 17A to 18C are schematic cross-sectional views illustrating the method for manufacturing the image display device of the embodiment.

Figure 17A:
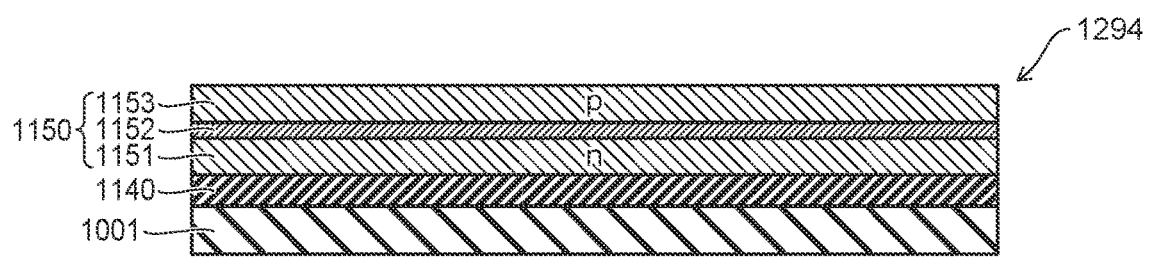
FIG. 17A is a schematic cross-sectional view illustrating a method for manufacturing the image display device of the second embodiment.

According to the embodiment as shown in FIG. 17A, a semiconductor growth substrate 1294 that is different from the semiconductor growth substrate 1194 already described with reference to FIG. 5A is prepared. The semiconductor growth substrate 1294 includes the semiconductor layer 1150 that is grown on the crystal growth substrate 1001. In the example, the semiconductor layer 1150 is grown with the buffer layer 1140 interposed.

According to the embodiment, the n-type semiconductor layer 1151, the light-emitting layer 1152, and the p-type semiconductor layer 1153 are stacked in the semiconductor growth substrate 1294 in this order from the crystal growth substrate 1001 side. In the initial state of the crystal growth, crystal defects that are caused by mismatch of the crystal lattice constants occur easily, and such a crystal is of the n-type. Therefore, as in the embodiment, the stacking from the n-type semiconductor layer 1151 is advantageous in that the margin of the production processes is increased, and the yield is easily increased.

In the example, the circuit board 1100 is bonded without forming the metal layer at the p-type semiconductor layer 1153 side.

Figure 17B:
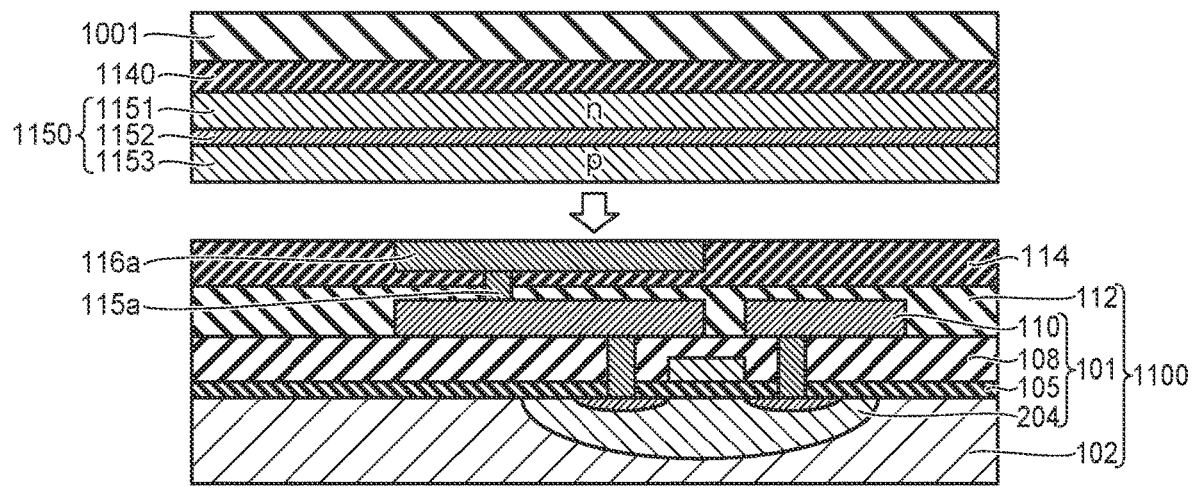
FIG. 17B is a schematic cross-sectional view illustrating the method for manufacturing the image display device of the second embodiment.

As shown in FIG. 17B, the plug 116*a* and the connection part 115*a* are formed in the planarization film 114 in the circuit board 1100 that is prepared. The formation procedure of the planarization film 114, the plug 116*a*, and the connection part 115*a* can be similar to that of the processes described in reference to FIGS. 8A to 9C.

The semiconductor growth substrate 1294 is vertically inverted and adhered to the circuit board 1100. As shown by the arrow of the drawing, one surface of the circuit board 1100 and the surface of the p-type semiconductor layer 1153 of the semiconductor layer 1150 that is not covered are aligned, and the two are adhered. The bonding surface of the circuit board 1100 is the exposed surfaces of the planarization film 114 and the plug 116*a* that is exposed in the same plane as the planarization film 114.

The wafer bonding described above may be performed similarly to those of the modifications described in reference to FIGS. 6A to 6C. In other words, the semiconductor growth substrate 1294 may be adhered to the circuit board 1100 without inverting after transferring the semiconductor layer 1150 to a support substrate as previously described in reference to FIG. 6A. As previously described in reference to FIG. 6B, a metal layer may be located on the semiconductor layer 1150. As previously described in reference to FIG. 6C, the semiconductor layer 1150 that undergoes crystal growth without having the buffer layer 1140 interposed may be adhered.

Figure 18A:
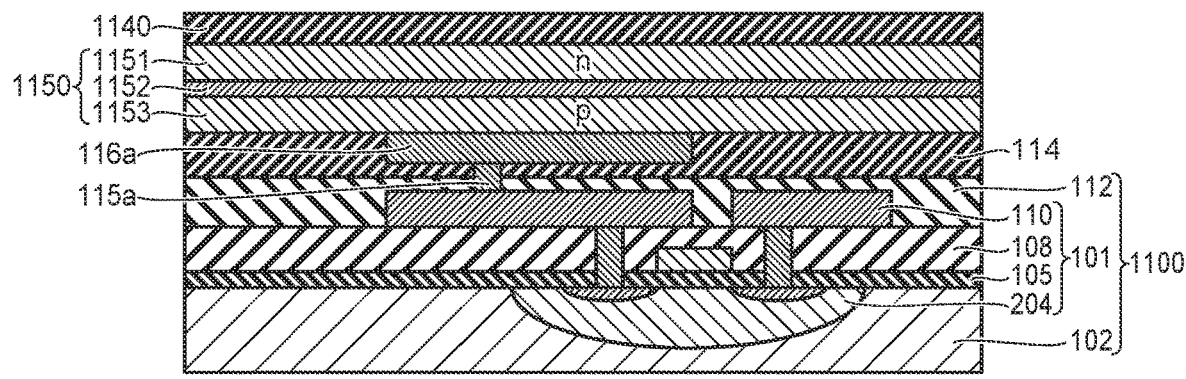
FIG. 18A is a schematic cross-sectional view illustrating the method for manufacturing the image display device of the second embodiment.

As shown in FIG. 18A, the crystal growth substrate 1001 is removed after the wafer bonding of the semiconductor layer 1150 and the circuit board 1100.

Figure 18B:
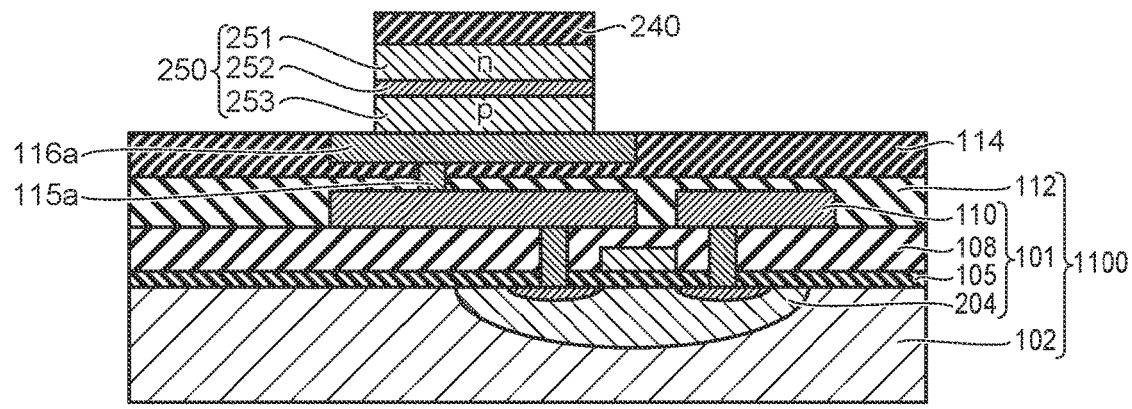
FIG. 18B is a schematic cross-sectional view illustrating the method for manufacturing the image display device of the second embodiment.

As shown in FIG. 18B, similarly to the other embodiments described above, the light-emitting element 250 is formed by etching the semiconductor layer 1150.

Figure 18C:
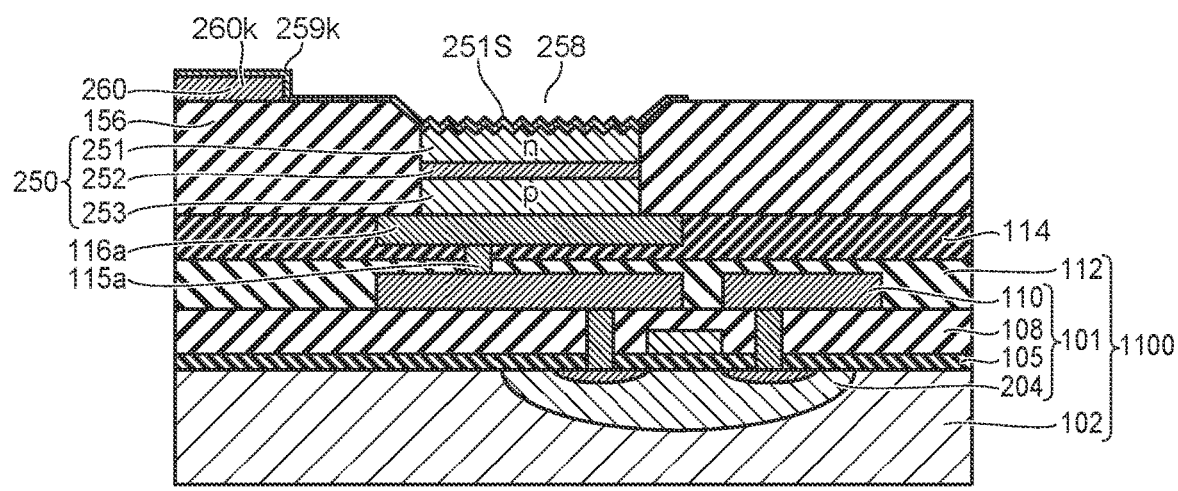
FIG. 18C is a schematic cross-sectional view illustrating the method for manufacturing the image display device of the second embodiment.

As shown in FIG. 18C, after a buffer layer 240 is removed, the inter-layer insulating film 156 that covers the planarization film 114, the plug 116*a*, and the light-emitting element 250 is formed. The opening 258 is formed in the inter-layer insulating film 156, and the light-emitting surface 251S is roughened. Subsequently, the second wiring layer 260 that includes the wiring portion 260*k* is formed, and the transparent electrode 259*k* is formed of an ITO film or the like on the second wiring layer 260.

Effects of the image display device 201 of the embodiment will now be described.

According to the embodiment, effects similar to those of the other embodiments described above are obtained. In other words, the individual light-emitting elements 250 are formed by etching after bonding the semiconductor layer 1150 to the circuit board 1100; therefore, the transfer process of the light-emitting elements can be markedly shortened.

In addition to the effects of the other embodiments described above, according to the embodiment, the roughening can be performed more easily by using the n-type semiconductor layer 251 as the light-emitting surface 251S, and a subpixel that has a high luminous efficiency can be formed by connecting the wiring portion 260k to the light-emitting surface 251S.

According to the embodiment, the formation of a light-shielding metal layer can be omitted by using the plug 116a as the light-shielding plate.

Third Embodiment

According to the other embodiments described above, the light-emitting surface side of the light-emitting element and the power supply line, the ground line, etc., are electrically connected by the wiring layers 160 and 260 that are formed on the second inter-layer insulating film 156. According to the embodiment, the light-emitting surface side of the light-emitting element and the power supply line, the ground line, etc., are electrically connected by a wiring layer 330 that is formed between the light-emitting element and the circuit element.

Figure 19:
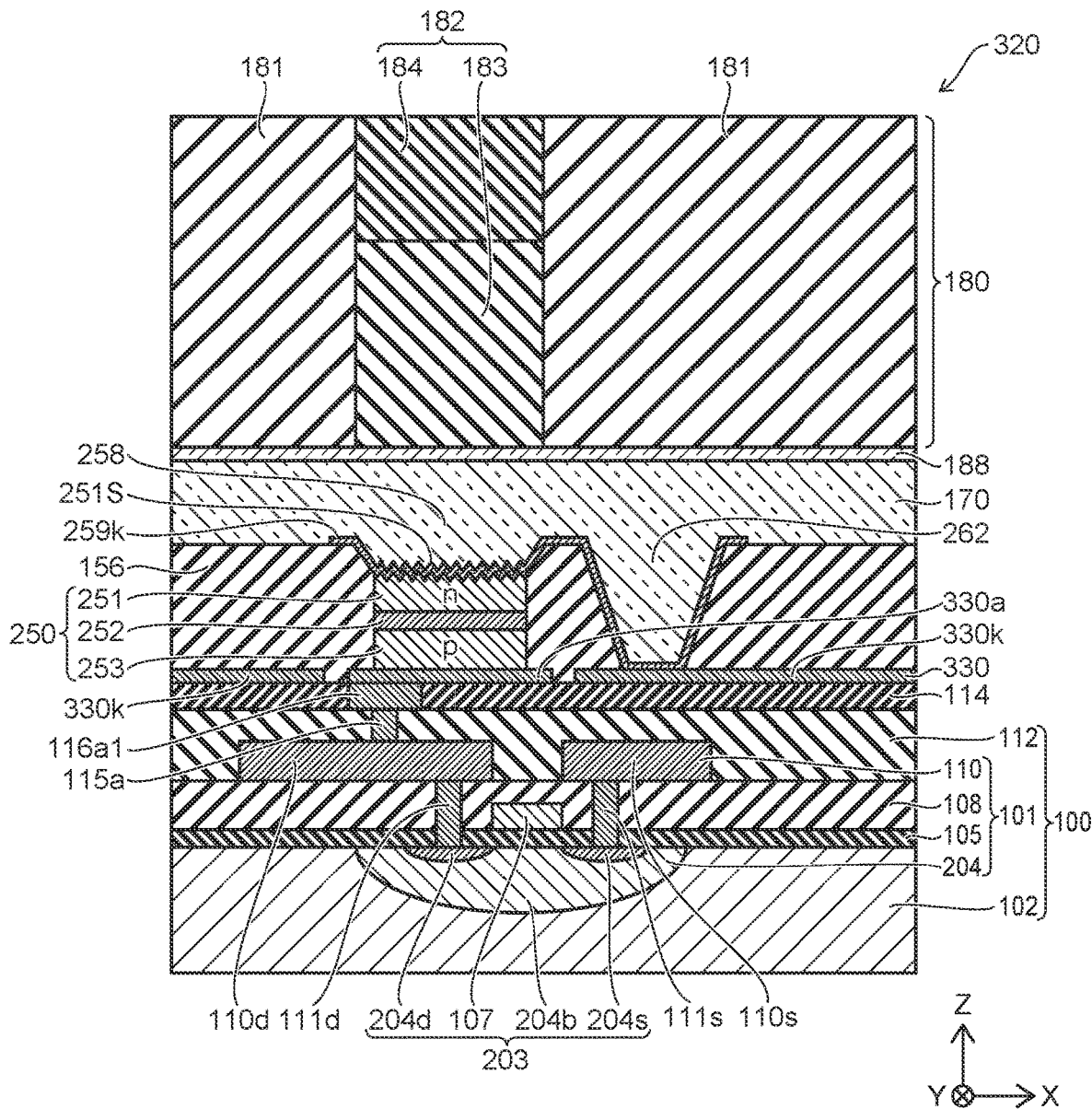
FIG. 19 is a schematic cross-sectional view illustrating a portion of an image display device according to a third embodiment.

FIG. 19 is a schematic cross-sectional view illustrating a portion of an image display device according to the embodiment.

FIG. 19 schematically shows a cross section when a subpixel 320 is cut by a plane parallel to the XZ plane.

According to the embodiment, the configuration of the light-emitting element 250 is the same as that of the second embodiment. In other words, the light-emitting element 250 includes the p-type semiconductor layer 253 of the lower layer, the light-emitting layer 252, and the n-type semiconductor layer 251 that includes the light-emitting surface 251S. The transistor 203 for driving the light-emitting element 250 is a p-channel transistor. The same components as those of the other embodiments described above are marked with the same reference numerals, and a detailed description is omitted as appropriate.

As shown in FIG. 19, the subpixel 320 of the image display device of the embodiment includes the transistor 203 and the light-emitting element 250. The transistor 203 is formed in the element formation region 204 that is formed in the substrate 102. The element formation region 204 includes the n-type semiconductor region 204b and the p-type semiconductor regions 204s and 204d, and the transistor 203 is a p-channel transistor.

The structure of the upper portion of the transistor 203 and the structure of the wiring portions of the circuit board 100 are the same as those of the second embodiment described above.

The planarization film 114 is formed on the first inter-layer insulating film 112. A plug 116a1 is buried in the planarization film 114, and the surface of the plug 116a1 that is exposed from the planarization film 114 is formed in substantially the same plane as the planarization film 114. This plane is set to be substantially parallel to the XY plane. The plug 116a1 is connected to the wiring portion 110d by the connection part 115a that is located in the inter-layer insulating film 112.

The wiring layer (the third wiring layer) 330 is located on the planarization film 114 and the plug 116a1. The wiring layer 330 includes wiring portions 330a and 330k. The wiring portion 330a is located on the plug 116a1, and the wiring portion 330a and the plug 116a1 are electrically connected.

The light-emitting element 250 is located on the wiring portion 330a. The light-emitting element 250 includes the p-type semiconductor layer 253, the light-emitting layer 252, and the n-type semiconductor layer 251 that are stacked in this order from the wiring portion 330a side toward the light-emitting surface 251S side. That is, the top of the wiring portion 330a is connected with the p-type semiconductor layer 253. It is favorable for the wiring portion 330a to have an ohmic connection with the p-type semiconductor layer 253, and to be connected to the wiring portion 110d via the plug 116a1 and the connection part 115a.

In the example, the wiring portion 330a also functions as the light-shielding plate. That is, the outer perimeter of the light-emitting element 250 that is projected onto the wiring portion 330a when projected onto the XY plane is located within the outer perimeter of the wiring portion 330a.

The wiring portion 330k is connected to the ground line 4 shown in FIG. 16. For example, the wiring portion 330k is provided to surround the wiring portion 330a.

The second inter-layer insulating film 156 is formed on the planarization film 114, the wiring layer 330, and the light-emitting element 250. The inter-layer insulating film 156 includes the openings 258 and 262. The opening 258 is located at a position that corresponds to the light-emitting element 250, and is formed to expose the light-emitting surface 251S. The opening 262 is located at a position that corresponds to the wiring portion 330k.

The transparent electrode (the second wiring layer) 259k is located on the light-emitting surface 251S. The transparent electrode 259k is located over the entire surface of the opening 262 and is provided onto the wiring portion 330k that is exposed in the opening 262. The transparent electrode 259k is located between the light-emitting surface 251S and the opening 262, and electrically connects the light-emitting surface 251S and the wiring portion 330k.

Thus, the p-type semiconductor layer 253 that is an anode electrode of the light-emitting element 250 is connected to the driving transistor 203, and the n-type semiconductor layer 251 that is a cathode electrode is connected to the ground line. According to the embodiment, the light-emitting element 250 is driven by the p-channel transistor 203. For example, the circuit configuration shown in FIG. 16 is applied to the drive circuit.

A method for manufacturing the image display device of the embodiment will now be described.

FIGS. 20A to 21B are schematic cross-sectional views illustrating the method for manufacturing the image display device of the embodiment.

Figure 20A:
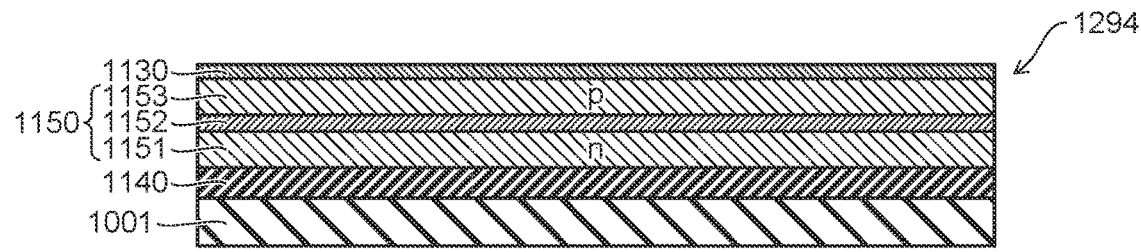
FIG. 20A is a schematic cross-sectional view illustrating a method for manufacturing the image display device of the third embodiment.

As shown in FIG. 20A, the semiconductor growth substrate 1294 in which the semiconductor layer 1150 is grown on the crystal growth substrate 1001 is prepared. According to the embodiment, the semiconductor growth substrate 1294 is formed by growing the n-type semiconductor layer 1151, the light-emitting layer 1152, and the p-type semiconductor layer 1153 on the crystal growth substrate 1001 in this order from the crystal growth substrate 1001 side with the buffer layer 1140 interposed.

The metal layer 1130 also is formed on the semiconductor growth substrate 1294 that is prepared. The metal layer 1130 is formed at the surface of the p-type semiconductor layer 1153 that is opposite to the surface at which the light-emitting layer 1152 is located. By forming a thin film layer that includes a hole-injection material at the interface between the p-type semiconductor layer 1153 and the metal layer 1130, it is also possible to further reduce the drive voltage of the light-emitting element 250. For example, an ITO film or the like may be favorably used as such a hole-injection material.

Figure 20B:
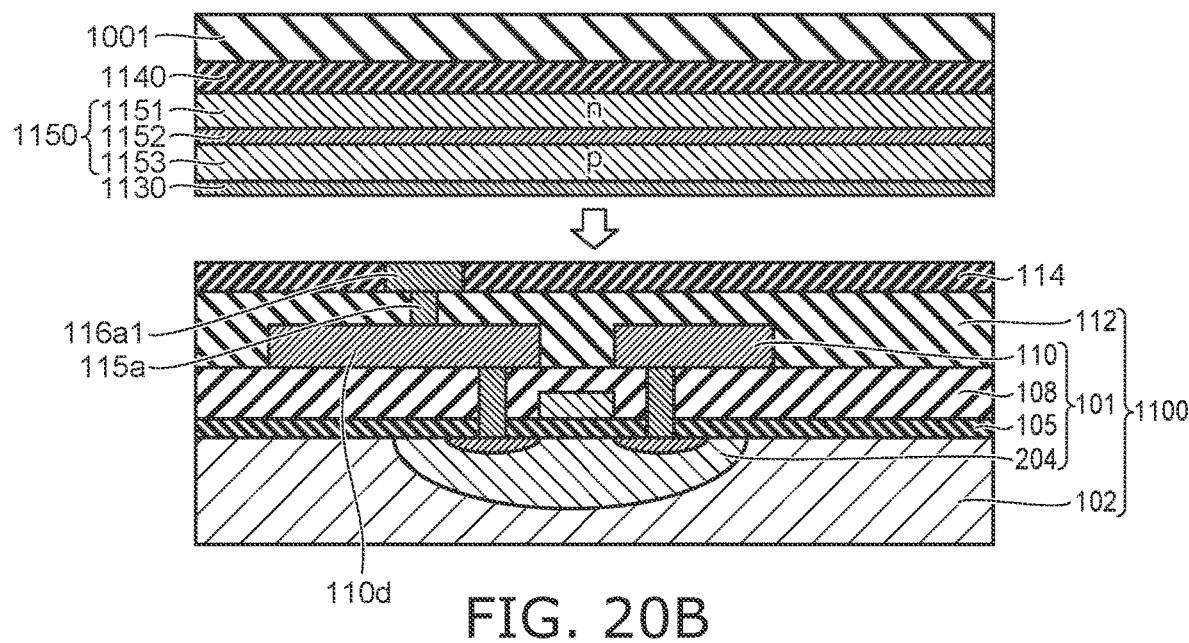
FIG. 20B is a schematic cross-sectional view illustrating the method for manufacturing the image display device of the third embodiment.

As shown in FIG. 20B, the plug 116a1 and the connection part 115a are formed in the planarization film 114 in the circuit board 1100. The formation procedure of the planarization film 114, the plug 116a1, and the connection part 115a is similar to that described in reference to FIGS. 8A to 9C.

The semiconductor growth substrate 1294 in which the metal layer 1130 is formed is vertically inverted and bonded to the circuit board 1100. As shown by the arrow of the drawing, one surface of the circuit board 1100 and the metal layer 1130 are aligned, and the two are adhered. The bonding surface of the circuit board 1100 is the exposed surfaces of the planarization film 114 and the plug 116a1 that is exposed in the same plane as the planarization film 114.

Figure 21A:
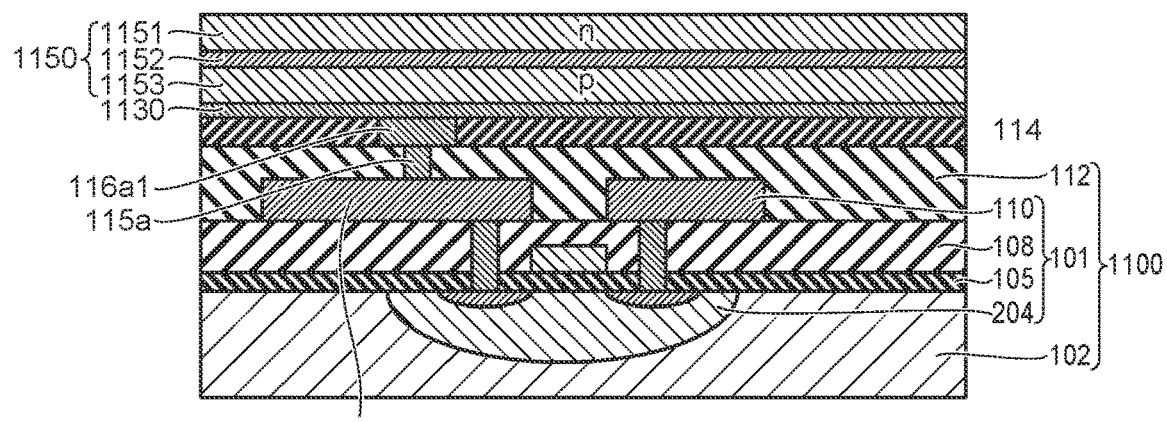
FIG. 21A is a schematic cross-sectional view illustrating the method for manufacturing the image display device of the third embodiment.

As shown in FIG. 21A, the circuit board 1100 and the semiconductor growth substrate 1294 on which the metal layer 1130 is formed are bonded; subsequently, the crystal growth substrate 1001 is removed.

Figure 21B:
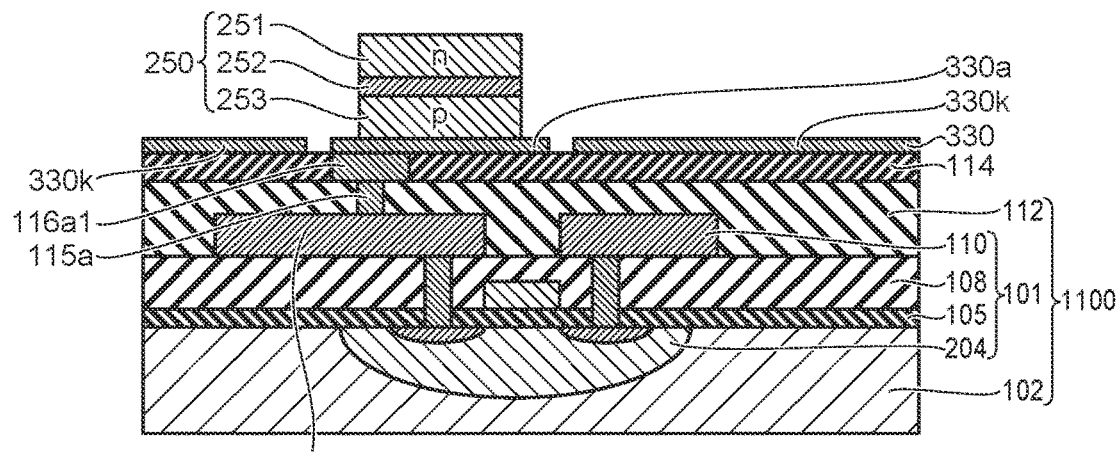
FIG. 21B is a schematic cross-sectional view illustrating the method for manufacturing the image display device of the third embodiment.

As shown in FIG. 21B, the light-emitting element 250 is formed by patterning the semiconductor layer 1150. The light-emitting element 250 is formed by etching.

After the light-emitting element 250 is formed, the third wiring layer 330 is formed by patterning the metal layer 1130. The third wiring layer 330 is formed by etching.

Figure 21C:
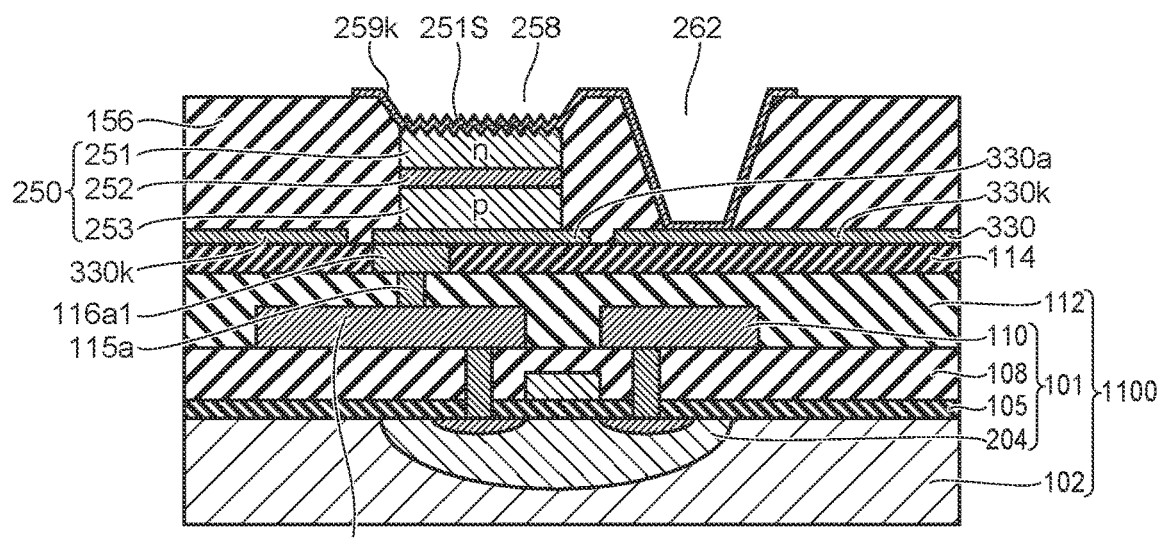
FIG. 21C is a schematic cross-sectional view illustrating the method for manufacturing the image display device of the third embodiment.

As shown in FIG. 21C, the second inter-layer insulating film 156 is formed to cover the wiring layer 330, the planarization film 114, and the side surface of the light-emitting element 250.

The openings 258 and 262 are formed in the inter-layer insulating film 156. The opening 258 is etched until reaching the n-type semiconductor layer 251, and the light-emitting surface 251S is exposed. The opening 262 is etched until reaching the wiring portion 330k, and the wiring portion 330k is exposed.

A transparent conductive film is formed on the wiring portion 330k and the exposed light-emitting surface 251S, and the n-type semiconductor layer 251 and the wiring portion 330k are connected by the transparent electrode 259k.

Effects of the image display device of the embodiment will now be described.

The image display device of the embodiment has effects similar to those of the other embodiments described above, and has the following effects as well.

In the subpixel 320 of the image display device of the embodiment, the electrical connection at the light-emitting surface 251S side is performed by the transparent electrode, and the electrical connection at the side of the surface that is opposite to the light-emitting surface 251S is performed by the wiring layer 330, the plug 116a1, and the connection part 115a. Therefore, all of the wiring portions at the light-emitting surface 251S side can be performed by transparent electrodes, the luminous efficiency of the light-emitting element 250 can be increased; simultaneously, the wiring portion process cost can be reduced.

By using transparent electrodes made of transparent conductive films as all of the wiring layers at the light-emitting surface 251S side, and by using the third wiring layer 330 that is an internal layer as the wiring portions of the power supply line, the ground line, etc., the degree of freedom of the wiring portion patterns of the power supply line, the ground line, etc., can be increased, and the design efficiency of the image display device can be increased.

Fourth Embodiment

The configuration of the plug according to the embodiment is different from those of the other embodiments described above. In the plug of the embodiment, a part that corresponds to the third wiring layer 330 and the plug 116a1 of the third embodiment is formed to have a continuous body. The other components are the same as those of the third embodiment; the same components are marked with the same reference numerals, and a detailed description is omitted as appropriate.

Figure 22:
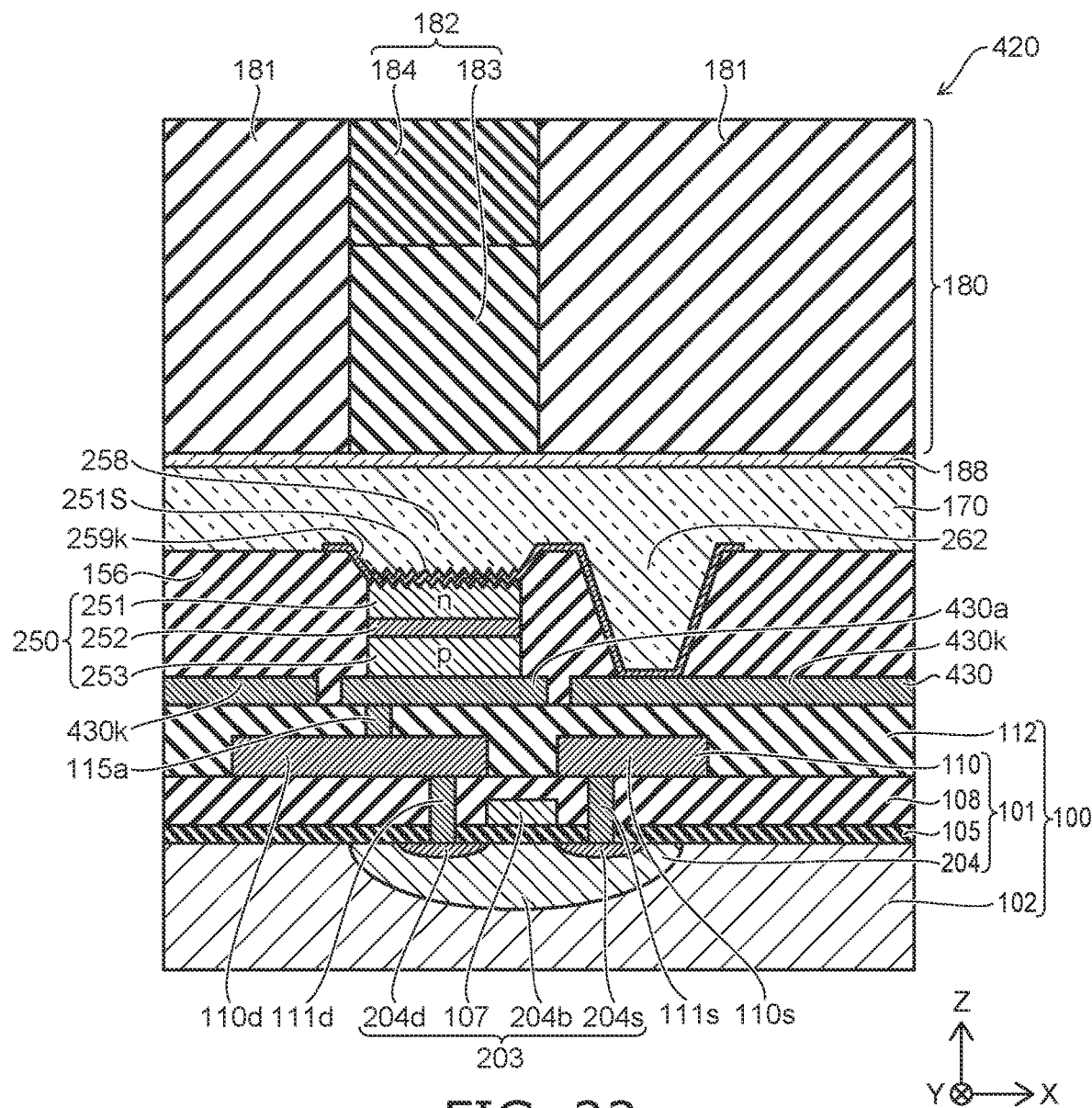
FIG. 22 is a schematic cross-sectional view illustrating a portion of an image display device according to a fourth embodiment.

FIG. 22 is a schematic cross-sectional view illustrating a portion of the image display device of the embodiment.

As shown in FIG. 22, a subpixel 420 of the image display device of the embodiment includes a wiring layer and the connection part 115a. A wiring layer 430 includes a plug 430a. In the example, the connection part 115a is located between the plug 430a and the wiring portion 110d. The plug 430a is connected to the wiring portion 110d via the connection part 115a. The light-emitting element 250 is located on the plug 430a, and the plug 430a and the p-type semiconductor layer 253 are electrically connected.

The plug 430a functions also as a light-shielding plate. In other words, the outer perimeter of the light-emitting element 250 that is projected onto the plug 430a when projected onto the XY plane is located within the outer perimeter of the plug 430a. Thereby, the downward light scattering of the light-emitting element 250 can be reflected, the luminous efficiency can be increased, the light that would reach the circuit elements can be suppressed, and malfunction of the circuit elements, etc., can be prevented.

The wiring layer 430 includes a wiring portion 430k, and a portion of the wiring portion 430k is exposed in the opening 262 that is formed in the second inter-layer insulating film 156. A portion of the wiring portion 430k that is exposed in the opening 262 is covered with the transparent electrode 259k. The wiring portion 430k is electrically connected to the light-emitting surface 251S by the transparent electrode 259k. As described below in the description of the manufacturing method, the wiring portion 430k is formed simultaneously with the plug 430a.

(Modification of Subpixel)

Figure 23:
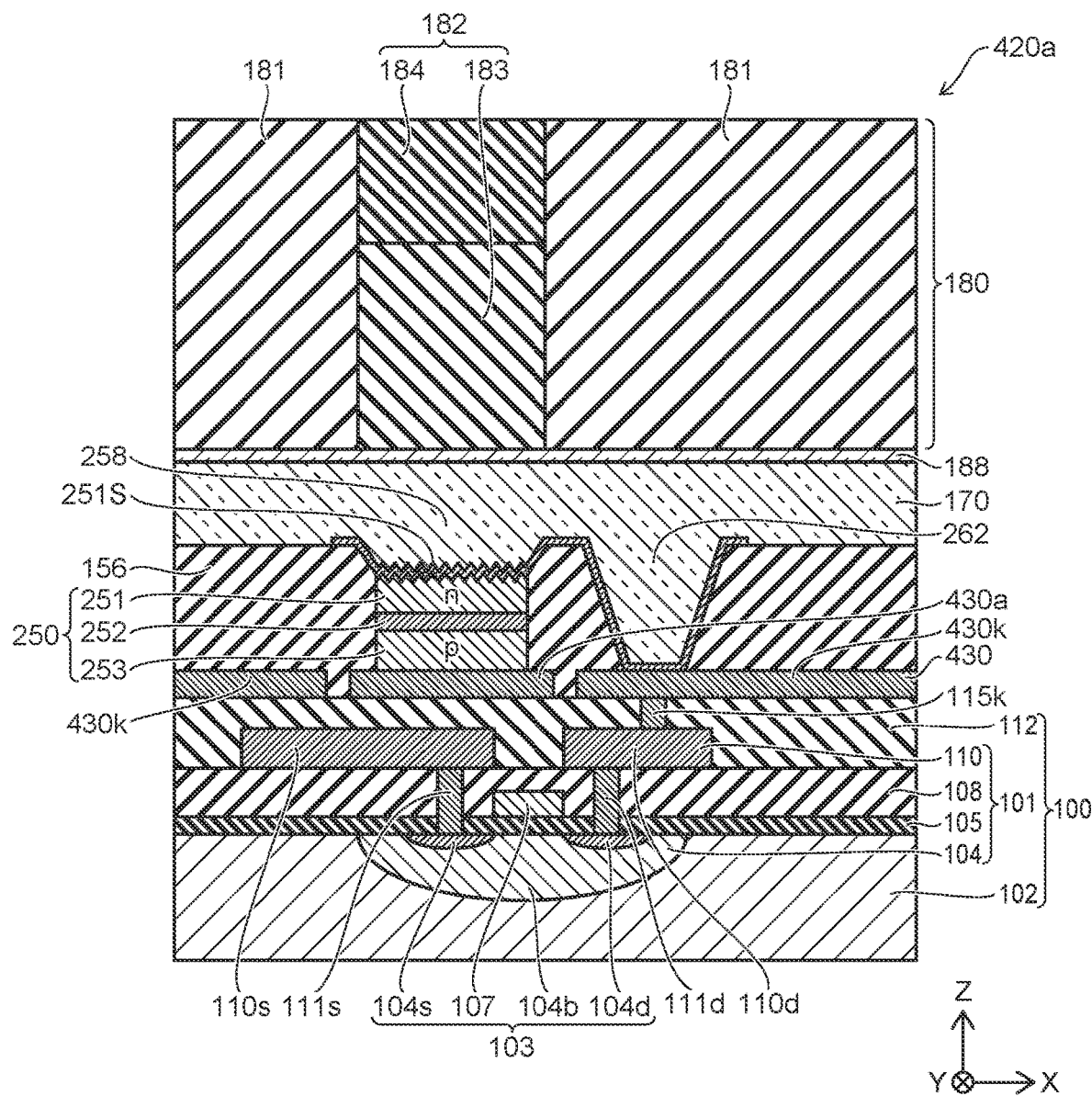
FIG. 23 is a schematic cross-sectional view illustrating a portion of an image display device according to a modification of the fourth embodiment.

FIG. 23 is a schematic cross-sectional view illustrating a portion of an image display device of a modification.

In the subpixel 420 described above, the p-type semiconductor layer 253 that is formed in the lower layer of the light-emitting element 250 is connected to the p-channel transistor 203 via the plug 430a and the connection part 115a. According to the modification, the wiring portion 430k that is exposed via the opening 262 is connected to the n-channel transistor 103 via a connection part. The light-emitting surface 251S is connected to the plug 430a that is exposed in the opening 262. The configuration of a subpixel 420a also is applicable as a modification of the subpixel 320 of the third embodiment described above.

As shown in FIG. 23, the subpixel 420a of the modification includes the wiring portion 430k and the connection part 115k. The wiring portion 430k is connected to the wiring portion 110d via the connection part 115k. The wiring layer 430 includes the plug 430a, and the plug 430a is connected to the power supply line 3 shown in FIG. 4. The drive circuit of FIG. 4 in which the light-emitting element 250 is driven by the n-channel transistor 103 is applied to the modification.

A manufacturing method of the embodiment will now be described.

FIGS. 24A to 25B are schematic cross-sectional views illustrating the method for manufacturing the image display device of the embodiment.

The semiconductor growth substrate 1294 in which the metal layer 1130 is formed is prepared, and is the same as that described above with reference to FIG. 17A.

Figure 24A:
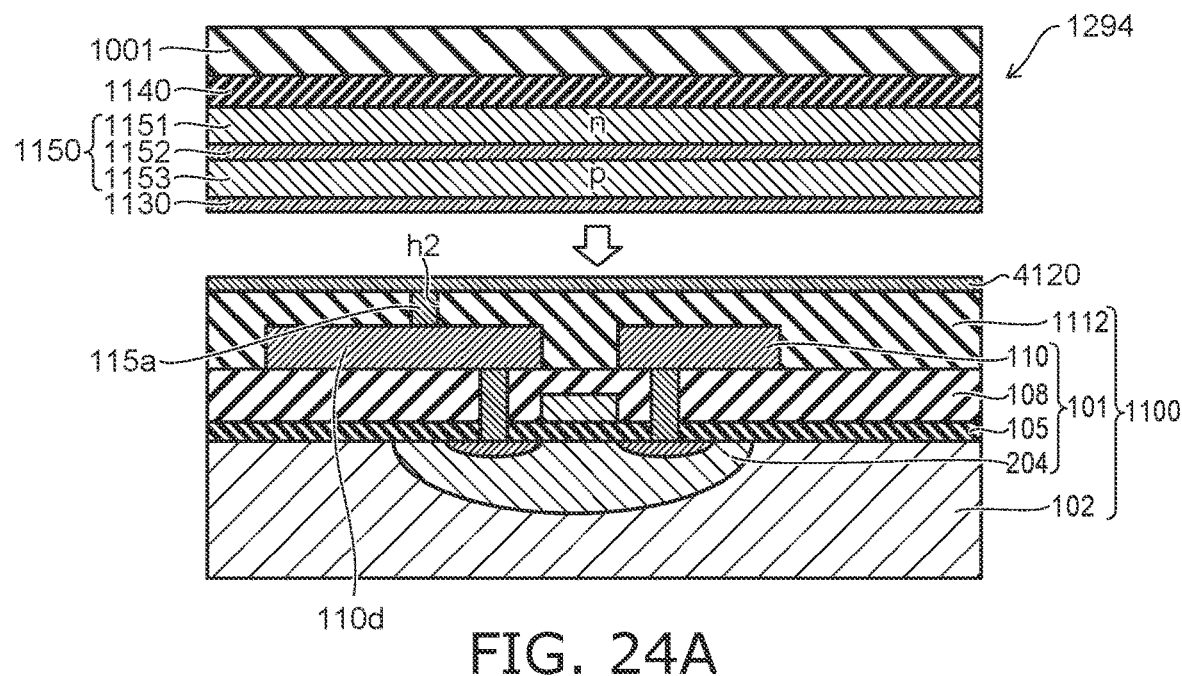
FIG. 24A is a schematic cross-sectional view illustrating a method for manufacturing the image display device of the fourth embodiment.

According to the embodiment as shown in FIG. 24A, a contact hole h2 that reaches the wiring portion 110d is formed in the first inter-layer insulating film 1112 of the circuit board 1100 that is prepared, and a metal layer 4120 is formed over the entire surface of the inter-layer insulating film 1112. The contact hole h2 also is filled when forming the metal layer 4120. Similarly to the other embodiments described above, for example, the metal layer 4120 is formed by sputtering. The metal layer 4120 includes, for example, Ti, Al, an alloy of Ti and Sn, etc. Cu, V, or the like, or a noble metal that has high light reflectivity such as Ag, Pt, etc., may be included.

After the metal layer 4120 is formed, the not-enclosed surface of the metal layer 4120 is polished and planarized using CMP, etc.

The connection part 115a is formed by filling the contact hole h2 with the material of the metal layer 4120. The metal layer 4120 is connected to the wiring portion 110d by the connection part 115a.

The semiconductor growth substrate 1294 in which the metal layer 1130 is formed is bonded via the metal layer 1130 to the circuit board 1100 in which the metal layer 4120 and the connection part 115a are formed.

Figure 24B:
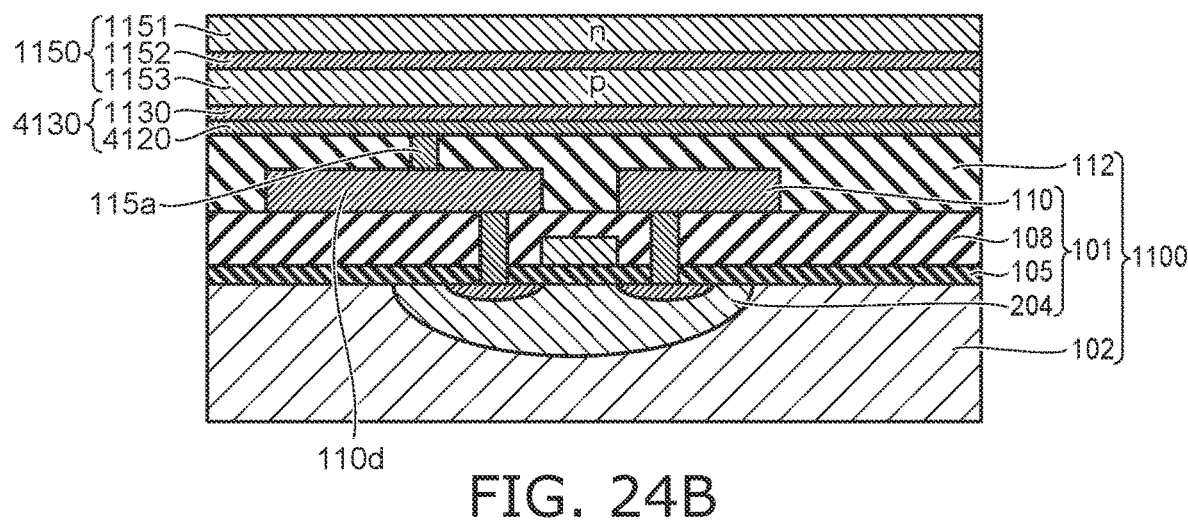
FIG. 24B is a schematic cross-sectional view illustrating the method for manufacturing the image display device of the fourth embodiment.

As shown in FIG. 24B, the crystal growth substrate 1001 is detached by laser irradiation or the like, or removed by wet etching.

Figure 25A:
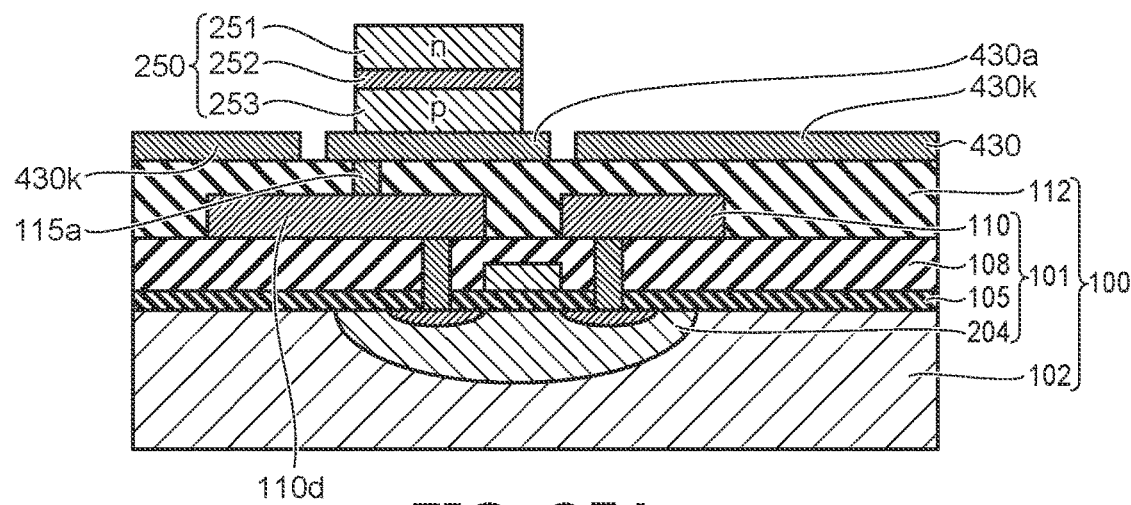
FIG. 25A is a schematic cross-sectional view illustrating the method for manufacturing the image display device of the fourth embodiment.

As shown in FIG. 25A, the wiring layer 430 that includes the plug 430a and the wiring portion 430k is formed by etching the bonded metal layers 1130 and 4120.

Figure 25B:
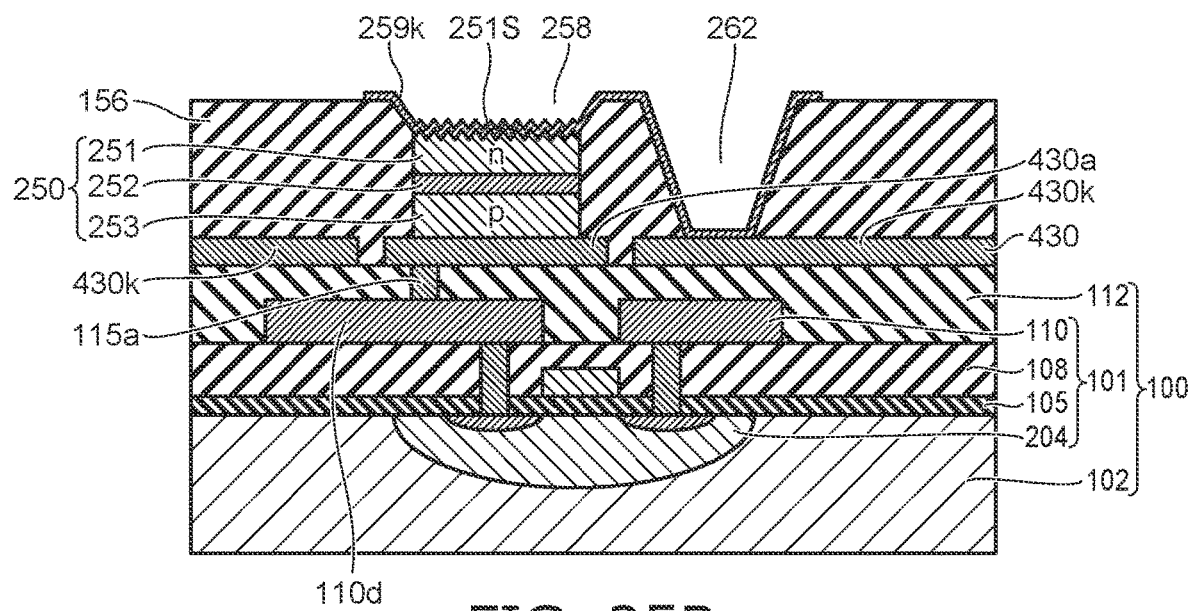
FIG. 25B is a schematic cross-sectional view illustrating the method for manufacturing the image display device of the fourth embodiment.

As shown in FIG. 25B, the wiring layer 430 that includes the plug 430a and the wiring portion 430k is buried in the second inter-layer insulating film 156 together with the light-emitting element 250. The inter-layer insulating film 156 is formed to cover the wiring layer 430, the side surface of the light-emitting element 250, and the first inter-layer insulating film 112.

In the inter-layer insulating film 156, the opening 258 is formed at a position that corresponds to the light-emitting surface 251S, and the opening 262 is formed at a position that corresponds to the wiring portion 430k. Subsequently, the transparent electrode 259k is formed on the wiring portion 430k and the light-emitting surface 251S that are exposed in the openings 258 and 262, and the light-emitting surface 251S and the wiring portion 430k are electrically connected.

The method for manufacturing the subpixel 420a also can be similarly performed to those described above.

Effects of the image display device of the embodiment will now be described.

In the image display device of the embodiment, the following effects are obtained in addition to the effects of the other embodiments described above. Namely, in the formation processes of the subpixels 420 and 420a, the metal layer is formed on the circuit board and polished before bonding the semiconductor layer 1150 and the circuit board 1100; therefore, the process of forming the planarization film can be omitted.

The plug 430a can function as a light-shielding plate because the outer perimeter of the light-emitting element 250 that is projected onto the plug 430a when projected onto the XY plane is located within the outer perimeter of the plug 430a. Therefore, a separate process of forming a wiring layer that includes a light-shielding plate can be omitted.

Fifth Embodiment

According to the embodiment, an image display device that has a higher luminous efficiency is realized by forming multiple light-emitting surfaces that correspond to multiple light-emitting elements in a single semiconductor layer that includes a light-emitting layer. In the description hereinbelow, the same components as those of the other embodiments described above are marked with the same reference numerals, and a detailed description is omitted as appropriate.

Figure 26:
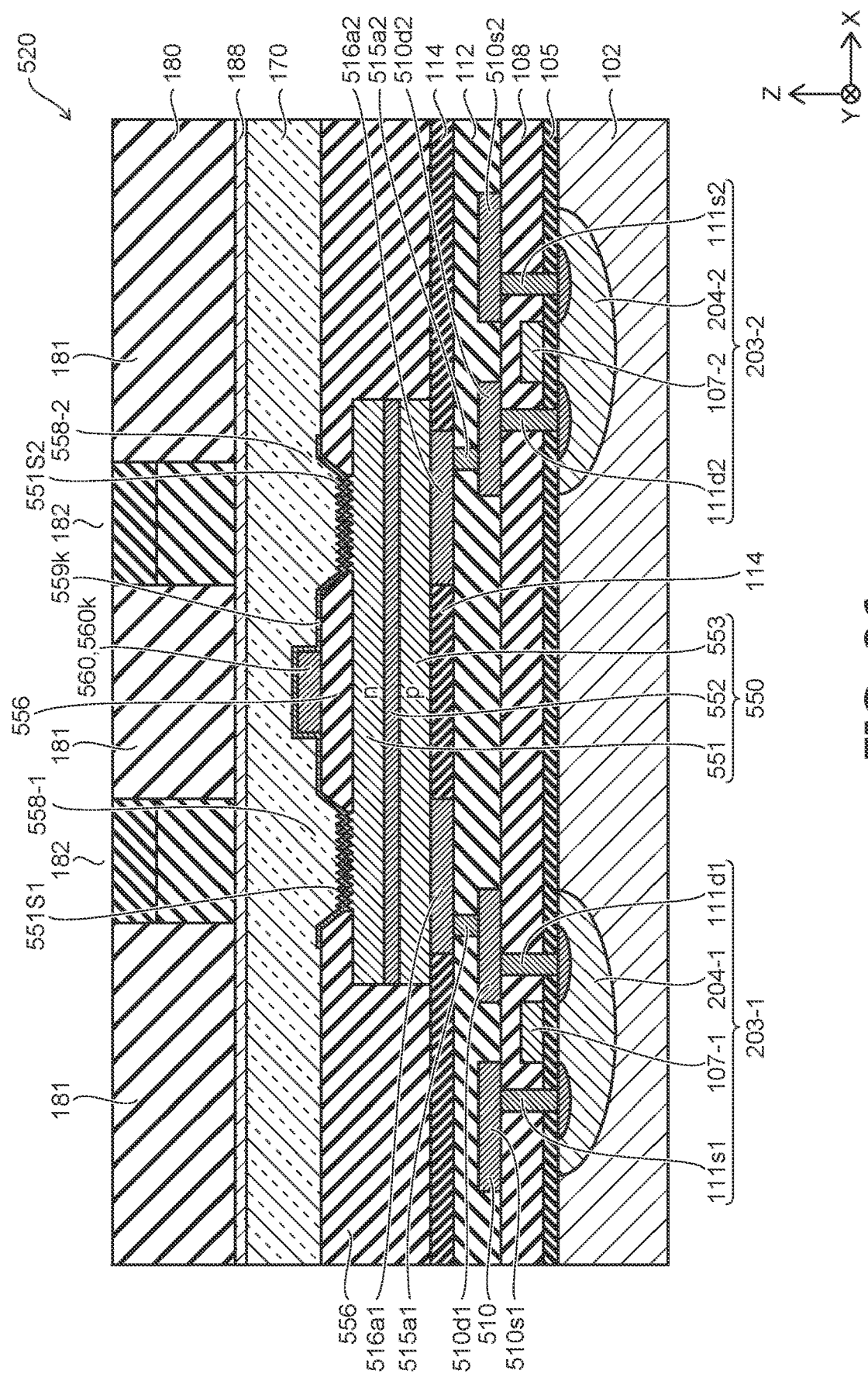
FIG. 26 is a schematic cross-sectional view illustrating a portion of an image display device according to a fifth embodiment.

FIG. 26 is a schematic cross-sectional view illustrating a portion of the image display device according to the embodiment.

As shown in FIG. 26, the image display device includes a subpixel group 520. The subpixel group 520 includes transistors 203-1 and 203-2, a first wiring layer 510, the first inter-layer insulating film 112, plugs 516a1 and 516a2, a semiconductor layer 550, a second inter-layer insulating film 556, and a second wiring layer 560.

According to the embodiment, by switching the p-channel transistors 203-1 and 203-2 on, holes are injected into the semiconductor layer 550 via the plugs 516a1 and 516a2, electrons are injected into the semiconductor layer 550 via the second wiring layer 560, and a light-emitting layer 552 is caused to emit light. For example, the circuit configuration shown in FIG. 16 is applied to the drive circuit. Using the other embodiments described above, the n-type semiconductor layer and the p-type semiconductor layer of the semiconductor layers may be vertically interchanged. A configuration in which the semiconductor layers are driven by n-channel transistors also can be used. In such a case, the circuit configuration of FIG. 4 is applied to the drive circuit.

The semiconductor layer 550 includes two light-emitting surfaces 551S1 and 551S2, and the subpixel group 520 substantially includes two subpixels. According to the embodiment, similarly to the other embodiments described above, a display region is formed by arranging the subpixel group 520 that substantially includes two subpixels in a lattice configuration.

The transistors 203-1 and 203-2 are formed respectively in element formation regions 204-1 and 204-2. In the example, the element formation regions 204-1 and 204-2 are n-type semiconductor layers, and p-type semiconductor layers are formed to be separated from each other in the n-type semiconductor layer. The n-type semiconductor layer includes a channel region, and the p-type semiconductor layers respectively include a source region and a drain region.

The insulating layer 105 is formed on the element formation regions 204-1 and 204-2, and gates 107-1 and 107-2 each are formed with the insulating layer 105 interposed. The gates 107-1 and 107-2 are gates of the transistors 203-1 and 203-2. The transistors 203-1 and 203-2 are p-channel transistors, e.g., p-channel MOSFETs.

The insulating film 108 covers the tops of the two transistors 203-1 and 203-2. The wiring layer 510 is formed on the insulating film 108.

Vias 111s1 and 111d1 are located respectively between the wiring layer 510 and the p-type semiconductor layers of the transistor 203-1. Vias 111s2 and 111d2 are located between the wiring layer 510 and the p-type semiconductor layers of the transistor 203-2.

The first wiring layer 510 includes wiring portions 510s1, 510s2, 510d1, and 510d2. The wiring portions 510s1 and 510s2 are electrically connected respectively to the p-type semiconductor layers that correspond to the source electrodes of the transistors 203-1 and 203-2 by the vias 111s1 and 111s2. The wiring portions 510s1 and 510s2 are connected to a power supply line that is not illustrated.

The wiring portions 510d1 and 510d2 are connected respectively to the p-type semiconductor layers that correspond to drain electrodes of the transistors 203-1 and 203-2 by the vias 111d1 and 111d2.

The first inter-layer insulating film 112 covers the transistors 203-1 and 203-2, the wiring layer 510, and the plugs 516a1 and 516a2.

The planarization film 114 is formed on the first inter-layer insulating film 112. The plugs 516a1 and 516a2 are buried in the planarization film 114, and the planarization film 114 and the plugs 516a1 and 516a2 include surfaces in the same plane when projected onto the XY plane. These surfaces are surfaces that are opposite to the surfaces at the inter-layer insulating film 112 side. That is, the planarization film 114 is located between the plugs 516a1 and 516a2.

A connection part 515a1 is located between the plug 516a1 and the wiring portion 510d1. The connection part 515a1 electrically connects the plug 516a1 and the wiring portion 510d1. A connection part 515a2 is located between the plug 516a2 and the wiring portion 510d2. The connection part 515a2 electrically connects the plug 516a2 and the wiring portion 510d2.

The semiconductor layer 550 is located on the planarization film 114 and the plugs 516a1 and 516a2.

The semiconductor layer 550 includes a p-type semiconductor layer 553, the light-emitting layer 552, and an n-type semiconductor layer 551. The p-type semiconductor layer 553, the light-emitting layer 552, and the n-type semiconductor layer 551 are stacked in the semiconductor layer 550 in this order from the inter-layer insulating film 112 side toward the side of the light-emitting surfaces 551S1 and 551S2. The plugs 516a1 and 516a2 are connected with the p-type semiconductor layer 553.

The second inter-layer insulating film (the second insulating film) 556 covers the tops of the planarization film 114, the plugs 516a1 and 516a2, and the semiconductor layer 550. The second inter-layer insulating film 556 covers a portion of the semiconductor layer 550. It is favorable for the second inter-layer insulating film 556 to cover the surface of the n-type semiconductor layer 551 other than the light-emitting surfaces (the exposed surfaces) 551S1 and 551S2 of the semiconductor layer 550. The inter-layer insulating film 556 covers the side surface of the semiconductor layer 550. It is favorable for the inter-layer insulating film 556 to be a white resin.

Openings 558-1 and 558-2 are formed in the parts of the semiconductor layer 550 that are not covered with the inter-layer insulating film 556. The openings 558-1 and 558-2 are formed at positions that correspond to the light-emitting surfaces 551S1 and 551S2. The light-emitting surfaces 551S1 and 551S2 are formed at positions that are separated on the n-type semiconductor layer 551. The light-emitting surface 551S1 is located at the position on the n-type semiconductor layer 551 that is more proximate to the transistor 203-1. The light-emitting surface 551S2 is located at the position on the n-type semiconductor layer 551 that is more proximate to the transistor 203-2.

The openings 558-1 and 558-2 have, for example, square or rectangular shapes when projected onto the XY plane. The shapes are not limited to rectangular and may be circular, elliptical, or polygonal such as hexagonal, etc. The light-emitting surfaces 551S1 and 551S2 also may be square, rectangular, another polygon, circular, etc., when projected onto the XY plane. The shapes of the light-emitting surfaces 551S1 and 551S2 may be similar to the shapes of the openings 558-1 and 558-2 or may be different shapes.

The second wiring layer 560 is located on the inter-layer insulating film 556. The wiring layer 560 includes a wiring portion 560k. The wiring portion 560k is located between the openings 558-1 and 558-2 on the second inter-layer insulating film 556 that is located on the n-type semiconductor layer 551. The wiring portion 560k is connected to a ground line that is not illustrated. In FIG. 26, the reference numeral of the wiring layer 560 also is shown as the reference numeral of the wiring portion 560k, meaning that the wiring layer 560 includes the wiring portion 560k. This is similar in FIG. 28 described below as well.

A transparent electrode 559k is provided onto the light-emitting surfaces 551S1 and 551S2 of the n-type semiconductor layer 551 that is exposed in the openings 558-1 and 558-2. The transparent electrode 559k is located on the wiring portion 560k. The transparent electrode 559k is located between the light-emitting surface 551S1 and the wiring portion 560k, and is located between the light-emitting surface 551S2 and the wiring portion 560k. The transparent electrode 559k electrically connects the wiring portion 560k and the light-emitting surfaces 551S1 and 551S2.

As described above, the transparent electrode 559k is connected to the light-emitting surfaces 551S1 and 551S2 that are exposed in the openings 558-1 and 558-2. Therefore, electrons that are supplied from the transparent electrode 559k are supplied to the n-type semiconductor layer 551 from the exposed light-emitting surfaces 551S1 and 551S2. On the other hand, holes are supplied to the p-type semiconductor layer 553 via the plugs 516a1 and 516a2.

The transistors 203-1 and 203-2 are drive transistors of adjacent subpixels, and are sequentially driven. Accordingly, holes that are supplied from one of the two transistors 203-1 and 203-2 are injected into the light-emitting layer 552, electrons that are supplied from the wiring portion 560k are injected into the light-emitting layer 552, and the light-emitting layer 552 emits light.

The opening 558-1 and the light-emitting surface 551S1 are located at the position at which the n-type semiconductor layer 551 is more proximate to the transistor 203-1. Therefore, when the transistor 203-1 is switched on, the holes are injected via the wiring portion 510d1, the connection part 515a1, and the plug 516a1, and the light-emitting surface 551S1 emits light.

On the other hand, the opening 558-2 and the light-emitting surface 551S2 are located at the position at which the n-type semiconductor layer 551 is more proximate to the transistor 203-2. Therefore, when the transistor 203-2 is switched on, the light-emitting surface 551S2 emits light via the wiring portion 510d2, the connection part 515a2, and the plug 516a2.

A method for manufacturing the image display device of the embodiment will now be described.

FIGS. 27A to 28B are schematic cross-sectional views illustrating the method for manufacturing the image display device of the embodiment.

Figure 27A:
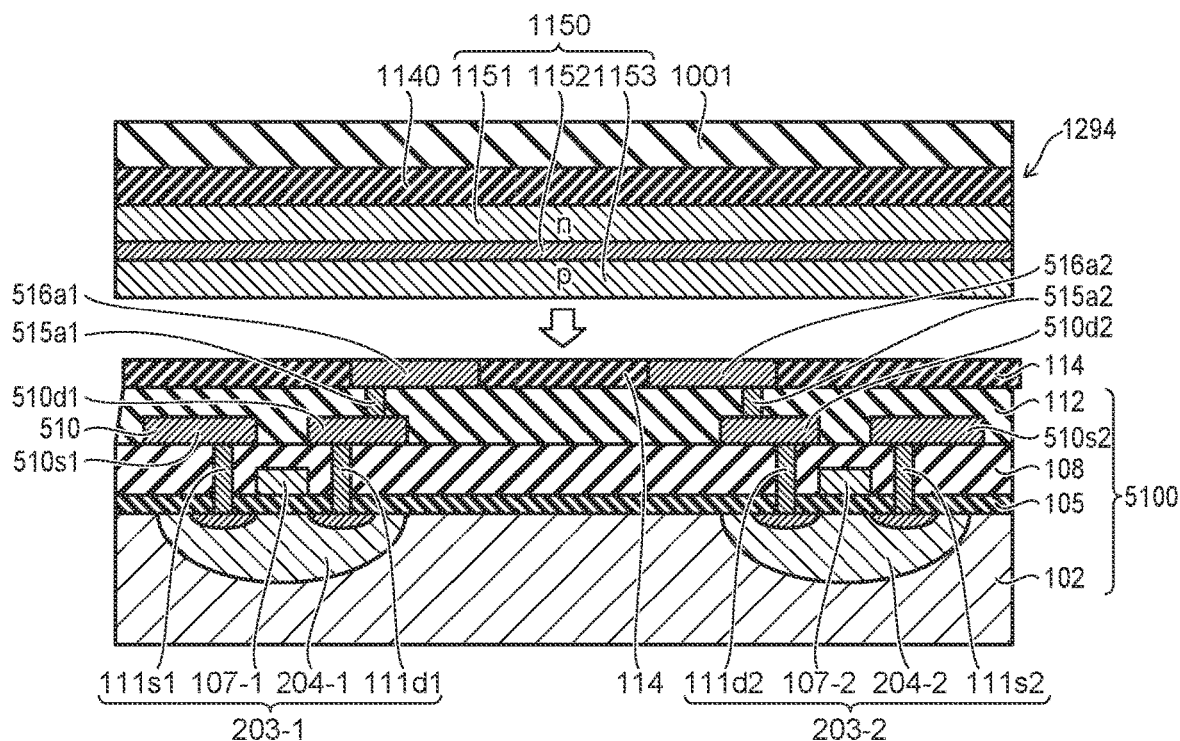
FIG. 27A is a schematic cross-sectional view illustrating a method for manufacturing the image display device of the fifth embodiment.

As shown in FIG. 27A, the semiconductor growth substrate 1294 that includes the crystal growth substrate 1001 on which the semiconductor layer 1150 is epitaxially grown is bonded by wafer bonding to a circuit board 5100 that is prepared, in which the plugs 516*a*1 and 516*a*2 and the connection parts 515*a*1 and 515*a*2 are formed.

The processes described in reference to FIGS. 8A to 9C described above can be used as the procedure of forming the plugs 516*a*1 and 516*a*2 and the connection parts 515*a*1 and 515*a*2 in the circuit board 5100. The procedure described in reference to FIG. 24A described above may be used as the formation process of the plugs 516*a*1 and 516*a*2. For the circuit board 5100, the configuration of the circuit is different from those of the other embodiments described above, but almost all of the other parts are similar to the structures that are already described. Hereinbelow, only the reference numerals are replaced, and a detailed description is omitted as appropriate.

Figure 27B:
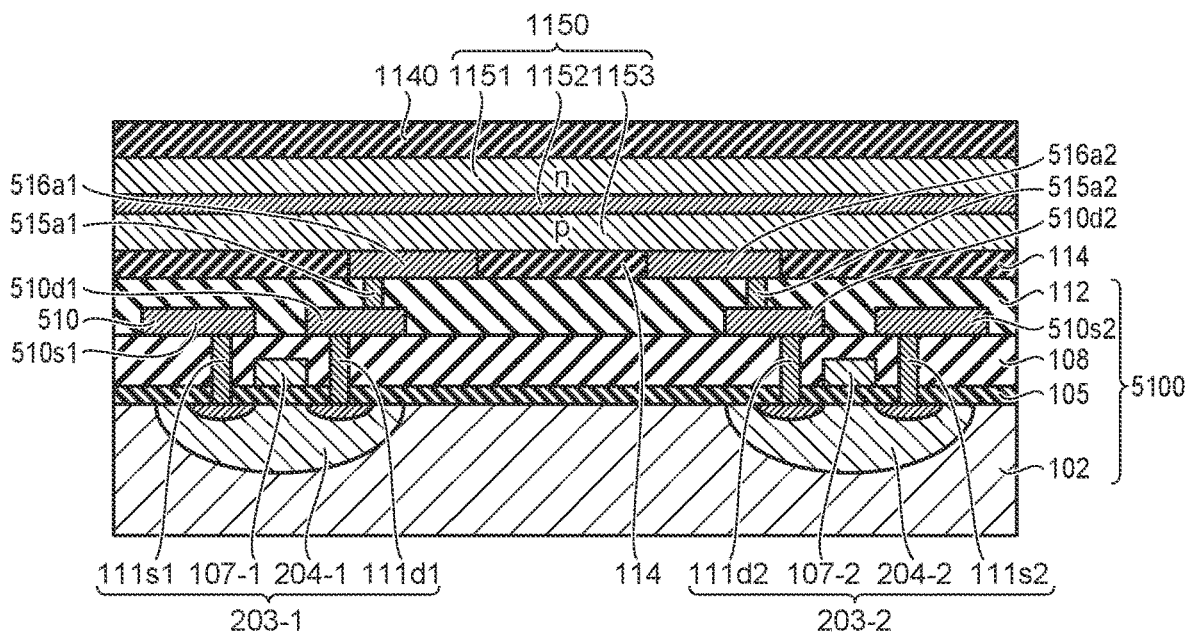
FIG. 27B is a schematic cross-sectional view illustrating the method for manufacturing the image display device of the fifth embodiment.

As shown in FIG. 27B, the semiconductor layer 1150 is bonded to the circuit board 5100 in which plugs 516*a* and 516*a*2 are formed; subsequently, the crystal growth substrate 1001 is removed.

Figure 28A:
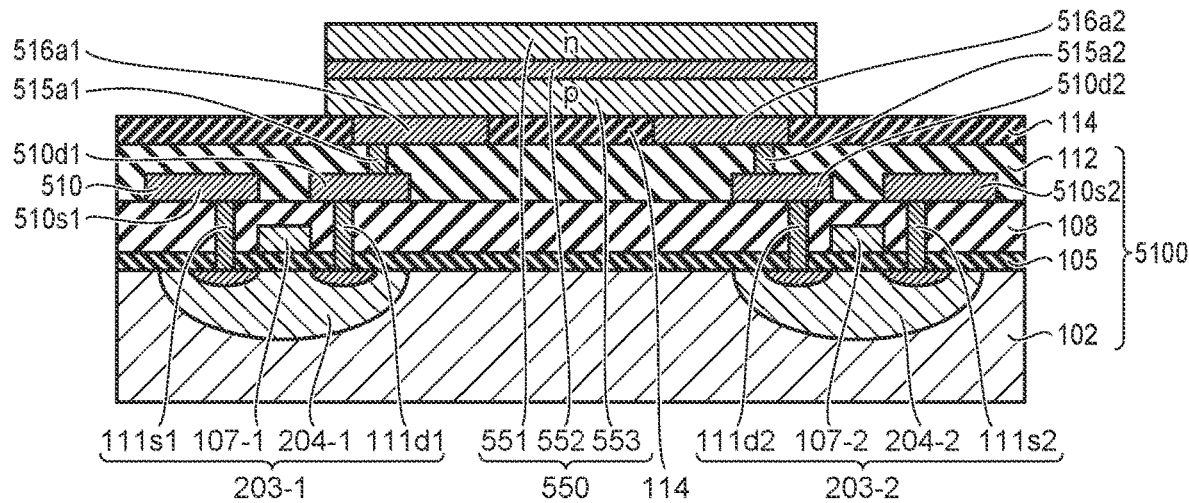
FIG. 28A is a schematic cross-sectional view illustrating the method for manufacturing the image display device of the fifth embodiment.

As shown in FIG. 28A, the semiconductor layer 550 is formed by etching the semiconductor layer 1150.

Figure 28B:
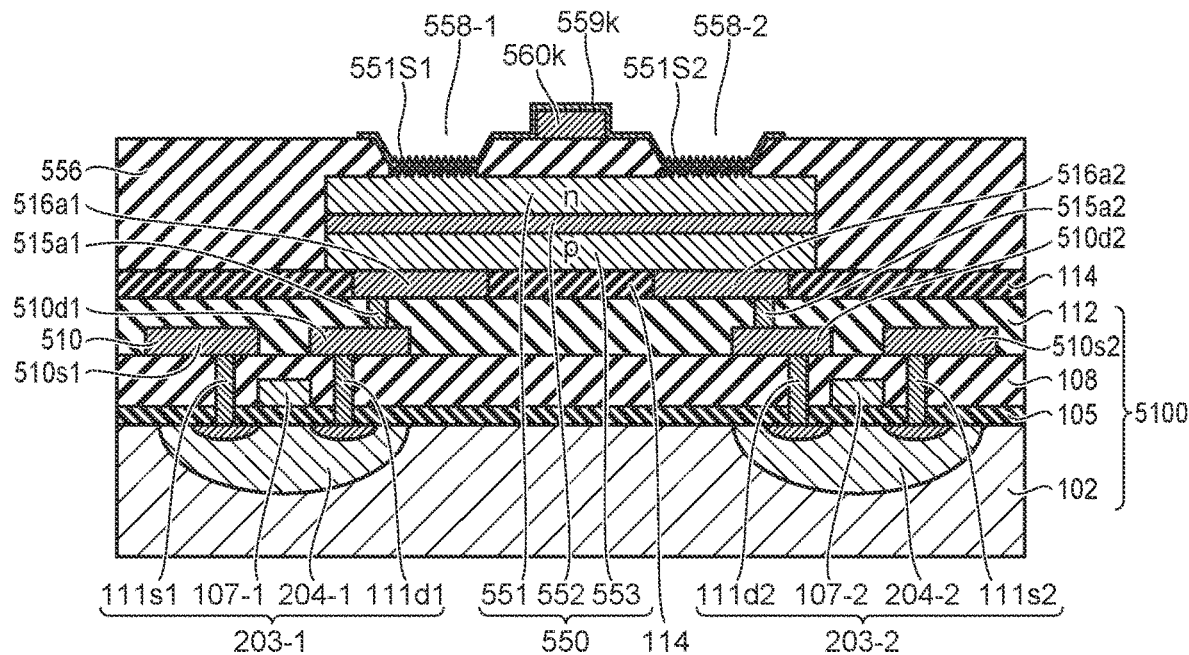
FIG. 28B is a schematic cross-sectional view illustrating the method for manufacturing the image display device of the fifth embodiment.

As shown in FIG. 28B, an inter-layer insulating film that covers the planarization film 114, the plugs 516*a*1 and 516*a*2, and the semiconductor layer 550 is formed.

The wiring layer 560 is formed on the inter-layer insulating film 556, and the wiring portion 560*k*, etc., are formed by etching.

The openings 558-1 and 558-2 are formed by removing the inter-layer insulating film 556 at positions that correspond respectively to the light-emitting surfaces 551S1 and 551S2.

551S1 and 551S2 that are exposed by the openings 558-1 and 558-2 each are roughened. Subsequently, the transparent electrode 559*k* is formed to electrically connect the wiring portion 560*k* and the light-emitting surfaces 551S1 and 551S2.

Thus, the subpixel group 520 that includes the semiconductor layer 550 that shares the two light-emitting surfaces 551S1 and 551S2 is formed.

Although two light-emitting surfaces 551S1 and 551S2 are provided in one semiconductor layer 550 according to the example, the number of light-emitting surfaces is not limited to two; it is also possible to provide three or more light-emitting surfaces in one semiconductor layer 550. As an example, one column or two columns of subpixels may be realized using a single semiconductor layer 550. As described below, the recombination current that does not contribute to the light emission per light-emitting surface can be reduced thereby, and the effect of realizing a finer light-emitting element can be increased.

(Modification)

Figure 29:
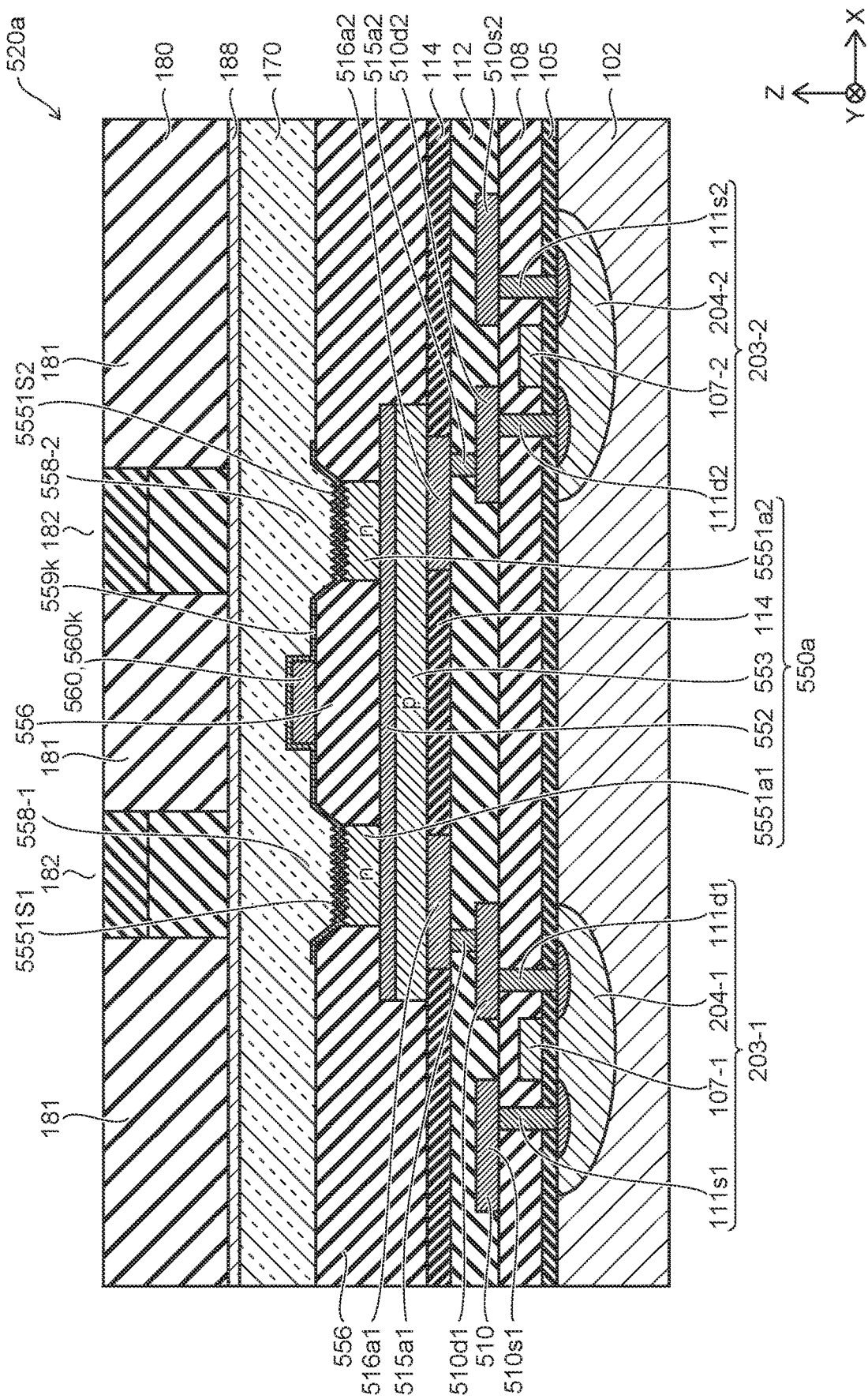
FIG. 29 is a schematic cross-sectional view illustrating a portion of an image display device according to a modification of the fifth embodiment.

FIG. 29 is a schematic cross-sectional view illustrating a portion of an image display device according to a modification of the embodiment.

The modification differs from the fifth embodiment described above in that two n-type semiconductor layers 5551*a*1 and 5551*a*2 are located on the light-emitting layer 552. Otherwise, the modification is the same as the fifth embodiment; the same components are marked with the same reference numerals, and a detailed description is omitted as appropriate.

As shown in FIG. 29, the image display device of the modification includes a subpixel group 520*a*. The subpixel group 520*a* includes a semiconductor layer 550*a*. The semiconductor layer 550*a* includes the p-type semiconductor layer 553, the light-emitting layer 552, and the n-type semiconductor layers 5551*a*1 and 5551*a*2. The p-type semiconductor layer 553, the light-emitting layer 552, and the n-type semiconductor layers 5551*a*1 and 5551*a*2 are stacked in this order from the inter-layer insulating film 556 toward the side of light-emitting surfaces 5551S1 and 5551S2.

The n-type semiconductor layers 5551*a*1 and 5551*a*2 are arranged to be separated along the X-axis direction on the light-emitting layer 552. The inter-layer insulating film 556 is located between the n-type semiconductor layers 5551*a*1 and 5551*a*2, and the n-type semiconductor layers 5551*a*1 and 5551*a*2 are divided by the inter-layer insulating film 556.

The n-type semiconductor layers 5551*a*1 and 5551*a*2 have substantially the same shape when projected onto the XY plane; the shape is a substantially square or rectangular shape, and may be another polygonal shape, circular, etc.

The n-type semiconductor layers 5551*a*1 and 5551*a*2 respectively include the light-emitting surfaces 5551S1 and 5551S2. The light-emitting surfaces 5551S1 and 5551S2 are surfaces of the n-type semiconductor layers 5551*a*1 and 5551*a*2 that are exposed respectively by the openings 558-1 and 558-2.

Similarly to the shapes of the light-emitting surfaces of the fifth embodiment, the shapes of the light-emitting surfaces 5551S1 and 5551S2 when projected onto the XY plane are substantially the same shape, and are a shape such as substantially square, etc. The shapes of the light-emitting surfaces 5551S1 and 5551S2 are not limited to rectangular such as that of the embodiment, and may be circular, elliptical, or polygonal such as hexagonal, etc. The shapes of the light-emitting surfaces 5551S1 and 5551S2 may be similar to the shapes of the openings 558-1 and 558-2, or may be different shapes.

The transparent electrode 559*k* is located on the light-emitting surfaces 5551S1 and 5551S2. The transparent electrode 559*k* also is located on the wiring portion 560*k*. The transparent electrode 559*k* is located between the wiring portion 560*k* and the light-emitting surface 5551S1, and is located between the wiring portion 560*k* and the light-emitting surface 5551S2. The transparent electrode 559*k* electrically connects the wiring portion 560*k* and the light-emitting surfaces 5551S1 and 5551S2.

Figure 30A:
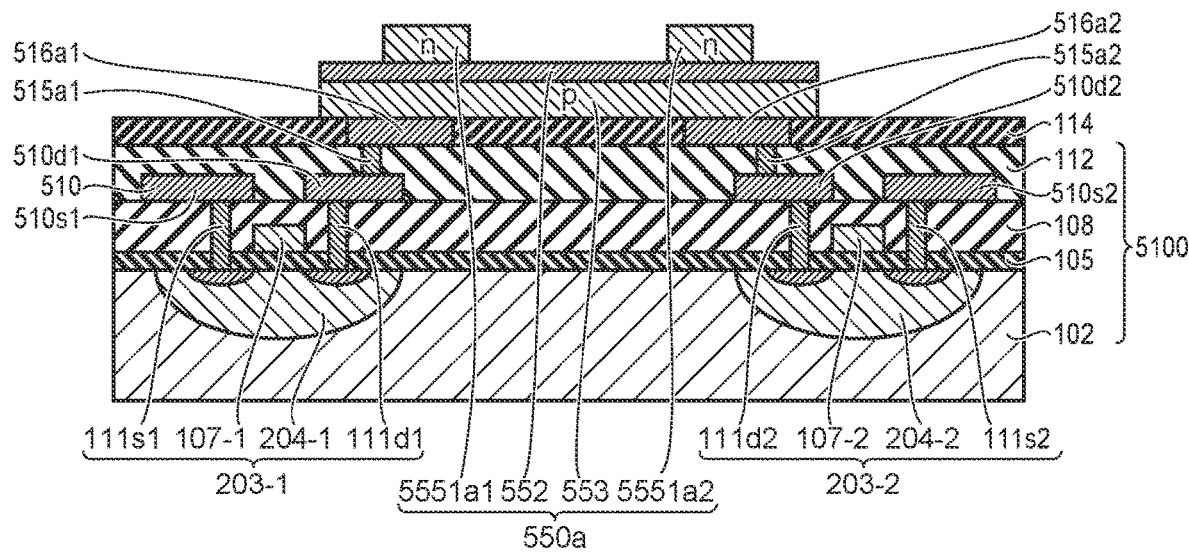
FIG. 30A is a schematic cross-sectional view illustrating a method for manufacturing the image display device of the modification of the fifth embodiment.
Figure 30B:
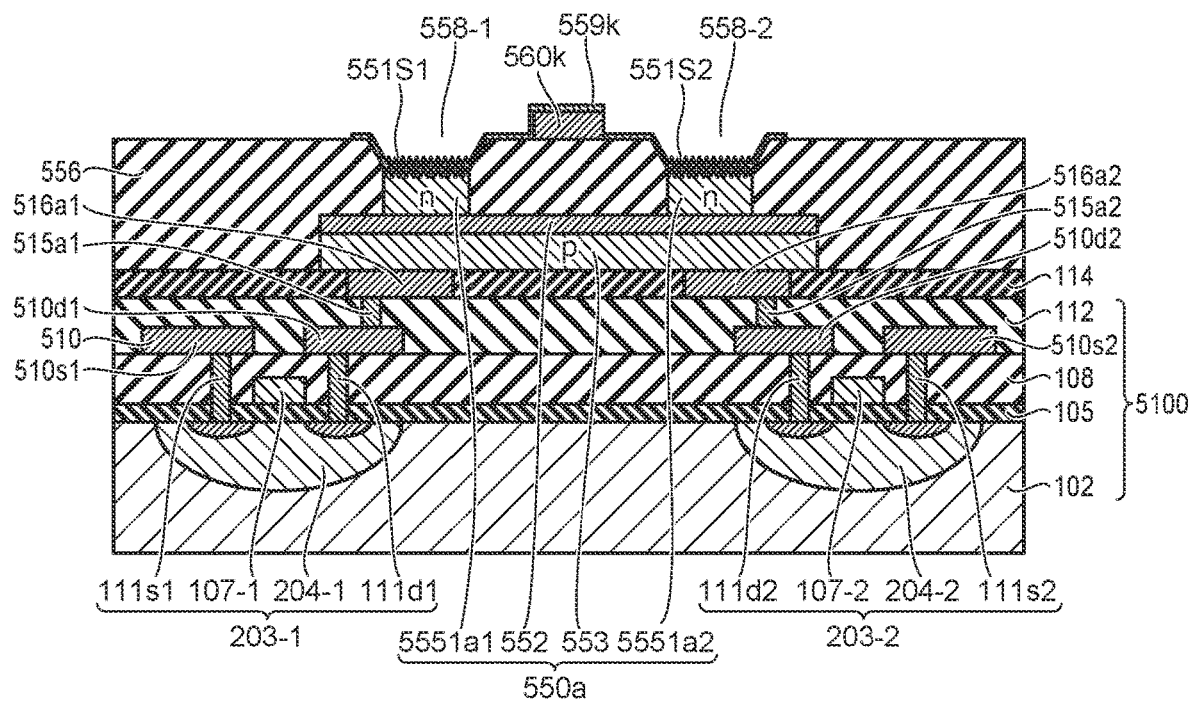
FIG. 30B is a schematic cross-sectional view illustrating the method for manufacturing the image display device of the modification of the fifth embodiment.

FIGS. 30A and 30B are schematic cross-sectional views illustrating a method for manufacturing the image display device of the modification.

According to the modification, processes similar to the processes described in reference to FIGS. 27A and 27B of the fifth embodiment are applied up to the bonding to the semiconductor layer 1150 of the circuit board 5100 in which the plugs 516*a*1 and 516*a*2 and the connection parts 515*a*1 and 515*a*2 are formed. The subsequent processes will now be described.

According to the modification as shown in FIG. 30A, the light-emitting layer 552 and the p-type semiconductor layer 553 are formed by etching the p-type semiconductor layer 1153, the light-emitting layer 1152, and the n-type semiconductor layer 1151 of FIG. 27B; subsequently, etching is performed further to form the two n-type semiconductor layers 5551*a*1 and 5551*a*2.

The n-type semiconductor layers 5551*a*1 and 5551*a*2 may be formed by performing even deeper etching. For example, etching for forming the n-type semiconductor layers 5551*a*1 and 5551*a*2 may be performed to a depth that reaches the interior of the light-emitting layer 552 and the interior of the p-type semiconductor layer 553. Thus, when deeply etching the n-type semiconductor layer, it is desirable for the etching position of the n-type semiconductor layer 1151 to be separated from the outer perimeters of the light-emitting surfaces 5551S1 and 5551S2 of the n-type semiconductor layer described below by not less than 1 µm. The recombination current can be suppressed by setting the etching position to be separated from the outer perimeters of the light-emitting surfaces 5551S1 and 5551S2.

As shown in FIG. 30B, an inter-layer insulating film that covers the planarization film 114, the plugs 516a1 and 516a2, and the semiconductor layer 550a is formed. The wiring layer 560 is formed on the inter-layer insulating film 556, and the wiring portion 560k, etc., are formed by etching.

The openings 558-1 and 558-2 are formed respectively at positions of the inter-layer insulating film that correspond to the light-emitting surfaces 5551S1 and 5551S2. The light-emitting surfaces 5551S1 and 5551S2 of the n-type semiconductor layers that are exposed by the openings 558-1 and 558-2 each are roughened. Subsequently, the transparent electrode 559k is formed.

Thus, the subpixel group 520a that includes the two light-emitting surfaces 5551S1 and 5551S2 is formed.

According to the modification as well, similarly to the fifth embodiment, the number of light-emitting surfaces is not limited to two; three or more light-emitting surfaces may be provided in one semiconductor layer 550a.

Effects of the image display device of the embodiment will now be described.

Figure 31:
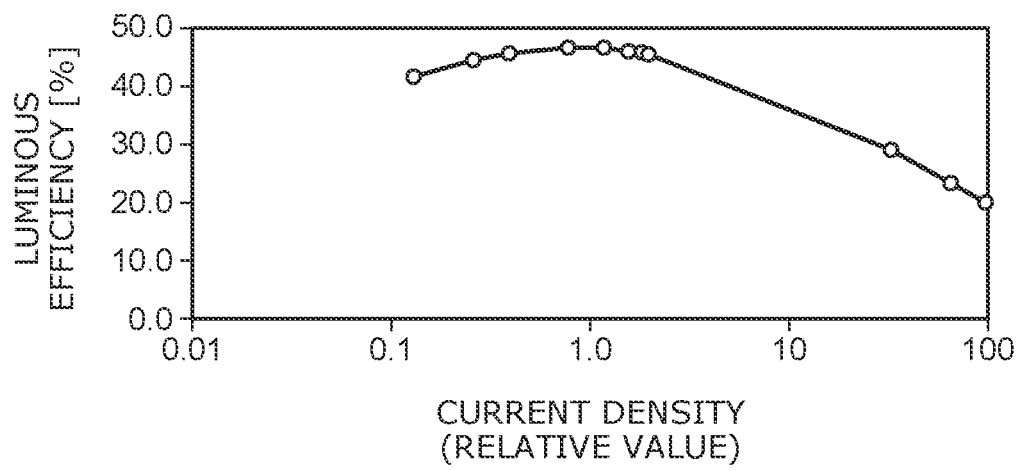
FIG. 31 is a graph illustrating a characteristic of a pixel LED element.

FIG. 31 is a graph illustrating a characteristic of a pixel LED element.

The vertical axis of FIG. 31 illustrates the luminous efficiency (%). The horizontal axis illustrates the current density of the current caused to flow in the pixel LED element as a relative value.

As shown in FIG. 31, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency is a maximum exists in the pixel LED element.

It may be expected that a highly efficient image display device is realized by suppressing the current density so that a sufficient luminance is obtained from the light-emitting element. However, it is shown by FIG. 31 that there is a tendency for the current density to decrease and for the luminous efficiency to decrease for a low current density.

As described in the first to fourth embodiments, the light-emitting element is formed by individually separating by etching or the like of all of the layers of the semiconductor layer 1150 that includes the light-emitting layer. At this time, the junction surface between the light-emitting layer and the n-type semiconductor layer is exposed at the end portion. Similarly, the junction surface between the light-emitting layer and the p-type semiconductor layer is exposed at the end portion.

When such an end portion exists, electrons and holes recombine at the end portion. On the other hand, such recombination does not contribute to the light emission. The recombination at the end portion occurs substantially regardless of the current caused to flow in the light-emitting element. It is considered that the recombination occurs according to the length of the junction surface that contributes to the light emission of the end portion.

When two light-emitting elements that have cubic shapes of the same dimensions emit light, end portions are formed at four sides for each light-emitting element; therefore, recombination may occur at a total of eight end portions.

Conversely, according to the embodiment, there are four end portions in the semiconductor layers 550 and 550a that include two light-emitting surfaces. The region between the openings 558-1 and 558-2 substantially does not contribute to the light emission because few electrons and holes are injected into this region; therefore, the end portions that contribute to the light emission can be considered to be six. Thus, according to the embodiment, by substantially reducing the number of end portions of the semiconductor layers, the recombination that does not contribute to the light emission can be reduced, and the reduction of the recombination current makes it possible to reduce the drive current.

When shortening the distance between the subpixels for higher definition or the like, when the current density is relatively high, etc., the distance between light-emitting surfaces 553S1 and 553S2 becomes short in the subpixel group 520 of the fifth embodiment. In such a case, when the p-type semiconductor layer 553 is shared, there is a risk that a portion of the electrons injected into the adjacent light-emitting surface side may shunt, and the light-emitting surface at the side that is not driven may have a micro light emission. According to the modification, the p-type semiconductor layer is divided for each light-emitting surface; therefore, the micro light emission of the light-emitting surface at the side that is not driven can be reduced.

According to the embodiment, the semiconductor layers that include the light-emitting layer are favorable from the perspective of increasing the luminous efficiency by roughening the exposed surface of the p-type semiconductor layer because the n-type semiconductor layer, the light-emitting layer, and the p-type semiconductor layer are stacked in this order from the first inter-layer insulating film 112 side. Similarly to the other embodiments described above, the p-type semiconductor layer, the light-emitting layer, and the n-type semiconductor layer may be stacked in this order by replacing the stacking order of the p-type semiconductor layer and the n-type semiconductor layer.

Sixth Embodiment

The image display device described above can be used as an image display module having the appropriate number of pixels in, for example, a computer display, a television, a portable terminal such as a smartphone, car navigation, etc.

Figure 32:
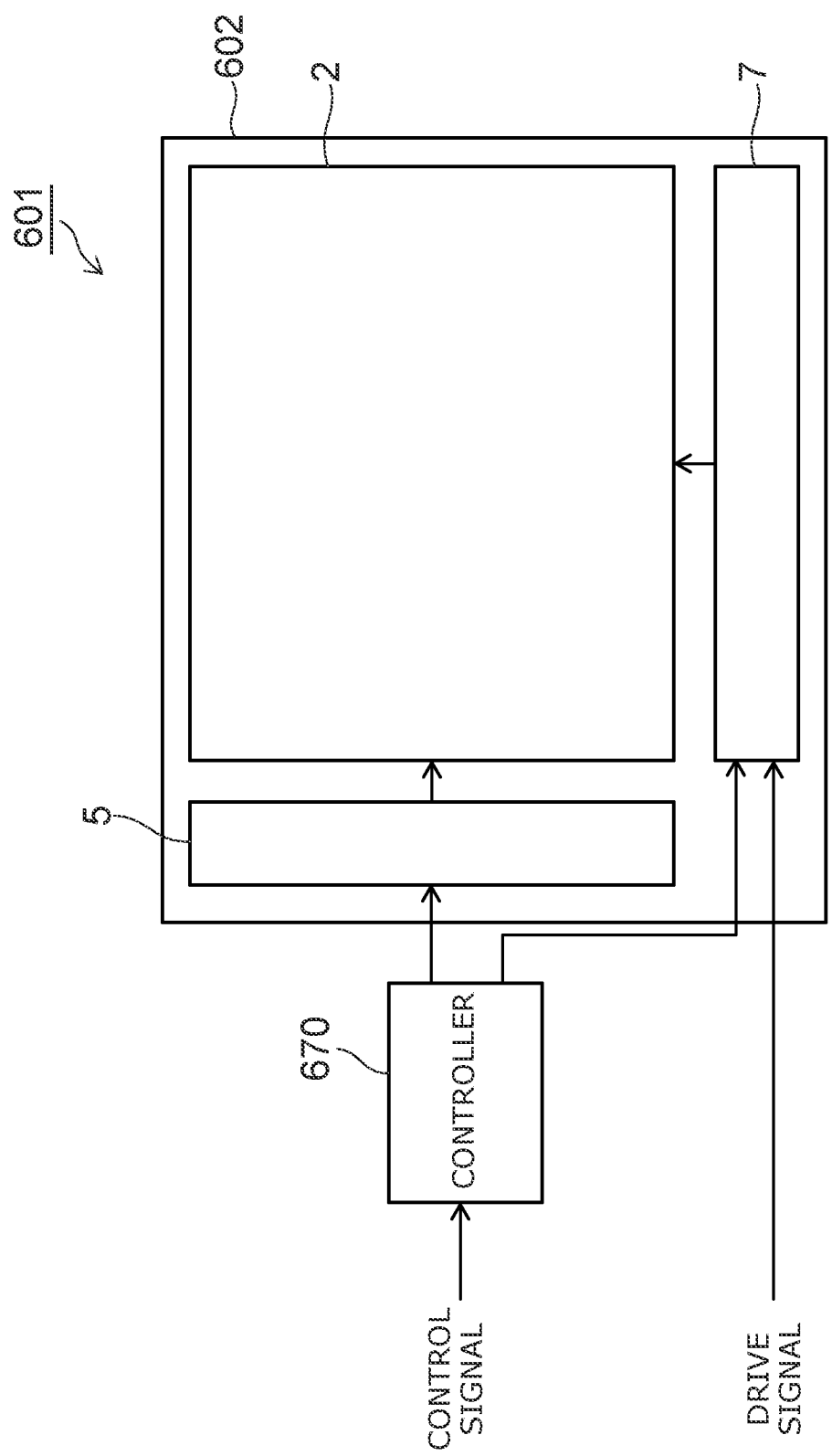
FIG. 32 is a block diagram illustrating an image display device according to a sixth embodiment.

FIG. 32 is a block diagram illustrating an image display device according to the embodiment.

Main parts of the configuration of a computer display are shown in FIG. 32.

As shown in FIG. 32, the image display device 601 includes an image display module 602. The image display module 602 is, for example, an image display device that includes the configuration of the first embodiment described above. The image display module 602 includes the display region 2 in which the subpixels 20 are arranged, the row selection circuit 5, and the signal voltage output circuit 7.

The image display device 601 further includes a controller 670. The controller 670 receives input of control signals that are separated and generated by not-illustrated interface circuitry, and controls the driving and the drive sequence of the subpixels in the row selection circuit 5 and the signal voltage output circuit 7.

(Modification)

Figure 33:
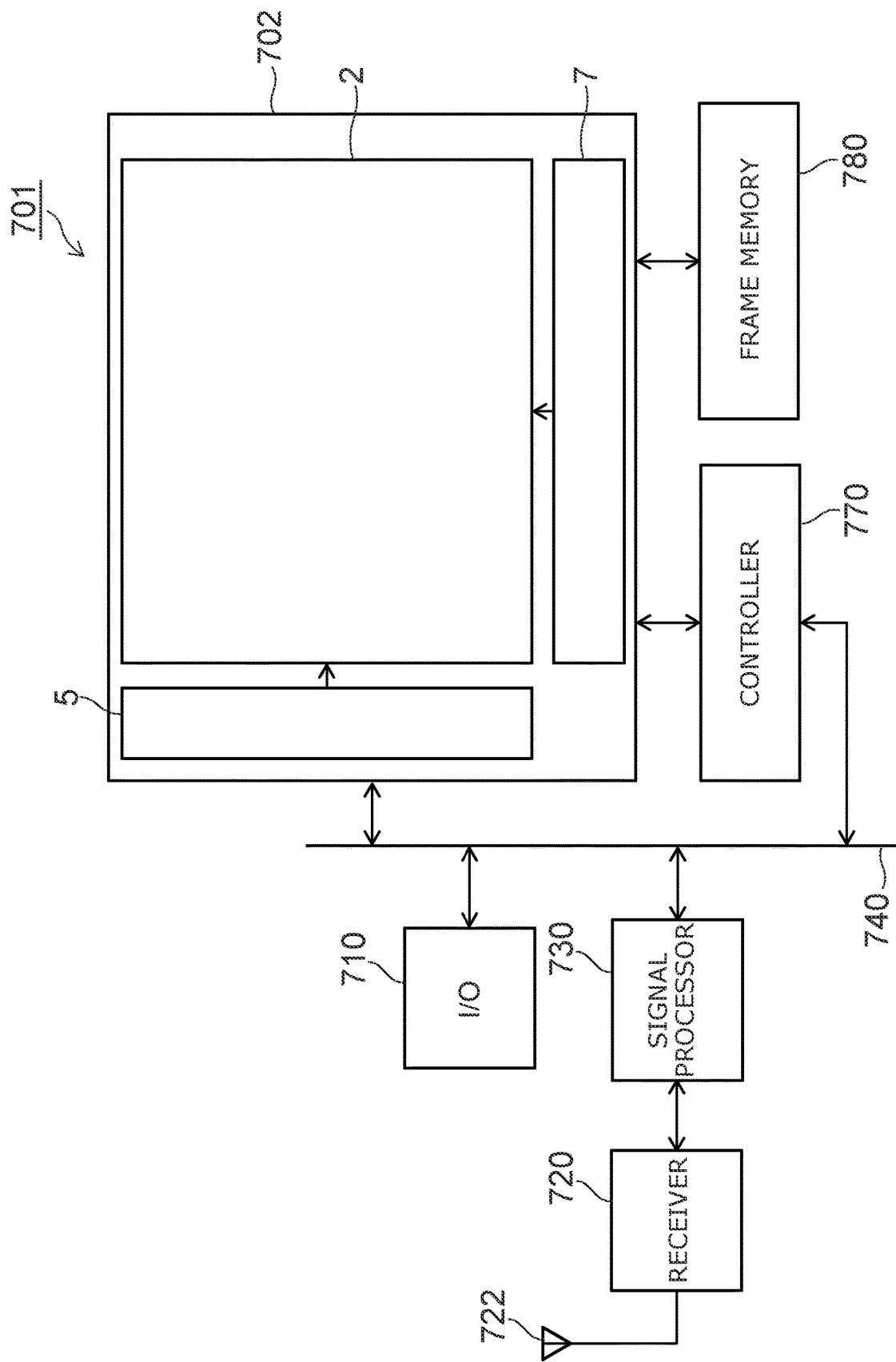
FIG. 33 is a block diagram illustrating an image display device according to a modification of the sixth embodiment.

FIG. 33 is a block diagram illustrating an image display device of the modification.

The configuration of a high-definition thin television is shown in FIG. 33.

As shown in FIG. 33, the image display device 701 includes an image display module 702. The image display module 702 is, for example, the image display device 1 that includes the configuration of the first embodiment described above. The image display device 701 includes a controller 770 and a frame memory 780. Based on a control signal supplied by a bus 740, the controller 770 controls the drive sequence of the subpixels of the display region 2. The frame memory 780 stores one frame of display data and is used for smooth processing such as video image reproduction, etc.

The image display device 701 includes an I/O circuit 710. The I/O circuit 710 provides interface circuitry and the like for connecting with external terminals, devices, etc. The I/O circuit 710 includes, for example, a USB interface that connects an external hard disk device or the like, an audio interface, etc.

The image display device 701 includes a receiver 720 and a signal processor 730. An antenna 722 is connected to the receiver 720, and the necessary signal is separated and generated from the radio wave received by the antenna 722. The signal processor 730 includes a DSP (Digital Signal Processor), a CPU (Central Processing Unit), etc., and the signal that is separated and generated by the receiver 720 is separated and generated into image data, audio data, etc., by the signal processor 730.

Other image display devices also can be made by using the receiver 720 and the signal processor 730 as a high frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module of the embodiment is not limited to the configuration of the image display device of the first embodiment; modifications of the first embodiment or other embodiments may be used.

Figure 34:
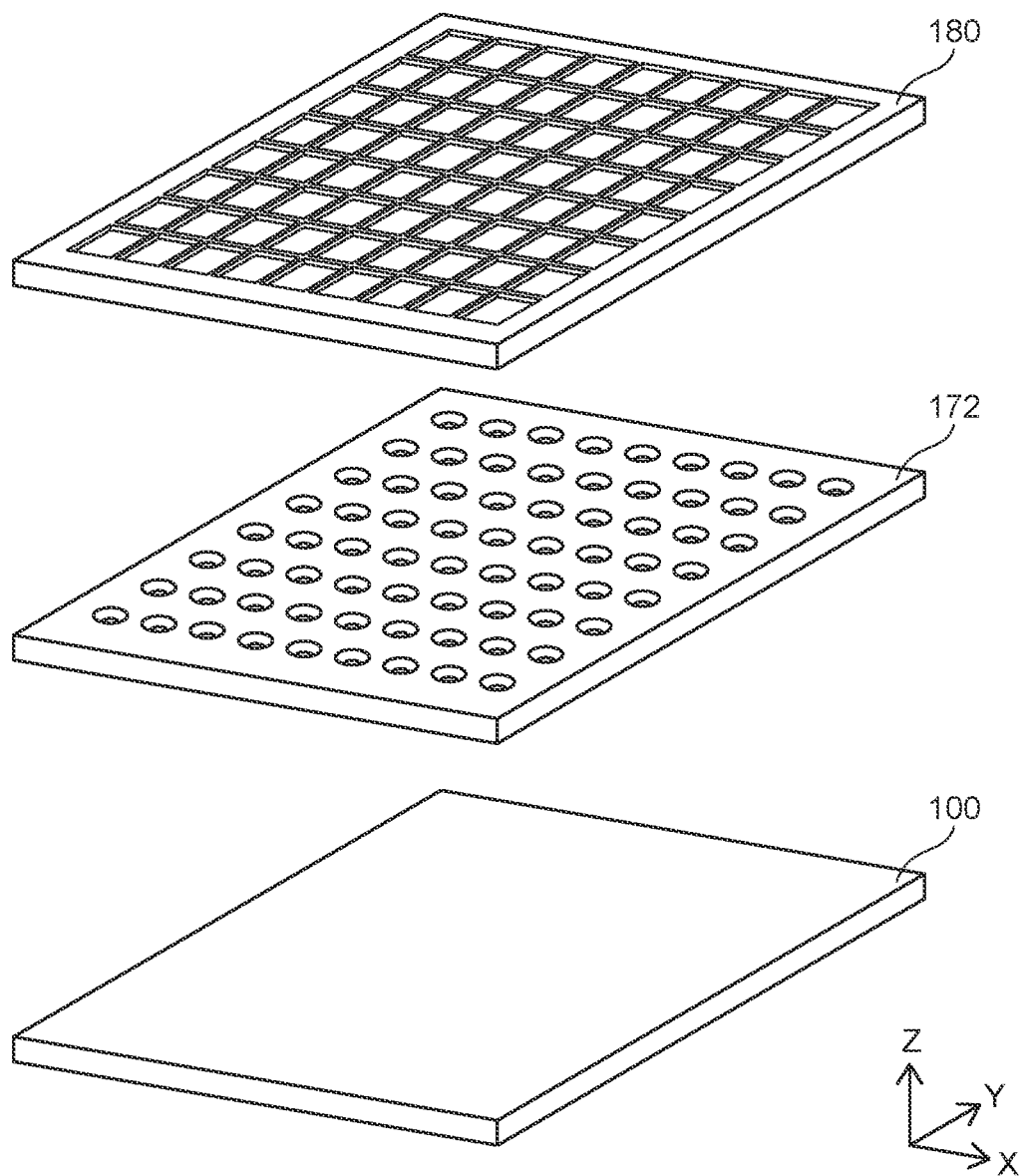
FIG. 34 is a perspective view schematically illustrating an image display device of the first to fifth embodiments and modifications of the first to fifth embodiments.

FIG. 34 is a perspective view schematically illustrating the image display device of the first to fifth embodiments and modifications of the first to fifth embodiments.

As shown in FIG. 34, in the image display device of the first to fifth embodiments, a light-emitting circuit 172 that includes many subpixels on the circuit board 100 is located as described above. The color filter 180 is located on the light-emitting circuit part 172. According to the sixth embodiment, the structural component that includes the circuit board 100, the light-emitting circuit part 172, and the color filter 180 is used as the image display modules 602 and 702 and is embedded in the image display devices 601 and 701.

According to embodiments described above, an image display device and a method for manufacturing an image display device can be realized in which the transfer process of the light-emitting elements is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are included in the scope and spirit of the inventions, and are included in the scope of the inventions recited in the claims and their equivalents. Also, embodiments described above can be implemented in combination with each other.

REFERENCE NUMERAL LIST 1, 201, 601, 701 image display device
2 display region
3 power supply line
4 ground line
5, 205 row selection circuit
6, 206 scanning line
7, 207 signal voltage output circuit
8, 208 signal line
10 pixel
20, 20a, 20b, 20c subpixel
22, 222 light-emitting element
24, 224 select transistor
26, 226 drive transistor
28, 228 capacitor
100 circuit board
101 circuit
103, 203, 203-1, 203-2 transistor
104, 204, 204-1, 204-2 element formation region
105 insulating layer
107, 107-1, 107-2 gate
108 insulating film
110 first wiring layer
112 first insulating film
114 planarization film
115a, 115k, 515a1, 515a2 connection part
116a, 116a1, 116k plug
130, 330 third wiring layer
130a light-shielding plate
150, 250 light-emitting element
156, 156a, 556 second insulating film
159a, 259k, 559k transparent electrode
160, 260, 360, 560 second wiring layer
180 color filter
430 wiring layer
430a, 430k plug (wiring portion)
520, 520a subpixel group
670, 770 controller
1001 crystal growth substrate
1100, 5100 circuit board
1130 metal layer
1140 buffer layer
1150 semiconductor layer
1190 support substrate
1192 structure body
1194, 1294 semiconductor growth substrate

The invention claimed is:

1. A method for manufacturing an image display device, the method comprising:
   providing a semiconductor growth substrate comprising a semiconductor layer on a first substrate, the semiconductor layer comprising a light-emitting layer;
   forming a first insulating film on a second substrate, wherein the second substrate comprises a circuit, and the circuit comprises a circuit element and a first wiring layer;
   forming a plug in the first insulating film, the plug being connected with the circuit element;
   bonding the semiconductor layer to the second substrate and electrically connecting the plug to the semiconductor layer;
   forming a light-emitting element by patterning the semiconductor layer, the light-emitting element being electrically connected to the plug;
   forming a second insulating film covering the light-emitting element and the first insulating film;

exposing a portion of the light-emitting element by removing a portion of the second insulating film; and forming a second wiring layer on the second insulating film.

2. The method according to claim 1, wherein:
the semiconductor layer comprises an n-type semiconductor layer, the light-emitting layer, and a p-type semiconductor layer, stacked in this order from a first substrate side.

3. The method according to claim 1, further comprising:
before the step of bonding the semiconductor layer to the second substrate, forming a metal layer on the semiconductor layer.

4. The method according to claim 1, wherein:
the step of forming the plug comprises, before the step of bonding the semiconductor layer to the second substrate, forming a first metal layer electrically connected to the circuit element, planarizing the first metal layer, and patterning the first metal layer.

5. The method according to claim 1, wherein:
the step of forming the plug comprises, before the step of bonding the semiconductor layer to the second substrate, collectively planarizing the first insulating film and the plug.

6. The method according to claim 3, further comprising:
after the step of bonding the semiconductor layer to the second substrate, forming a third wiring layer by patterning the metal layer.

7. The method according to claim 6, further comprising:
exposing the second wiring layer by removing a portion of the second insulating film.

8. The method according to claim 1, wherein:
the second wiring layer comprises a wiring portion connected to an exposed surface of the light-emitting element.

9. The method according to claim 1, wherein:
the first substrate comprises silicon or sapphire.

10. The method according to claim 1, wherein:
the semiconductor layer comprises a gallium nitride compound semiconductor, and
the second substrate comprises silicon.

11. The method according to claim 1, further comprising:
forming a wavelength conversion member on the light-emitting element.

* * * * *